US008153488B2

(12) United States Patent
Nishitani et al.

(10) Patent No.: US 8,153,488 B2
(45) Date of Patent: Apr. 10, 2012

(54) METHOD FOR MANUFACTURING NONVOLATILE STORAGE DEVICE

(75) Inventors: Kazuhito Nishitani, Kanagawa-ken (JP); Eiji Ito, Kanagawa-ken (JP); Machiko Tsukiji, Kanagawa-ken (JP); Hiroyuki Fukumizu, Mie-ken (JP); Naoya Hayamizu, Kanagawa-ken (JP); Katsuhiro Sato, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 12/726,749

(22) Filed: Mar. 18, 2010

(65) Prior Publication Data

US 2010/0248431 A1    Sep. 30, 2010

(30) Foreign Application Priority Data

Mar. 24, 2009 (JP) .................. 2009-71974
Mar. 25, 2009 (JP) .................. 2009-75258
Mar. 25, 2009 (JP) .................. 2009-75274

(51) Int. Cl.
*H01L 21/336* (2006.01)
(52) U.S. Cl. ............. 438/257; 257/314; 257/E21.679
(58) Field of Classification Search ............ 438/257, 438/258; 257/314, 315, E21.662, E21.679, 257/E21.68, E21.681
See application file for complete search history.

(56) References Cited

U.S. PATENT DOCUMENTS 7,288,455 B2 * 10/2007 Yuan et al. ............. 438/257
7,663,912 B2 * 2/2010 Jeon ..................... 365/185.01

FOREIGN PATENT DOCUMENTS

| JP | 2002-118170 | 4/2002 |
|---|---|---|
| JP | 2002-367980 | 12/2002 |
| JP | 2004-6579 | 1/2004 |
| JP | 2005-522045 | 7/2005 |
| JP | 2007-184419 | 7/2007 |
| JP | 2008-235637 | 10/2008 |
| JP | 2010-165803 | 7/2010 |

OTHER PUBLICATIONS

Office Action issued May 6, 2011, in Japanese Patent Application No. 2009-075274 (with English-language translation).
Korean Office Action issued Jun. 13, 2011, in Patent Application No. 10-2010-0025666 (with English-language translation).

* cited by examiner

*Primary Examiner* — Brook Kebede
(74) *Attorney, Agent, or Firm* — Oblon, Spivak, McClelland, Maier & Neustadt, L.L.P.

(57) ABSTRACT

Manufacturing a nonvolatile storage device including: stacking a first electrode film forming a first electrode and a first storage unit film forming a first storage unit on a substrate; processing the first electrode film and the first storage unit film into a strip shape; burying a sacrifice layer between the processed first electrode films and between the processed first storage unit films; forming a second electrode film forming a second electrode on the first storage unit film and the sacrifice layer; forming a mask layer on the second electrode film; processing the second electrode film into a strip shape using the mask layer; removing a portion of the first storage unit film exposed from the sacrifice layer using the mask layer processing the first storage unit film into a columnar shape, removing the sacrifice layer exposing the first storage unit film; and removing the exposed first storage unit film.

12 Claims, 50 Drawing Sheets

METHOD FOR MANUFACTURING NONVOLATILE STORAGE DEVICE

CROSS-REFERENCE TO RELATED APPLICATIONS

This application is based upon and claims the benefit of priority from the prior Japanese Patent Application No. 2009-71974 filed on Mar. 24, 2009; No. 2009-75274 filed on Mar. 25, 2009; and No. 2009-75258 filed on Mar. 25, 2009; the entire contents of which are incorporated herein by reference.

BACKGROUND

1. Field

Embodiments of the invention relate generally to a method for manufacturing a nonvolatile storage device.

2. Description of the Related Art

It is considered that flash memory widely used as a nonvolatile storage device encounters limitations on the improvement in integration degree. A crosspoint nonvolatile storage device having a configuration in which a storage layer (storage unit) variable in electric resistance is placed between two electrodes, for example, receives attention as a nonvolatile storage device capable of achieving a higher integration degree than flash memory (e.g. JP-A 2007-184419 (Kokai)). There is also a nonvolatile storage device of three-dimensional structure in which the crosspoint nonvolatile storage devices are stacked.

In the manufacture of such a crosspoint nonvolatile storage device, a storage layer that forms memory cells, for example, is processed into shapes corresponding to bit lines; an interlayer insulating film is buried therebetween; then a metal film for word lines is stacked thereon; and word lines are formed by performing dry etching processing using a mask of a silicon oxide film, for example, which is processed into shapes corresponding to the word lines by photolithography.

At this time, during the processing of the storage layer, a taper that has a larger area in the lower portion of the storage layer than in the upper portion thereof may be created. Burying the interlayer insulating film between the storage layers in this state forms a configuration in which the interlayer insulating film covers the storage layer at the interface between the interlayer insulating film and the storage layer. In this state, if processing that forms the word lines is performed, the storage layer that has not been processed under the shade of the interlayer insulating film is left between the word lines above the bit lines, and this causes the problem of a short between the word lines.

For example, when etching processing of a cell material is performed in a first direction in order to form the interlayer insulating film, since a trench formed by etching usually has a reverse-tapered shape, the interlayer insulating film buried in this trench also has a reverse-tapered shape. Then, when etching processing of the cell material is performed in a second direction that crosses the first direction, since the interlayer insulating film that has already been buried has a reverse-tapered shape, this interlayer insulating film forms a shade and a residual component of the cell material (e.g. semiconductor, metal, etc.) is left in the processed portion. The presence of a residue like this causes the problems of a short (electrical short circuit) between cells and a variation in characteristics of the nonvolatile storage device.

SUMMARY

According to an aspect of the invention, there is provided a method for manufacturing a nonvolatile storage device including: a plurality of first electrodes aligning in a first direction; a plurality of second electrodes aligning in a second direction nonparallel to the first direction and provided above the first electrodes; and a first storage unit provided between the first electrode and the second electrode and including a first storage layer, a resistance of the first storage layer changing by at least one of an applied electric field and an applied current, the method including: stacking a first electrode film forming a first electrode and a first storage unit film forming a first storage unit on a major surface of a substrate; processing the first electrode film and the first storage unit film into a strip shape aligning in the first direction; burying a sacrifice layer between the processed first electrode films and between the processed first storage unit films; forming a second electrode film forming a second electrode on the first storage unit film and the sacrifice layer; forming a mask layer having a lower etching rate than the sacrifice layer on the second electrode film; processing the second electrode film into a strip shape aligning in the second direction nonparallel to the first direction by using the mask layer as a mask; removing a portion of the first storage unit film exposed from the sacrifice layer by using the mask layer as a mask to process the first storage unit film into a columnar shape including a side wall along the first direction and a side wall along the second direction; removing the sacrifice layer to expose the first storage unit film having been covered with the sacrifice layer; and removing the exposed first storage unit film.

According to another aspect of the invention, there is provided a method for manufacturing a nonvolatile storage device including: a plurality of first electrodes aligning in a first direction; a plurality of second electrodes aligning in a second direction nonparallel to the first direction and provided above the first electrodes; and a first storage unit provided between the first electrode and the second electrode and including a first storage layer, a resistance of the first storage layer changing by at least one of an applied electric field and an applied current, the method including: stacking a first electrode film forming a first electrode and a first storage unit film forming a first storage unit on a major surface of a substrate; processing the first electrode film and the first storage unit film into a strip shape aligning in the first direction; burying a layer of a prescribed density between the processed first electrode films and between the processed first storage unit films; forming a second electrode film forming a second electrode on the first storage unit film and the layer of a prescribed density; forming a mask layer having a higher density than the layer of a prescribed density on the second electrode film; processing the second electrode film into a strip shape aligning in the second direction nonparallel to the first direction by using the mask layer as a mask; removing a portion of the first storage unit film exposed from the layer of a prescribed density by using the mask layer as a mask to process the first storage unit film into a columnar shape including a side wall along the first direction and a side wall along the second direction; removing the layer of a prescribed density to expose the first storage unit film having been covered with the layer of a prescribed density; and removing the exposed first storage unit film.

According to still another aspect of the invention, there is provided a method for manufacturing a nonvolatile storage device including: at least one first electrode aligning in a first direction; at least one second electrode aligning in a second direction nonparallel to the first direction; and a storage cell including a storage element and disposed between the first electrode and the second electrode where the first electrode and the second electrode intersect, the method including: forming a storage cell layer on a first electrode film disposed on a substrate; separating the storage cell layer in the second direction nonparallel to the first direction and forming a first trench running in the first direction in order to form a first electrode aligning in the first direction on the substrate; burying a first interlayer insulating film in the first trench; forming a second electrode film on the storage cell layer and the first interlayer insulating film; processing the second electrode film to form the second electrode aligning in the second direction; etching the first interlayer insulating film and lowering an upper surface of the first interlayer insulating film to a prescribed position; and forming a second trench running in the second direction in order to separate the storage cell layer in the first direction.

DETAILED DESCRIPTION

Figure 1:
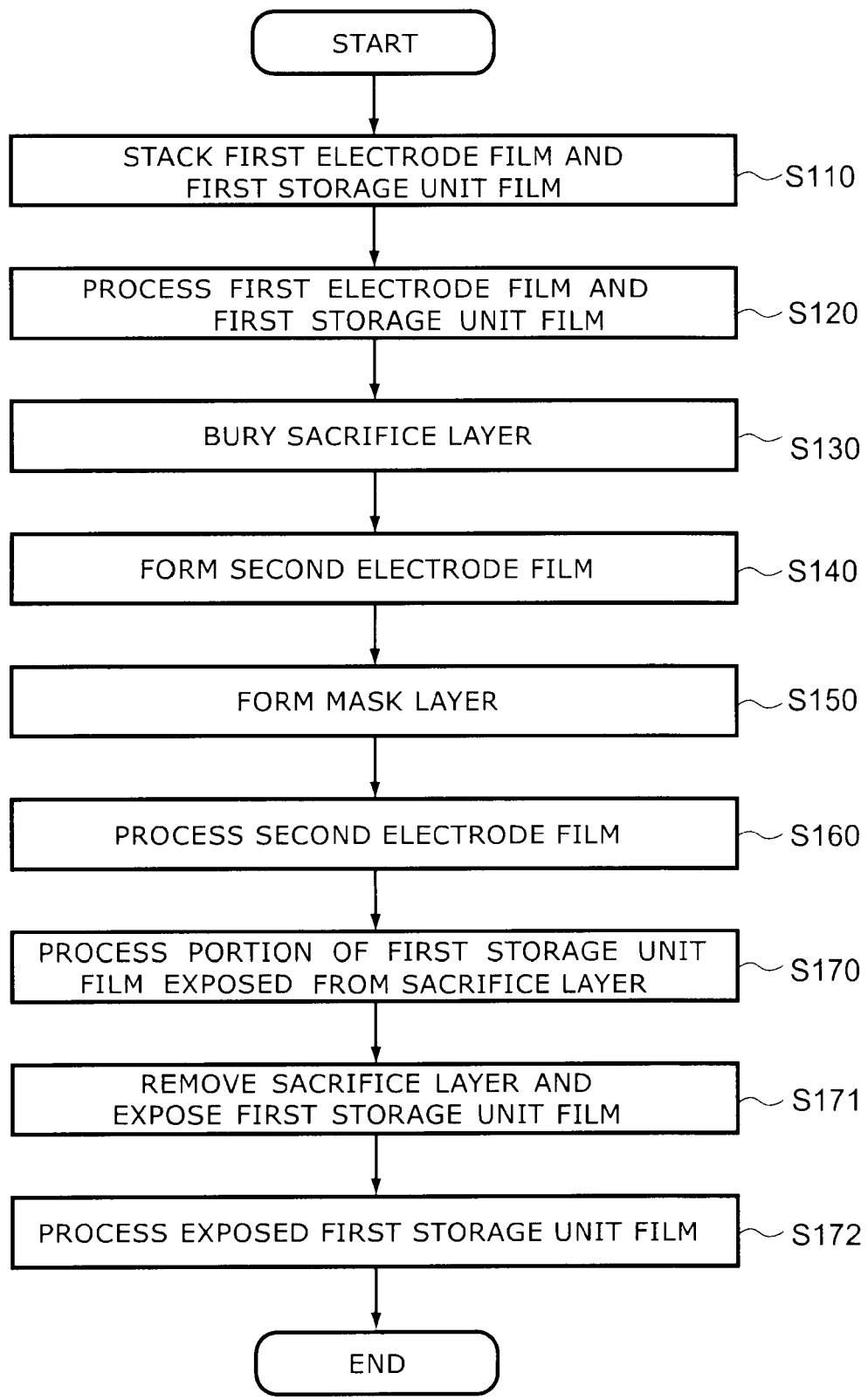
FIG. 1 is a flow chart illustrating a method for manufacturing a nonvolatile storage device according to a first embodiment of the invention.

Hereinbelow, embodiments of the invention are described in detail with reference to the drawings.

In the specification and drawings of the application, components similar to those described or illustrated in a drawing thereinabove are marked with the same reference numerals, and a detailed description is omitted as appropriate.

First Embodiment

FIG. 1 is a flow chart illustrating a method for manufacturing a nonvolatile storage device according to a first embodiment of the invention.

Figure 2A:
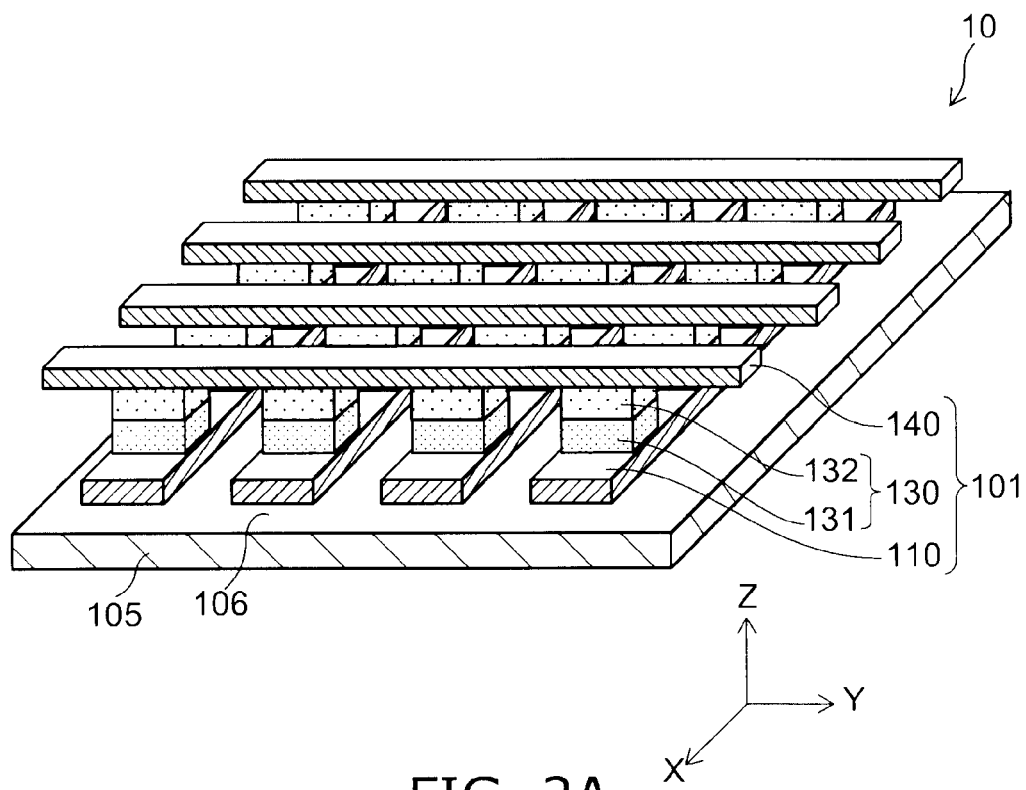
FIGS. 2A and 2B are schematic views illustrating the configuration of a nonvolatile storage device manufactured by the method for manufacturing a nonvolatile storage device according to the first embodiment of the invention.
Figure 2B:
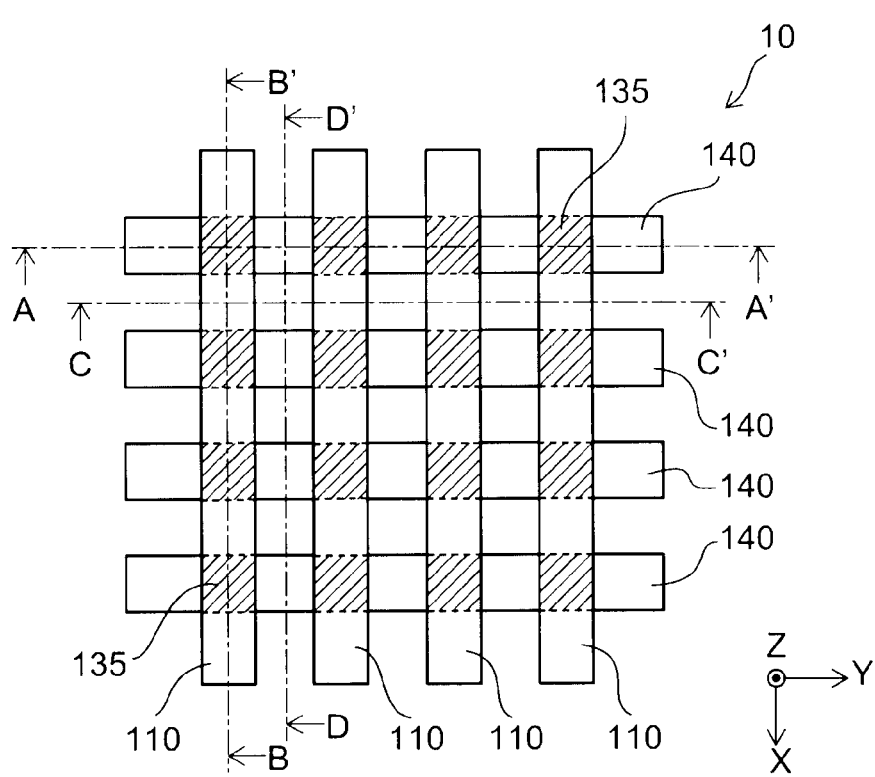

FIGS. 2A and 2B are schematic views illustrating the configuration of a nonvolatile storage device manufactured by the method for manufacturing a nonvolatile storage device according to the first embodiment of the invention.

Specifically, FIG. 2A is a perspective view, and FIG. 2B is a plan view.

FIGS. 3A to 3D are schematic cross-sectional views illustrating the configuration of the nonvolatile storage device manufactured by the method for manufacturing a nonvolatile storage device according to the first embodiment of the invention.

Figure 3A:
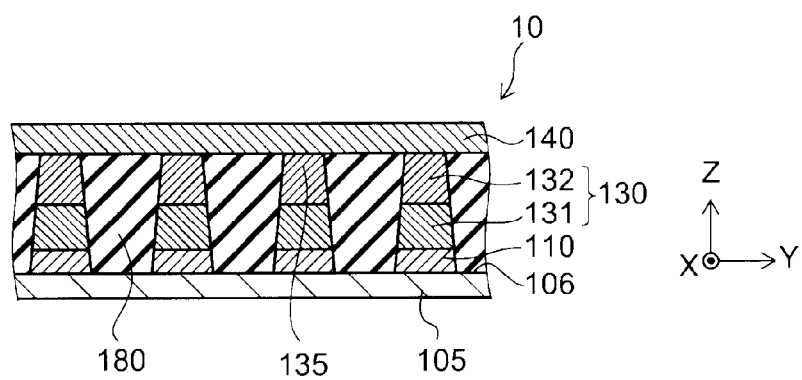
FIGS. 3A to 3D are schematic cross-sectional views illustrating the configuration of the nonvolatile storage device manufactured by the method for manufacturing a nonvolatile storage device according to the first embodiment of the invention.
Figure 3B:
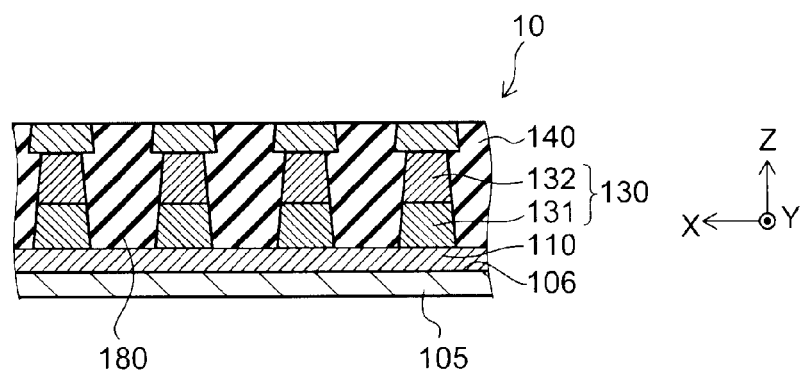
Figure 3C:
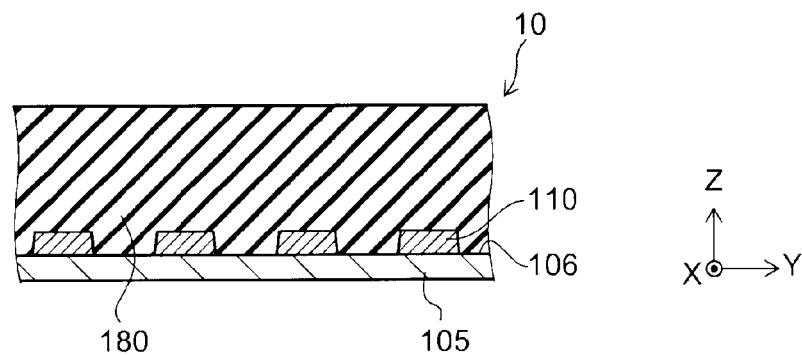
Figure 3D:
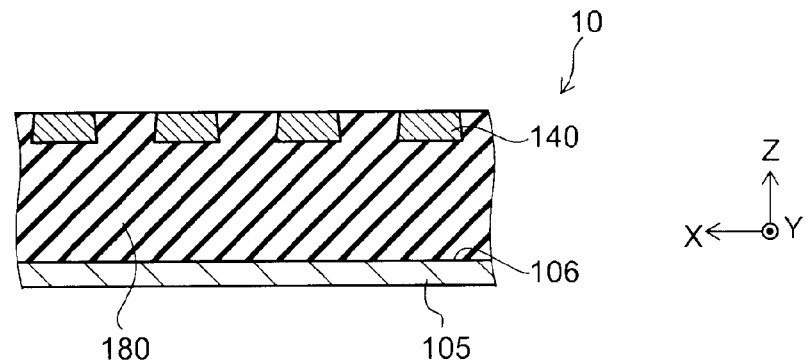

Specifically, FIG. 3A is a cross-sectional view taken along line A-A' of FIG. 2B, FIG. 3B is a cross-sectional view taken along line B-B' of FIG. 2B, FIG. 3C is a cross-sectional view taken along line C-C' of FIG. 2B, and FIG. 3D is a cross-sectional view taken along line D-D' of FIG. 2B.

FIGS. 4A to 4D are schematic cross-sectional views in order of the processes, illustrating the method for manufacturing a nonvolatile storage device according to the first embodiment of the invention.

Figure 4A:
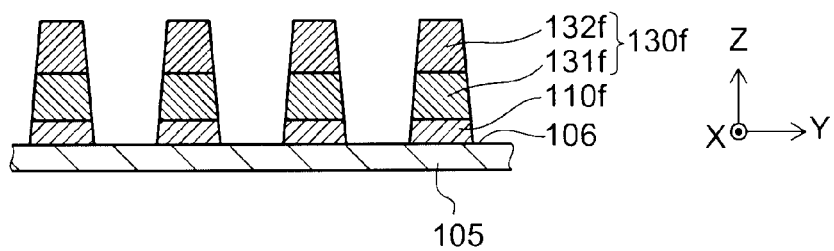
FIGS. 4A to 4D are schematic cross-sectional views in order of the processes, illustrating the method for manufacturing a nonvolatile storage device according to the first embodiment of the invention.
Figure 4B:
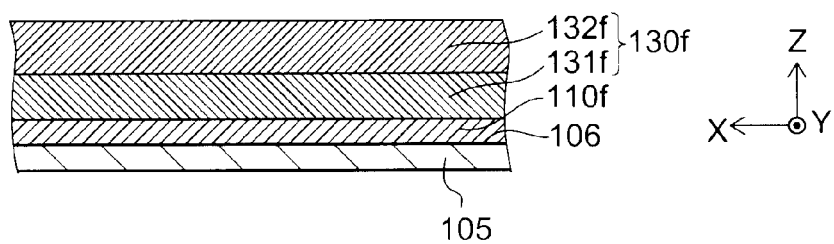
Figure 4C:
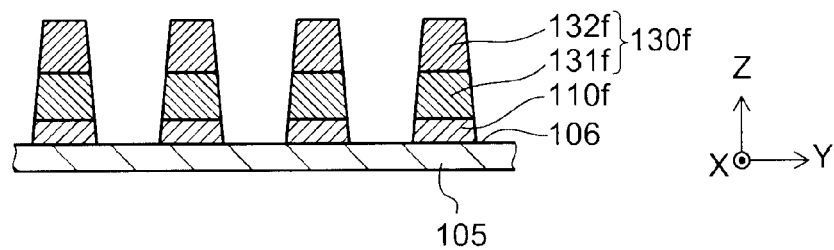
Figure 4D:
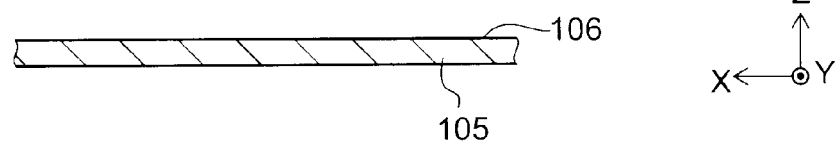

FIGS. 5A to 5D are schematic cross-sectional views in order of the processes, continuing from FIG. 4D.

Figure 5A:
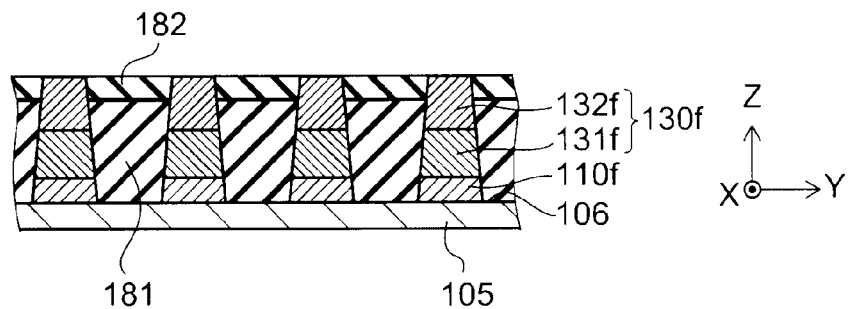
FIGS. 5A to 5D are schematic cross-sectional views in order of the processes, continuing from FIG. 4D.
Figure 5B:
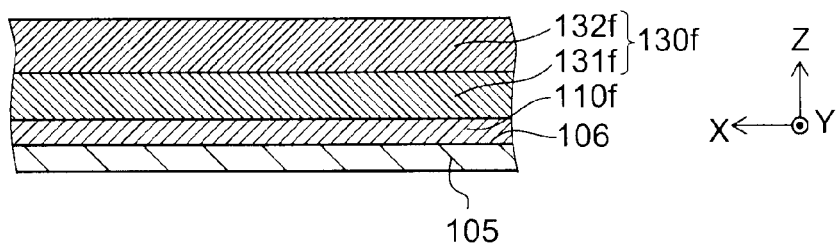
Figure 5C:
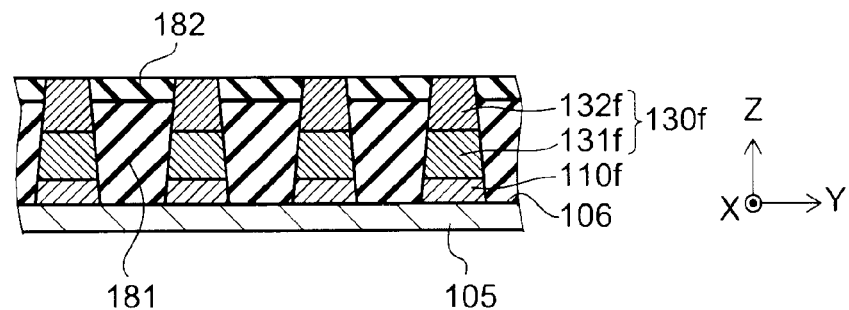
Figure 5D:
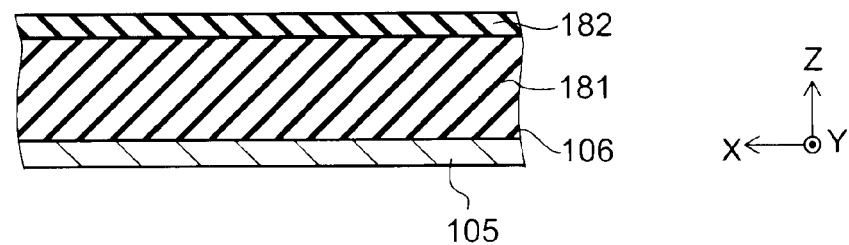

FIGS. 6A to 6D are schematic cross-sectional views in order of the processes, continuing from FIG. 5D.

Figure 6A:
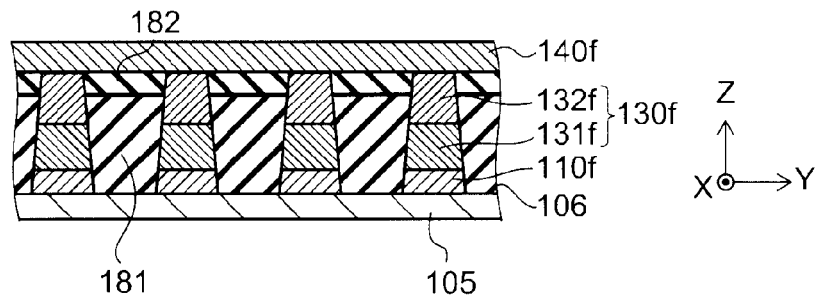
FIGS. 6A to 6D are schematic cross-sectional views in order of the processes, continuing from FIG. 5D.
Figure 6B:
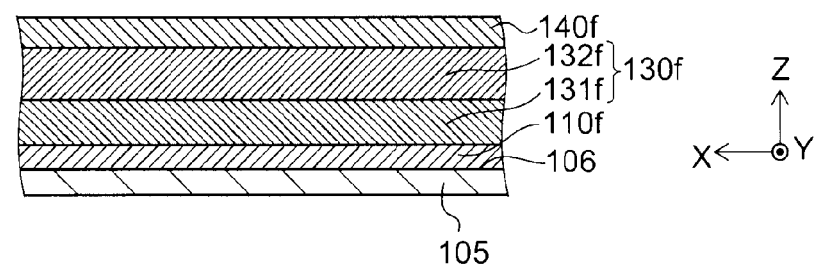
Figure 6C:
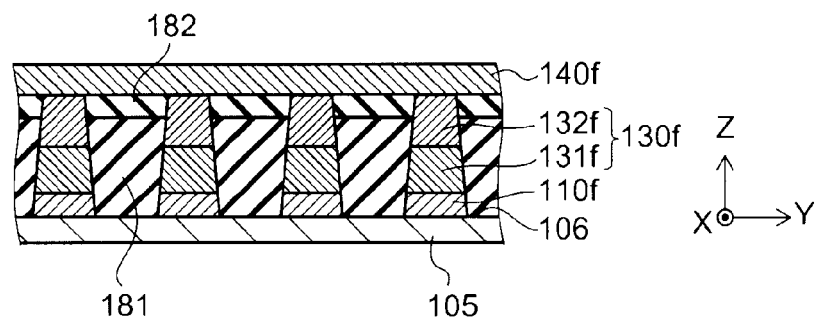
Figure 6D:
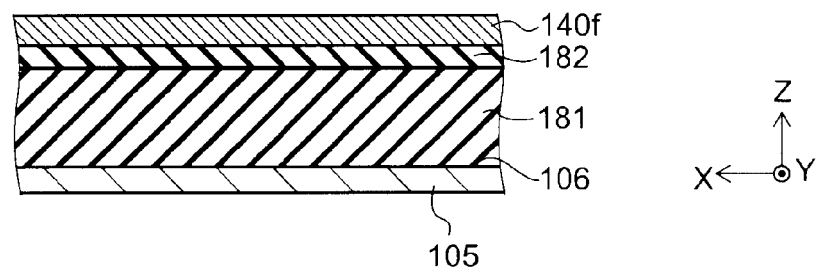

FIGS. 7A to 7D are schematic cross-sectional views in order of the processes, continuing from FIG. 6D.

Figure 7A:
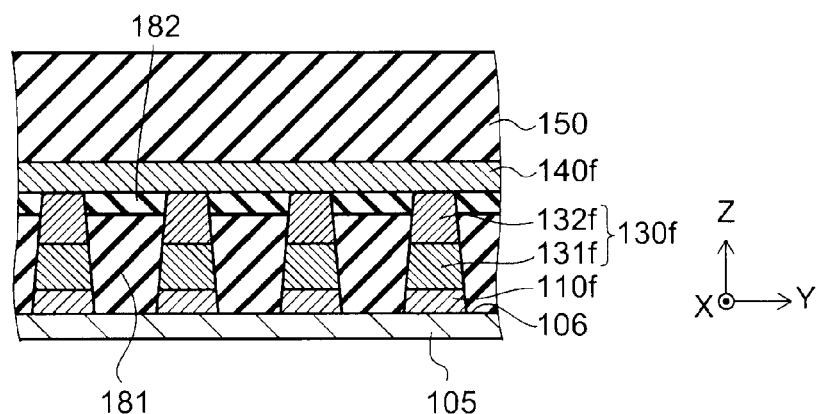
FIGS. 7A to 7D are schematic cross-sectional views in order of the processes, continuing from FIG. 6D.
Figure 7B:
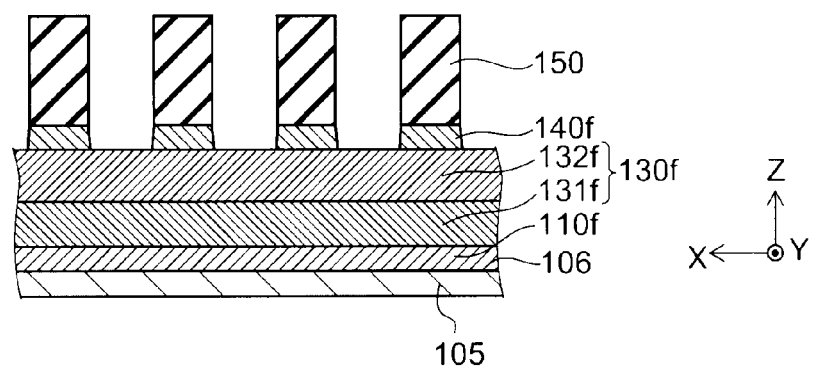
Figure 7C:
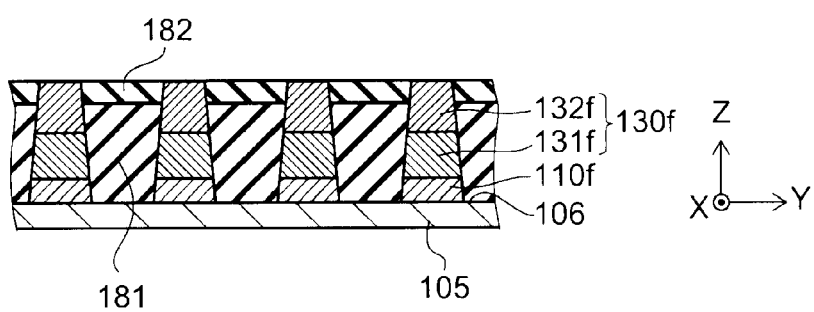
Figure 7D:
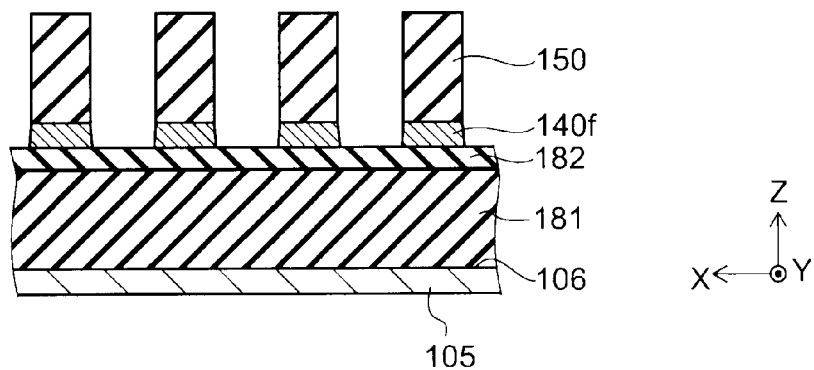

FIGS. 8A to 8D are schematic cross-sectional views in order of the processes, continuing from FIG. 7D.

Figure 8A:
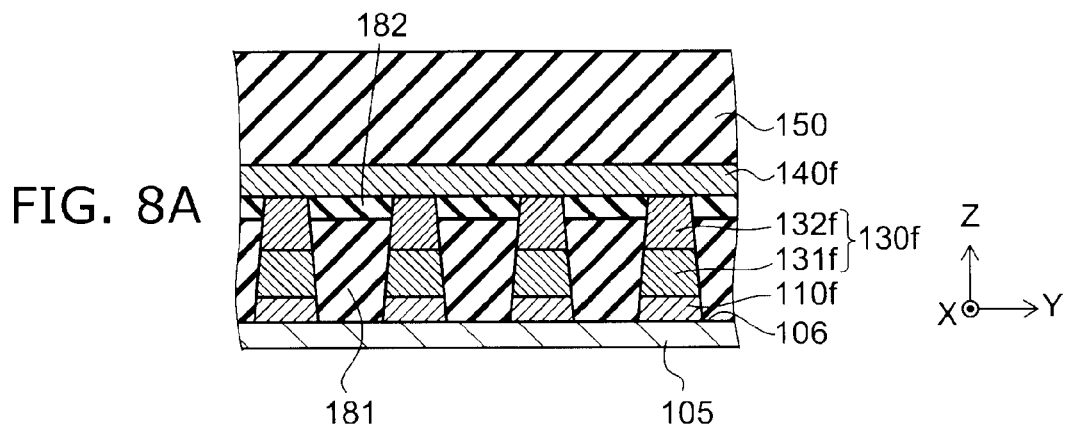
FIGS. 8A to 8D are schematic cross-sectional views in order of the processes, continuing from FIG. 7D.
Figure 8B:
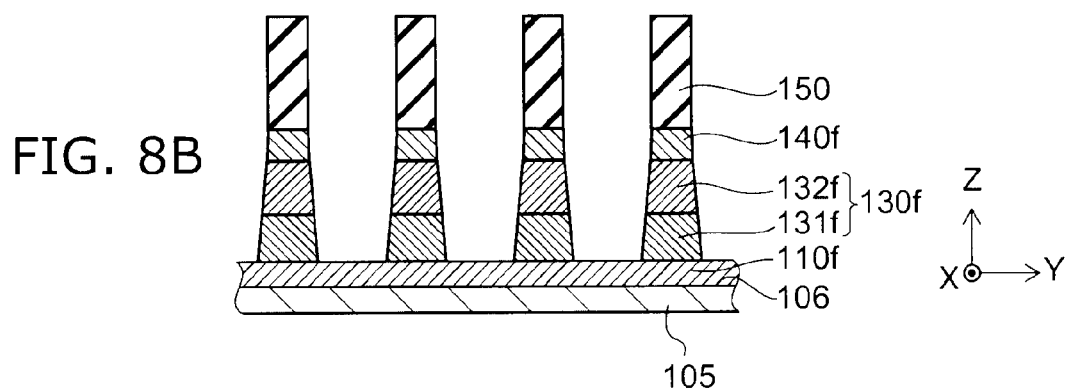
Figure 8C:
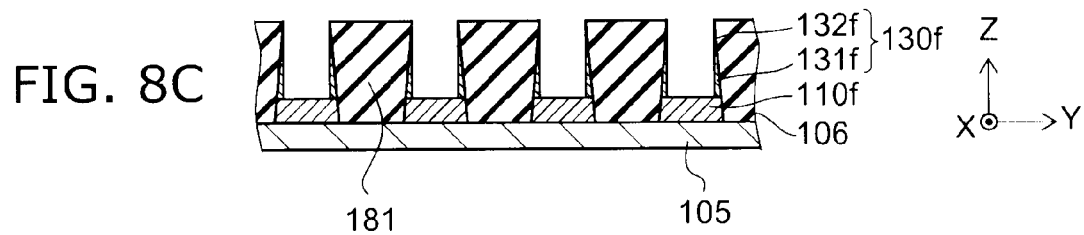
Figure 8D:
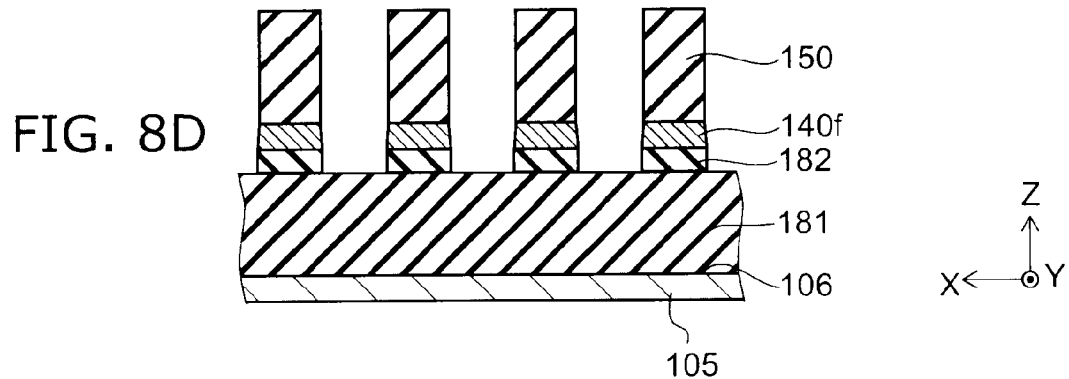

FIGS. 9A to 9D are schematic cross-sectional views in order of the processes, continuing from FIG. 8D.

Figure 9A:
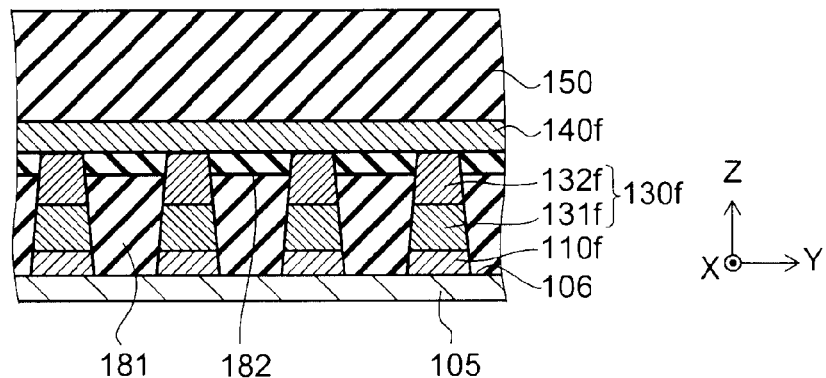
FIGS. 9A to 9D are schematic cross-sectional views in order of the processes, continuing from FIG. 8D.
Figure 9B:
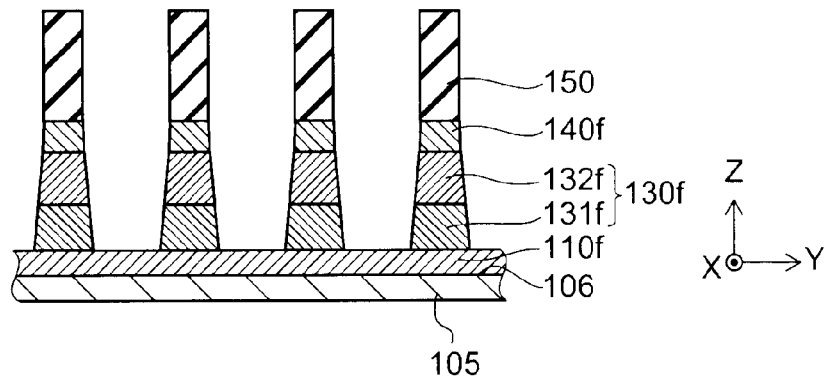
Figure 9C:
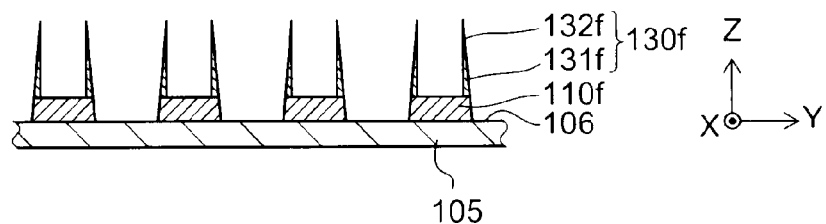
Figure 9D:
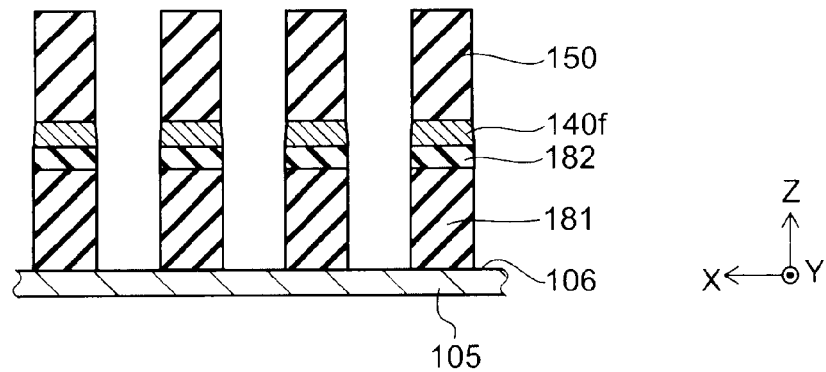
Figure 10A:
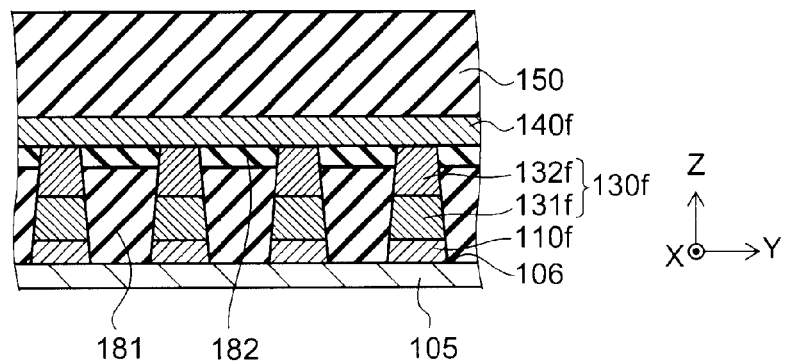
FIGS. 10A to 10D are schematic cross-sectional views in order of the processes, continuing from FIG. 9D.
Figure 10B:
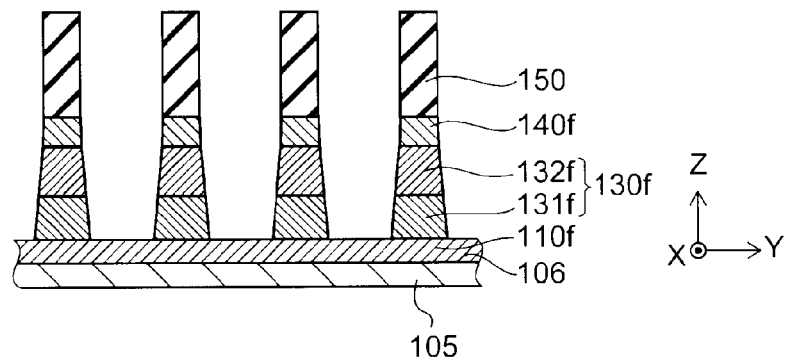
Figure 10C:
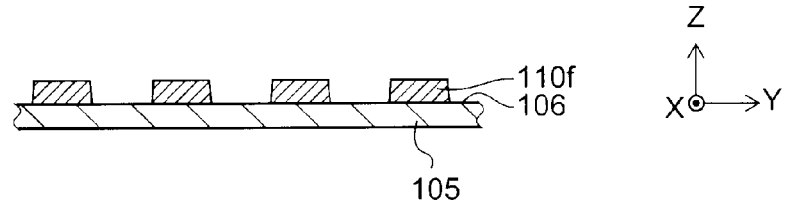
Figure 10D:
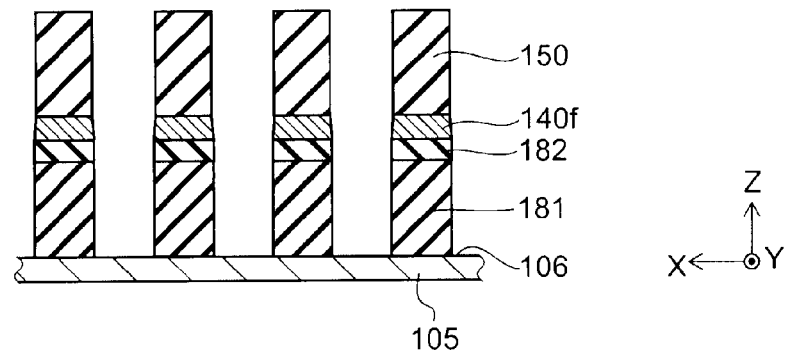

FIGS. 10A to 10D are schematic cross-sectional views in order of the processes, continuing from FIG. 9D.

In FIGS. 4A to 10D, each drawing of the number including "A" is a cross-sectional view corresponding to line A-A' of FIG. 2B, each drawing of the number including "B" is a cross-sectional view corresponding to line B-B' of FIG. 2B, each drawing of the number including "C" is a cross-sectional view corresponding to line C-C' of FIG. 2B, and each drawing of the number including "D" is a cross-sectional view corresponding to line D-D' of FIG. 2B.

First, a nonvolatile storage device manufactured by the method for manufacturing a nonvolatile storage device according to the first embodiment of the invention will now be described with reference to FIGS. 2A and 2B and FIGS. 3A to 3D.

As illustrated in FIGS. 2A and 2B and FIGS. 3A to 3D, a nonvolatile storage device 10 manufactured by the method for manufacturing a nonvolatile storage device according to this embodiment includes: a plurality of first electrodes 110 aligning in a first direction; a plurality of second electrodes 140 aligning in a second direction nonparallel to the first direction and provided above the first electrodes 110; and a first storage unit 130 provided between the first electrode 110 and the second electrode 140 and including a first storage layer 132 of which the resistance changes by at least one of an applied electric field and an applied current. The first electrodes 110 are provided on a major surface 106 of a substrate 105, for example.

The first direction and the second direction are nonparallel to each other, and for example, intersect three-dimensionally. In the following, a description is given by taking up the case where the first direction and the second direction are orthogonal to each other.

Here, the first direction is defined as an X-axis direction, and the second direction is defined as a Y-axis direction orthogonal to the X-axis direction. The direction orthogonal to the X-axis direction and the Y-axis direction is defined as a Z-axis direction. The major surface 106 of the substrate 105 is perpendicular to the Z-axis direction and parallel to the X-Y plane. The first electrode 110 aligns in the X-axis direction in a strip shape in a plane parallel to the X-Y plane. The second electrode 140 aligns in the Y-axis direction in a strip shape in a plane parallel to the X-Y plane.

The first storage unit 130 is provided between the first electrode 110 and the second electrode 140, where the first electrode 110 and the second electrode 140 intersect three-dimensionally. The first storage unit 130 forms a first memory cell 135. That is, the nonvolatile storage device 10 is a crosspoint nonvolatile storage device using a resistance change film.

The first electrode 110 serves as a bit line, and the second electrode 140 serves as a word line, for example. However, the first electrode 110 and the second electrode 140 may be replaced with each other in the invention. The first electrode 110 may serve as a word line, and the second electrode 140 may serve as a bit line.

The first storage unit 130 includes the first storage layer 132. The first storage layer 132 is a layer of which the resistance changes by at least one of an applied electric field and an applied current. A resistance change material, a phase change material of which the resistance changes with phase change, and the like may be used for the first storage layer 132. Furthermore, a material in which various conductive films and/or various barrier films are stacked on the layer of resistance change material or the layer of phase change material may be used for the first storage layer 132.

For example, $NiO_x$, $TiO_x$, $CoO_x$, $TaO_x$, $MnO_x$, $WO_x$, $Al_2O_3$, $FeO_x$, $HfO_x$, $ZnMn_2O_4$, $ZnFe_2O_4$, $ZnCO_2O_4$, $ZnCr_2O_4$, $ZnAl_2O_4$, $CuCoO_2$, $CuAlO_2$, $NiWO_4$, $NiTiO_3$, $CoAl_2O_4$, $MnAl_2O_4$, $ZnNiTiO_4$, $Pr_xCa_{1-x}MnO_3$, and the like may be used for the first storage layer 132.

Furthermore, a material in which a dopant is added to the various kinds of compounds mentioned above may be used for the first storage layer 132.

However, the invention is not limited to the above, but any material may be used for the first storage layer 132.

The first storage unit 130 may further include a first rectifying element 131 such as a diode. Although the first rectifying element 131 is provided between the first electrode 110 and the first storage layer 132 in this specific example, the first rectifying element 131 may be provided between the second electrode 140 and the first storage layer 132. Various kinds of elements having rectifying function such as a PIN diode and a Schottky diode may be used for the first rectifying element 131. Furthermore, a material in which an element having rectifying function, various conductive films, and various barrier films are stacked may be used for the first rectifying element 131.

Thus, the first electrode 110, the first storage unit 130, and the second electrode 140 are stacked in the Z-axis direction in the nonvolatile storage device 10, and the nonvolatile storage device 10 includes a layer of memory cell array (a first memory cell array 101). However, nonvolatile storage devices manufactured by the method for manufacturing a nonvolatile storage device according to the embodiment of the invention may have a configuration in which a plurality of memory cell arrays are stacked in the Z-axis direction. In the following, first, a description is given by taking up the case where the nonvolatile storage device 10 includes one layer of memory cell array, for the sake of simplicity.

As illustrated in FIGS. 3A to 3D, a first interlayer insulating film 180 made of silicon oxide or the like is buried around the first memory cell 135 formed between the first electrode 110 and the second electrode 140.

Furthermore, as described later, the first storage unit 130 (the first rectifying element 131 and the first storage layer 132) may become in a tapered shape at the time of the processing of the first storage unit 130. Specifically, the cross section of the first storage unit 130 when it is cut with a plane parallel to the X-Y plane may be large on the lower side (the substrate 105 side) and small on the upper side (the side opposite to the substrate 105).

In the specification and drawings of the application, for the sake of description, the taper of the first storage unit 130 is illustrated and described emphatically.

The method for manufacturing a nonvolatile storage device according to this embodiment does not cause a processing failure even when the first storage unit 130 has a tapered shape.

The method for manufacturing a nonvolatile storage device according to this embodiment will now be described with reference to FIG. 1 and FIG. 4A to FIG. 10D.

First, as illustrated in FIGS. 4A to 4D, a first electrode film 110$f$ that forms the first electrodes 110 and a first storage unit film 130$f$ that forms the first storage units 130 are stacked on the major surface 106 of the substrate 105. The first storage unit film 130$f$ is specifically a stacked film of a first rectifying element film 131$f$ that forms the first rectifying elements 131 and a first storage layer film 132$f$ that forms the first storage layers 132.

This process corresponds to step S110 illustrated in FIG. 1.

Then, as illustrated in FIGS. 4A to 4D, the first electrode film 110$f$ and the first storage unit film 130$f$ are processed into strip shapes aligning in the first direction (e.g. the X-axis direction). Here, the X-axis direction is assigned to the first direction.

This process corresponds to step S120 illustrated in FIG. 1.

That is, the first electrode film 110$f$ and the first storage unit film 130$f$ are processed by, for example, RIE (reactive ion etching) using a mask (not illustrated) of a silicon oxide film that is processed into strip shapes in the first direction in which the first electrode 110 aligns by photolithography.

At this time, as illustrated in FIGS. 4A to 4D, the first storage unit film 130$f$ may be processed into tapered shapes.

That is, by processing the first electrode film 110$f$ and the first storage unit film 130$f$ into strip shapes aligning in the first direction, the width of the strip of the first storage unit film 130$f$ on the first electrode film 110$f$ side (that is, the length in a direction perpendicular to the first direction) is longer than the width of the strip on the side opposite to the first electrode film 110$f$ (that is, the length in a direction perpendicular to the first direction).

Then, as illustrated in FIGS. 5A to 5D, a sacrifice layer 181 is buried between the processed first electrode films 110$f$ and between the processed first storage unit films 130$f$.

This process corresponds to step S130 illustrated in FIG. 1.

In this specific example, a novolac resin that is an organic film is used for the sacrifice layer 181. That is, the novolac resin is applied on the first electrode film 110$f$, the first storage unit film 130$f$, and the substrate 105; the novolac resin is buried between the first electrode films 110$f$ and between the first storage unit films 130$f$; and the novolac resin is cured by heat treatment.

After that, etchback is performed by using, for example, plasma including ammonia and oxygen to decrease the film thickness of the novolac resin. Then, a first cap layer 182 (a cap layer) made of, for example, silicon oxide is buried by plasma CVD (chemical vapor deposition) or the application method, and is planarized by CMP (chemical mechanical polishing).

Thereby, the sacrifice layer 181 is located lower than the interface planarized by CMP; a configuration in which the first cap layer 182 is stacked thereon can be formed; and unintended damage to the sacrifice layer 181 by subsequent processing is suppressed. The film thickness of the first cap layer 182 made of silicon oxide is preferably thin within the range that suppresses damage to the sacrifice layer 181.

The first cap layer 182 is provided as necessary and may be omitted.

After that, as illustrated in FIGS. 6A to 6D, a second electrode film 140$f$ that forms the second electrodes 140 is formed above the first electrode film 110$f$ and on the first storage unit film 130$f$ and the sacrifice layer 181 (and the first cap layer).

This process corresponds to step S140 illustrated in FIG. 1.

Then, as illustrated in FIGS. 7A to 7D, a mask layer 150 formed into the shape of the second electrodes 140 by photolithography is formed.

This process corresponds to step S150 illustrated in FIG. 1.

The mask layer 150 has a lower etching rate than the sacrifice layer 181. In the case where, for example, a novolac resin is used as the sacrifice layer 181, silicon oxide is used for the mask layer 150.

Then, the second electrode film 140$f$ is processed into strip shapes aligning in the second direction by using the mask layer 150 as a mask. RIE, for example, is used for this processing.

This process corresponds to step S160 illustrated in FIG. 1.

After that, the first cap layer 182 made of silicon oxide is removed by dry etching or dilute hydrofluoric acid treatment using the mask layer 150 as a mask.

As described above, the first cap layer 182 is provided as necessary. In the case where the first cap layer 182 is not formed, this process is omitted. Furthermore, in the case where the first cap layer 182 is thin, the process that removes the first cap layer 182 may not be provided in particular, and the first cap layer 182 may be removed at the time of other processing in the process described later.

Then, as illustrated in FIGS. 8A to 8D, the portion of the first storage unit film 130f exposed from the sacrifice layer 181 is processed into columnar shapes by using the mask layer 150 as a mask. The columnar shape is a shape that includes a side wall along the first direction (the X-axis direction) and a side wall along the second direction (the Y-axis direction).

This process corresponds to step S170 illustrated in FIG. 1.

That is, since the first storage unit film 130f has been processed into a strip shape having a side wall along the first direction (the X-axis direction) in step S120 described above, the first storage unit film 130f is processed so as to have a side wall along the second direction (the Y-axis direction) in step S170 into columnar shapes.

In this specific example, the case where the side wall along the second direction of the first storage unit film 130f also has a tapered shape is illustrated.

At this time, as illustrated in FIG. 8C, the first storage unit film 130f has a tapered shape in the cross section taken along line C-C' of FIG. 2B, and the first storage unit film 130f is covered with the sacrifice layer 181 in this portion. Therefore, the portion where the first storage unit film 130f is covered with the sacrifice layer 181 is left without being etched.

Then, as illustrated in FIGS. 9A to 9D, the sacrifice layer 181 is removed to expose the first storage unit film 130f that has been covered with the sacrifice layer 181.

This process corresponds to step S171 illustrated in FIG. 1.

In the case where a novolac resin is used as the sacrifice layer 181, the sacrifice layer 181 can be removed by using plasma using oxygen gas or mixed gas of oxygen and ammonia, for example.

At this time, since the novolac resin, for example, which has a higher etching rate than the mask layer 150 (e.g. silicon oxide) is used as the sacrifice layer 181, the sacrifice layer 181 can be removed without damaging the mask layer 150 substantially.

Then, as illustrated in FIGS. 10A to 10D, the exposed first storage unit film 130f is removed.

This process corresponds to step S172 illustrated in FIG. 1.

After that, for example, the mask layer 150 is removed; the sacrifice layer 181 is removed by isotropic etching by plasma including oxygen, ammonia, hydrogen, water, and the like, for example; and then silicon oxide that forms the first interlayer insulating film 180 is buried between the first electrode films 110f, between the first storage unit films 130f, and between the second electrode films 140f by a method such as CVD and SOG (spin on glass). Thereby, the nonvolatile storage device 10 illustrated in FIGS. 2A and 2B and FIGS. 3A to 3D can be formed.

Although the sacrifice layer 181 is removed after step S172 and then the first interlayer insulating film 180 is formed in the above, the sacrifice layer 181 may not be removed after step S172, and the first interlayer insulating film 180 may be formed in the state in which the sacrifice layer 181 is left.

Comparative Example

FIGS. 11A to 11D are schematic cross-sectional views in order of the processes, illustrating a method for manufacturing a nonvolatile storage device of a comparative example.

Figure 11A:
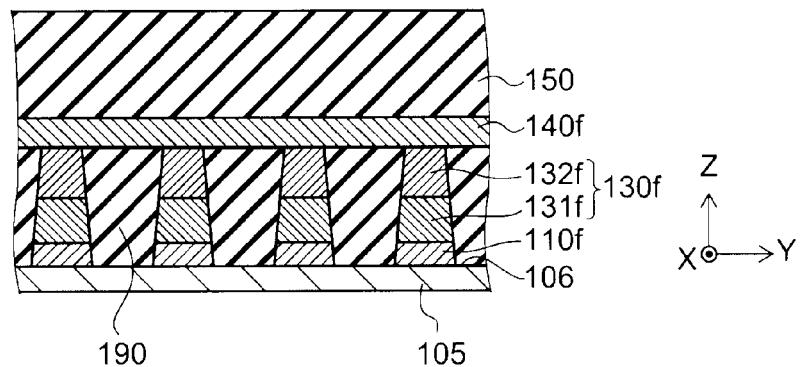
FIGS. 11A to 11D are schematic cross-sectional views in order of the processes, illustrating a method for manufacturing a nonvolatile storage device of a comparative example.
Figure 11B:
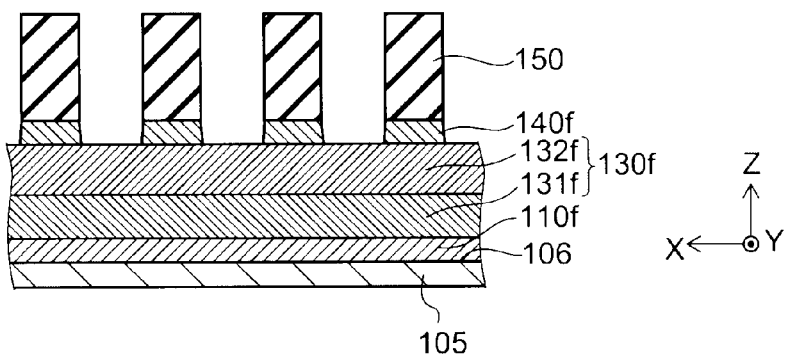
Figure 11C:
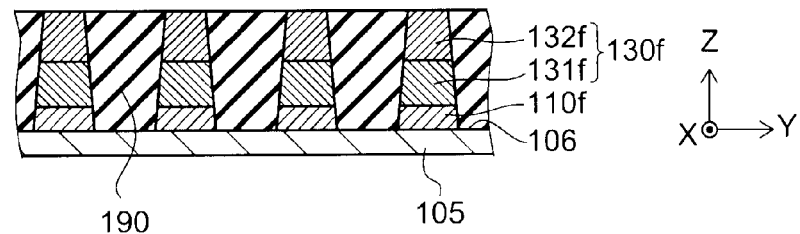
Figure 11D:
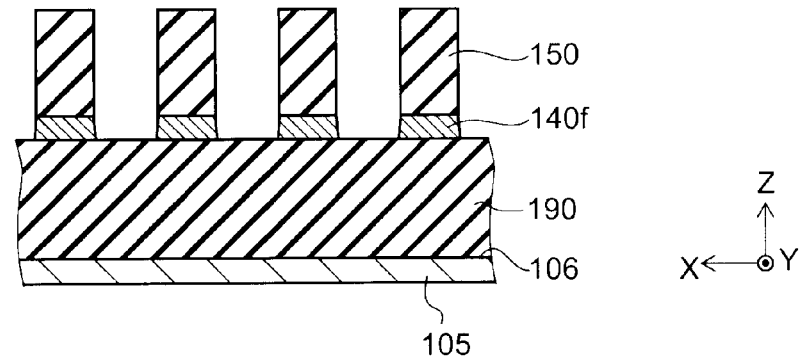

FIGS. 12A to 12D are schematic cross-sectional views in order of the processes, continuing from FIG. 11D.

Figure 12A:
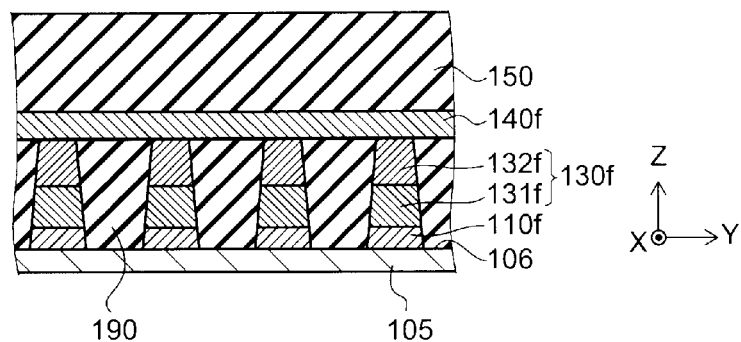
FIGS. 12A to 12D are schematic cross-sectional views in order of the processes, continuing from FIG. 11D.
Figure 12B:
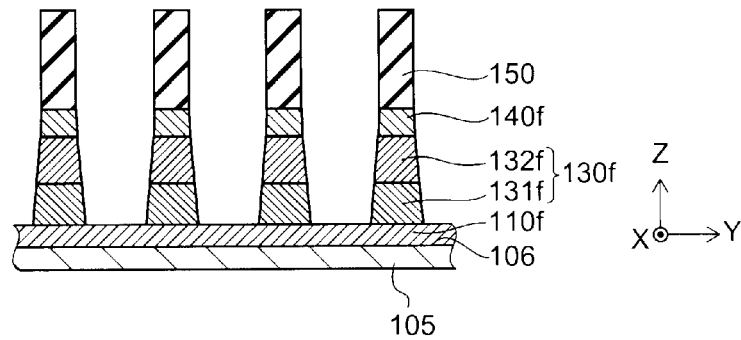
Figure 12C:
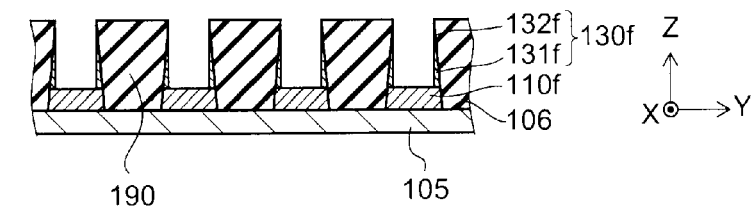
Figure 12D:
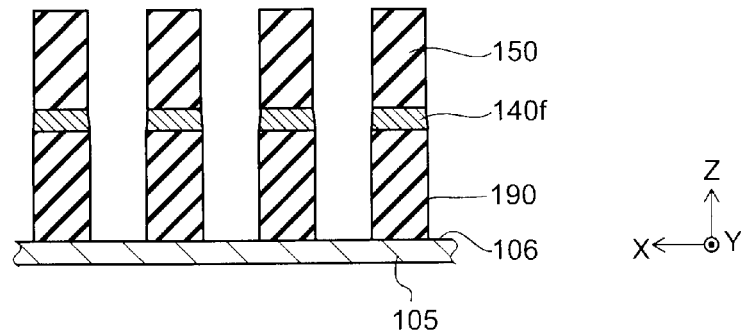

FIGS. 13A to 13D are schematic cross-sectional views in order of the processes, continuing from FIG. 12D.

FIGS. 11A to 11D are views compared with FIGS. 7A to 7D according to this embodiment, FIGS. 12A to 12D are views compared with FIGS. 8A to 8D according to this embodiment, and FIGS. 13A to 13D are views compared with FIGS. 9A to 9D according to this embodiment.

As illustrated in FIGS. 11A to 11D, in the method for manufacturing a nonvolatile storage device of the comparative example, the first electrode film 110f and the first storage unit film 130f are stacked on the substrate 105 (step S110); the first electrode film 110f and the first storage unit film 130f are processed into strip shapes aligning in the first direction (step S120); and then an interlayer insulating film 190 made of silicon oxide is buried between the first electrode films 110f and between the first storage unit films 130f.

Then, the second electrode film 140f that forms the second electrodes 140 is formed (step S140); the mask layer 150 is formed (step S150); and the second electrode film 140f is processed into strip shapes aligning in the second direction by using the mask layer 150 as a mask (step S160). Silicon oxide is used also for the mask layer 150 as in the case of the interlayer insulating film 190.

That is, in the manufacturing method according to this embodiment, the sacrifice layer 181 (e.g. a novolac resin) having a higher etching rate than the mask layer 150 (e.g. silicon oxide) is buried between the first electrode films 110f and between the first storage unit films 130f in step S130; and in contrast, in the case of the manufacturing method of the comparative example, the interlayer insulating film 190 (e.g. silicon oxide) having the same etching rate as the mask layer 150 is used.

Furthermore, in the case of the comparative example, the portion of the first storage unit film 130f exposed from the interlayer insulating film 190 is processed into columnar shapes (step S171) as illustrated in FIGS. 12A to 12D; and when it is attempted to remove the interlayer insulating film 190, a selection ratio of etching cannot be ensured between the interlayer insulating film 190 and the mask layer 150, and therefore the film thickness of the mask layer 150 becomes thin by the etching for removing the interlayer insulating film 190, as illustrated in FIGS. 13A to 13D. Furthermore, the line width of the mask layer 150 becomes narrow.

That is, when, for example, it is attempted to removed the interlayer insulating film 190 (a silicon oxide film) by dry etching, the film thickness of the mask layer 150 (a silicon oxide film) decreases significantly, leading to an insufficient film thickness for the mask for subsequent dry etching. In the case where the selection ratio between the interlayer insulating film 190 and the first electrode film 110f is not sufficient when the interlayer insulating film 190 is removed by dry etching, the wiring portion of the first electrode film 110f, in particular the extraction portion of the wiring of the first electrode film 110f, is etched, and this causes the problems of an increased wiring resistance and disconnection.

On the other hand, in the case where it is attempted to remove the interlayer insulating film 190 by using a chemical solution such as dilute hydrofluoric acid, since the interlayer insulating film 190 is etched isotropically, the mask dimension becomes small due to the recession of the mask layer 150 in the horizontal direction. Furthermore, since the silicon oxide film under the extraction line portion for contact in the wiring end portion also is removed, no supporting member exists under the extraction line portion. Therefore, the problem that the device collapses due to surface tension at the time of drying the chemical solution and the like occurs.

Thus, in the case of the comparative example, the mask layer 150 is damaged in the process of removing the interlayer insulating film 190.

Furthermore, in the case of the comparative example, the interlayer insulating film 190 is removed incompletely if it is attempted to maintain the shape of the mask layer 150 to some extent.

Figure 13A:
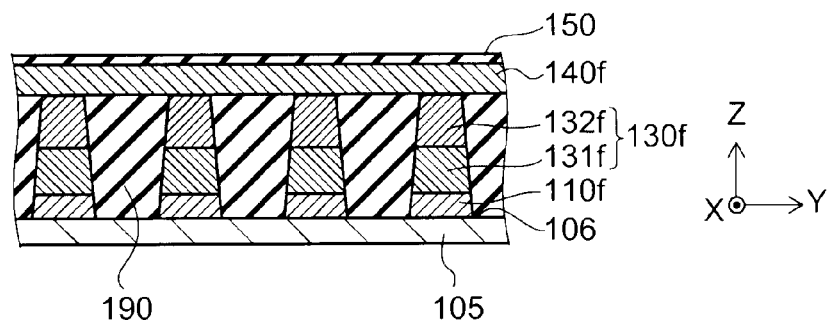
FIGS. 13A to 13D are schematic cross-sectional views in order of the processes, continuing from FIG. 12D.
Figure 13B:
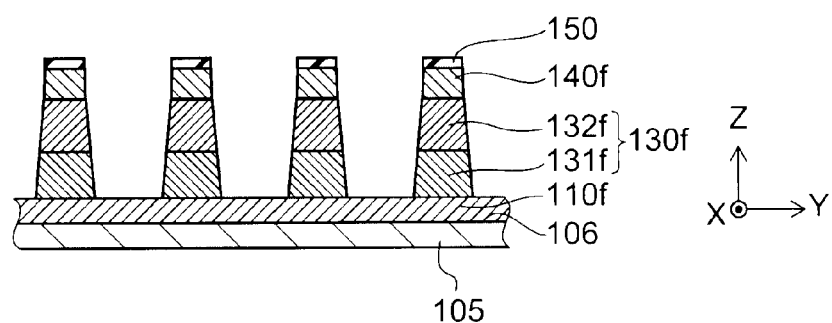
Figure 13C:
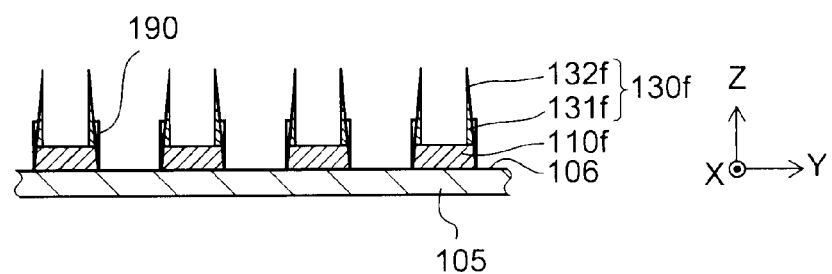
Figure 13D:
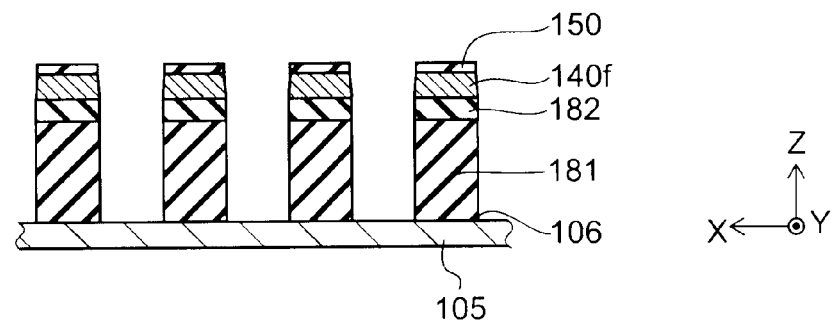

Accordingly, as illustrated in FIG. 13C, the first storage unit film 130f covered with the remaining interlayer insulating film 190 is not removed but left in subsequent processes, and this causes a short between the second electrodes 140, for example.

In contrast, in the method for manufacturing a nonvolatile storage device according to this embodiment, the sacrifice layer 181 of a material having a relatively higher etching rate than the mask layer 150 is used. Thereby, damage to the mask layer 150 can be suppressed at the time of removing the sacrifice layer 181, and the sacrifice layer 181 that covers the first storage unit film 130f in the regions exposed from the mask layer 150 can be removed substantially completely. Thereby, also in the case of a configuration in which the first storage unit film 130f is processed into tapered shapes and the tapered portions of the first storage unit film 130f are covered with the sacrifice layer 181, the sacrifice layer 181 can be removed completely to expose the first storage unit film 130f, and the first storage unit film 130f remaining under the shade of the sacrifice layer 181 can be removed. Furthermore, the problem of the wiring resistance and the disconnection of the first electrode film 110f particularly in the wiring portion also can be avoided.

Thus, the method for manufacturing a nonvolatile storage device according to this embodiment provides a method for manufacturing a nonvolatile storage device that reduces the processing failure of the storage unit between wirings and achieves a high yield.

In the above, a description is given by taking up the case where the first storage unit film 130f has tapered shapes, in order to facilitate the description of effects of this embodiment. However, also in the case where the side wall of the first storage unit film 130f is substantially perpendicular to the X-Y plane, using the manufacturing method according to this embodiment can enlarge the margin of the processing process, and the processing failure of the storage unit between wirings can be reduced and the yield can be increased also in this case.

In the method for manufacturing a nonvolatile storage device according to this embodiment, it is sufficient that the mask layer 150 has a lower etching rate than the sacrifice layer 181.

For example, in the case where an organic film of an epoxy resin such as a novolac resin, an acrylic resin, and the like is used for the sacrifice layer 181, at least one selected from a group consisting of silicon oxide, silicon nitride, silicon oxynitride, and silicon carbide may be used for the mask layer 150.

In the case where an application solution is used as the sacrifice layer 181, a solution with a low surface tension and a high wettability is preferably used. Thereby, the sacrifice layer 181 can be applied between the processed first electrode films 110f and between the processed first storage unit films 130f with good wettability, and the generation of a void and the like can be suppressed.

Furthermore, in the case where, for example, silicon oxide is used for the sacrifice layer 181, at least one of silicon nitride and silicon carbide, for example, may be used for the mask layer 150.

As described above, after step S130 (burying of the sacrifice layer 181 between the processed first electrode films 110f and between the processed first storage unit films 130f), the first cap layer 182 (for example, a film made of silicon oxide) having a lower etching rate than the sacrifice layer 181 may be buried between the processed first electrode films 110f and between the processed first storage unit films 130f. Thereby, damage to the sacrifice layer 181 can be suppressed.

Furthermore, in the case where an organic material is used for the sacrifice layer 181, processing that uses plasma including gas including at least one selected from a group consisting of $O_2$, $H_2$, $H_2O$, $NH_3$, and $CH_4$ may be employed for the process of removing the sacrifice layer 181 in step S171. Thereby, the sacrifice layer 181 made of an organic material can be etched, the amount of the recession of the mask layer 150 can be made small, and the margin of the processing process can be increased, without requiring large ion energy.

Isotropic etching using downflow plasma using microwave, for example, or anisotropic etching using RIE, for example, may be used for removing the sacrifice layer 181 in step S171.

At this time, if the sacrifice layer 181 is etched isotropically, the sacrifice layer 181 located below the second electrode 140 (the mask layer 150) also is etched. However, when the sacrifice layer 181 is etched anisotropically, the sacrifice layer 181 located below the second electrode 140 (the mask layer 150) is not completely removed.

In the process of removing the sacrifice layer 181, in the case where plasma including high level of oxygen is used, in the case where the first electrode 110 and the second electrode 140 are an easily-oxidized material such as tungsten, and in the case where characteristics of the first storage layer 132 easily changes by oxidation, a protection film such as a silicon oxide film and a silicon nitride film may be formed on the side walls of the first electrode film 110f, the second electrode film 140f, and the first storage unit film 130f by the ALD (atomic layer deposition) method and the like. Thereby, the oxidation and reaction of the side walls can be suppressed.

Second Embodiment

A method for manufacturing a nonvolatile storage device according to a second embodiment of the invention is used for a nonvolatile storage device in which a plurality of memory cell arrays are stacked.

Figure 14:
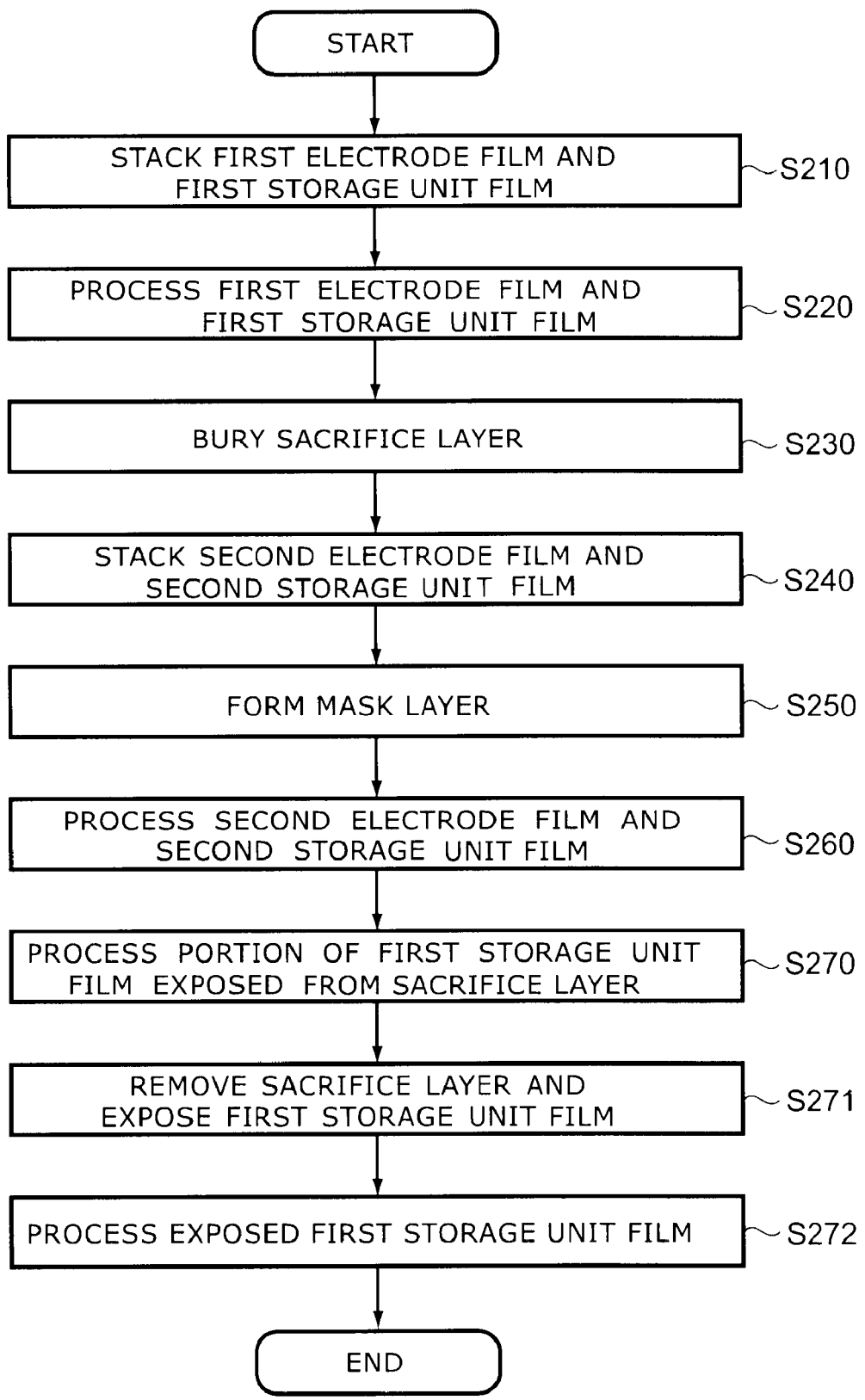
FIG. 14 is a flow chart illustrating a method for manufacturing a nonvolatile storage device according to the second embodiment of the invention.

FIG. 14 is a flow chart illustrating a method for manufacturing a nonvolatile storage device according to the second embodiment of the invention.

Figure 15A:
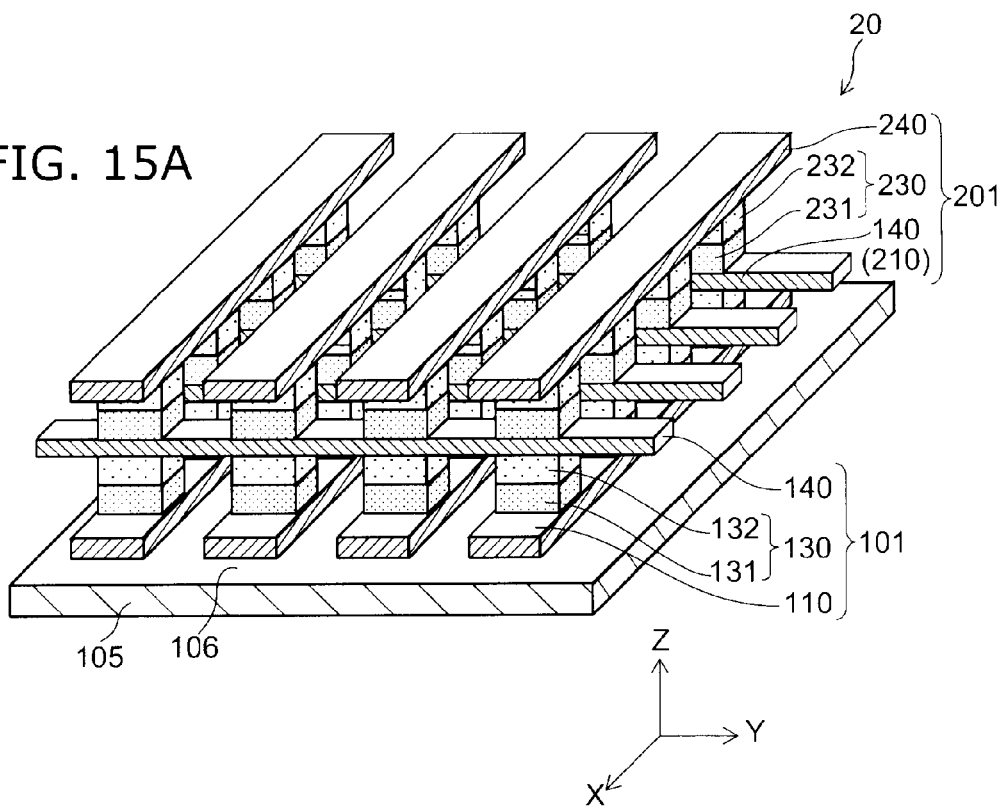
FIGS. 15A and 15B are schematic views illustrating the configuration of a nonvolatile storage device manufactured by the method for manufacturing a nonvolatile storage device according to the second embodiment of the invention.
Figure 15B:
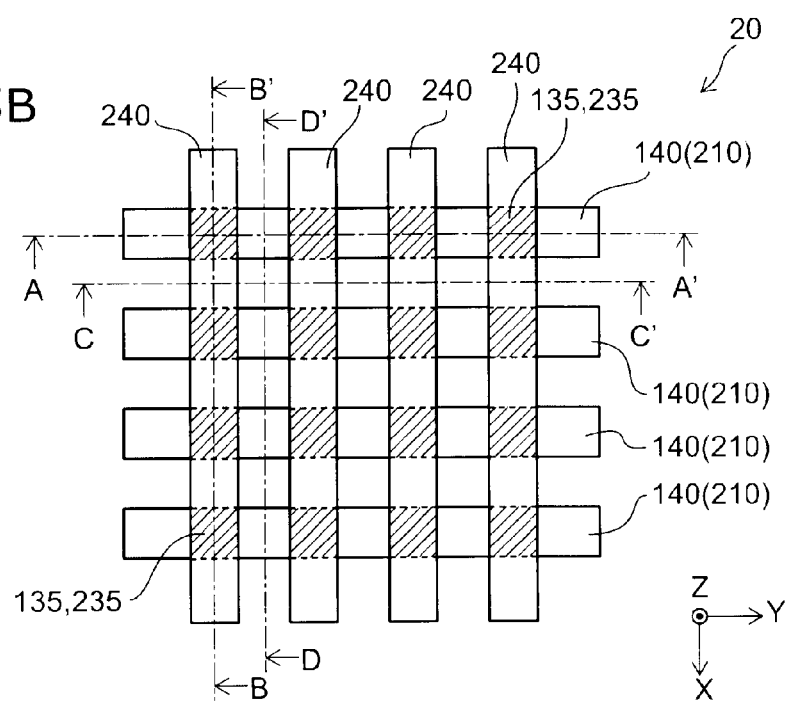

FIGS. 15A and 15B are schematic views illustrating the configuration of a nonvolatile storage device manufactured by the method for manufacturing a nonvolatile storage device according to the second embodiment of the invention.

Specifically, FIG. 15A is a perspective view, and FIG. 15B is a plan view.

FIGS. 16A to 16D are schematic cross-sectional views illustrating the configuration of the nonvolatile storage device manufactured by the method for manufacturing a nonvolatile storage device according to the second embodiment of the invention.

Figure 16A:
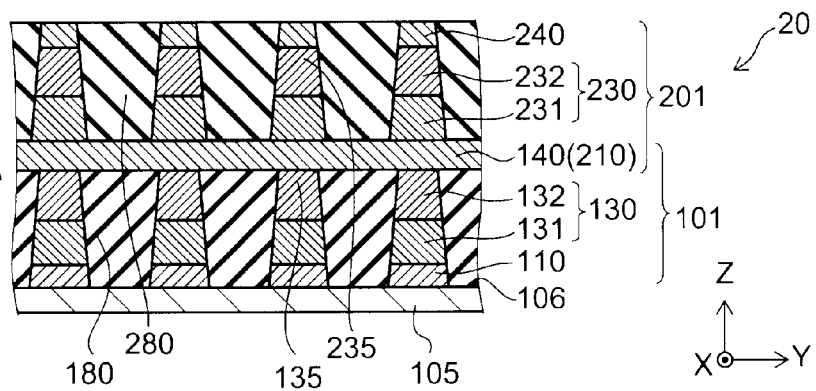
FIGS. 16A to 16D are schematic cross-sectional views illustrating the configuration of the nonvolatile storage device manufactured by the method for manufacturing a nonvolatile storage device according to the second embodiment of the invention.
Figure 16B:
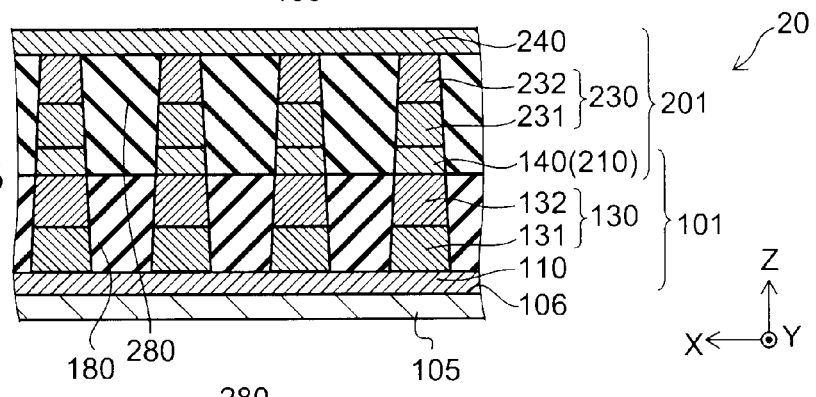
Figure 16C:
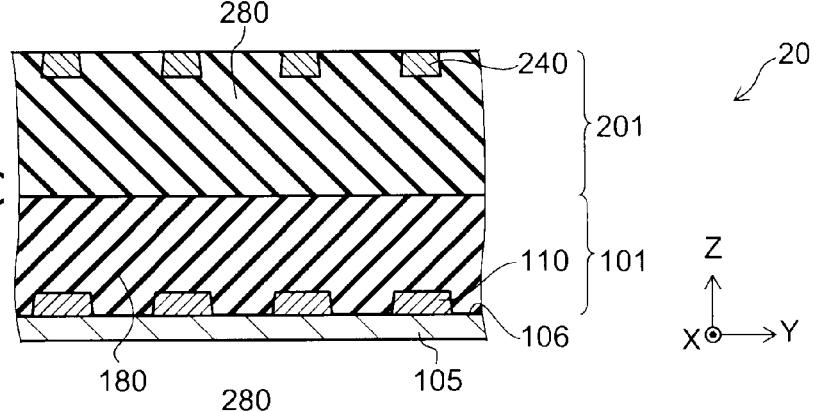
Figure 16D:
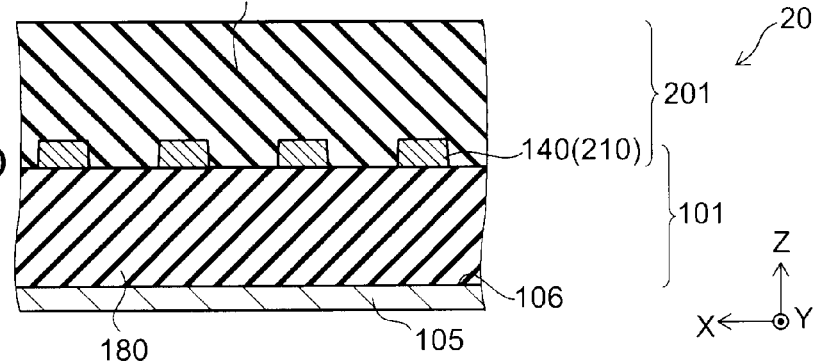

Specifically, FIG. 16A is a cross-sectional view taken along line A-A' of FIG. 15B, FIG. 16B is a cross-sectional view taken along line B-B' of FIG. 15B, FIG. 16C is a cross-sectional view taken along line C-C' of FIG. 15B, and FIG. 16D is a cross-sectional view taken along line D-D' of FIG. 15B.

FIGS. 17A to 17D are schematic cross-sectional views in order of the processes, illustrating a method for manufacturing a nonvolatile storage device according to the second embodiment of the invention.

Figure 17A:
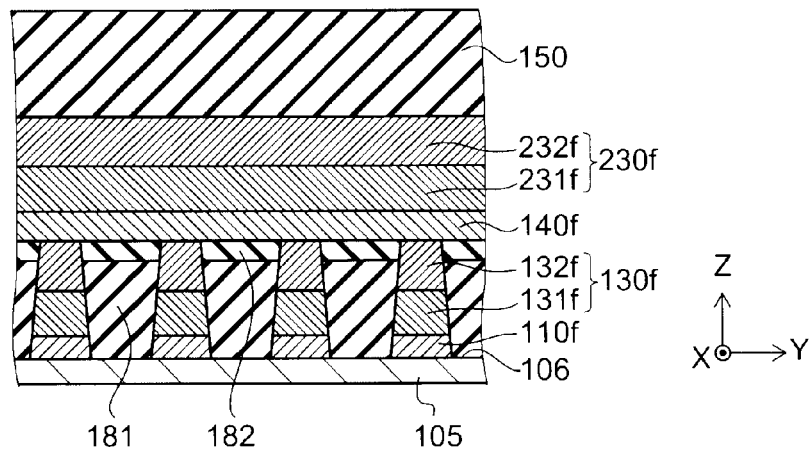
FIGS. 17A to 17D are schematic cross-sectional views in order of the processes, illustrating a method for manufacturing a nonvolatile storage device according to the second embodiment of the invention.
Figure 17B:
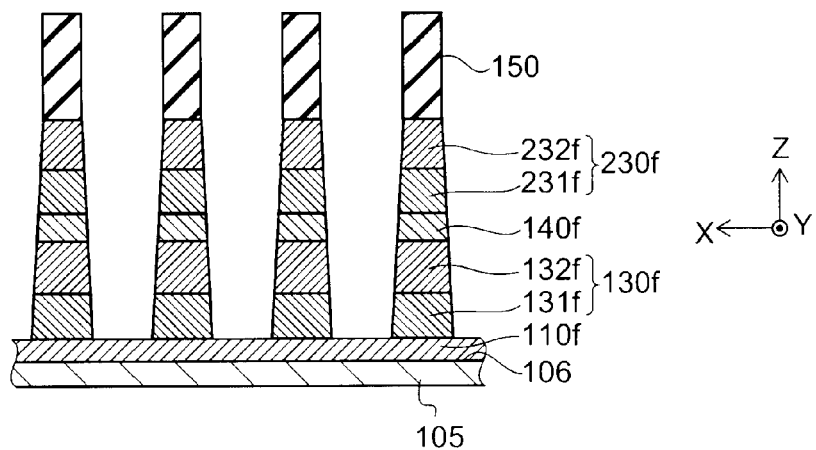
Figure 17C:
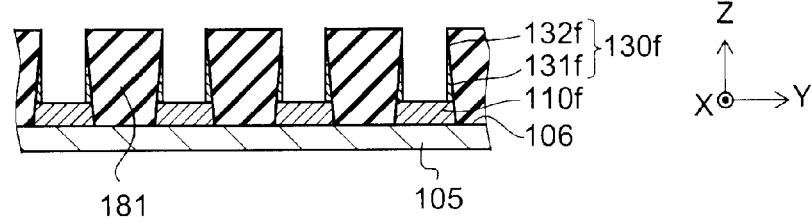
Figure 17D:
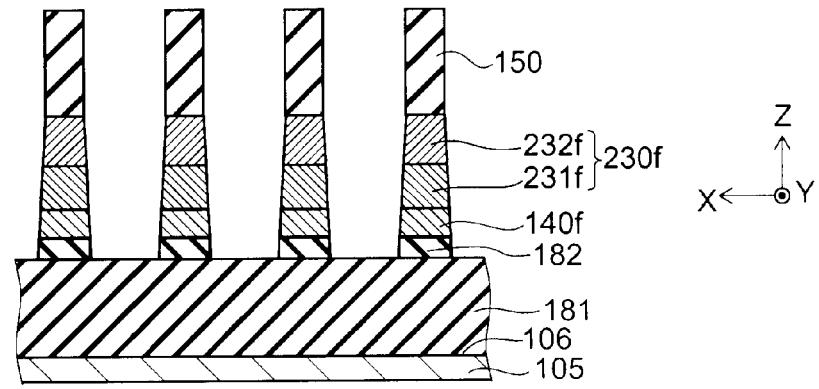
Figure 18A:
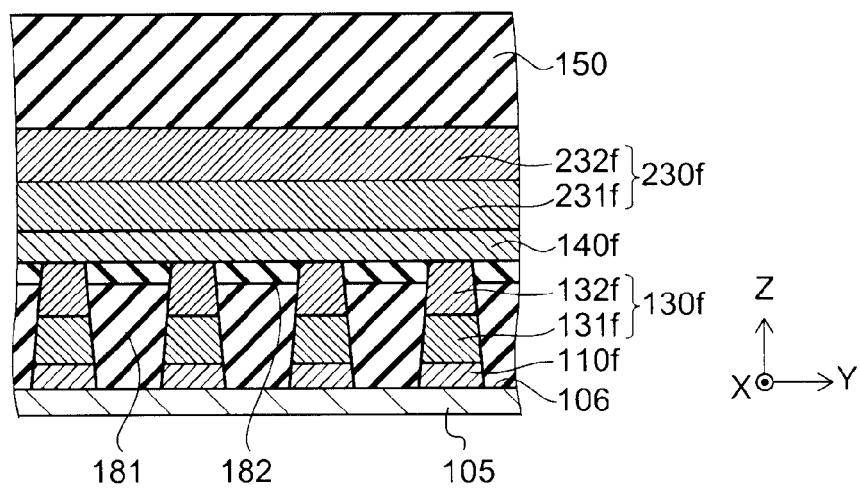
FIGS. 18A to 18D are schematic cross-sectional views in order of the processes, continuing from FIG. 17D.
Figure 18B:
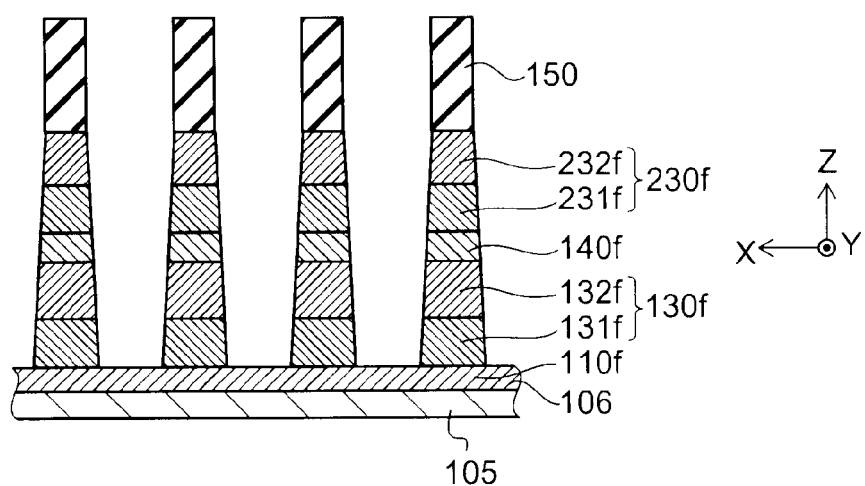
Figure 18C:
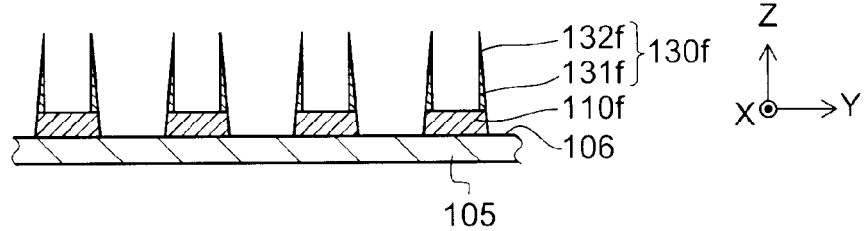
Figure 18D:
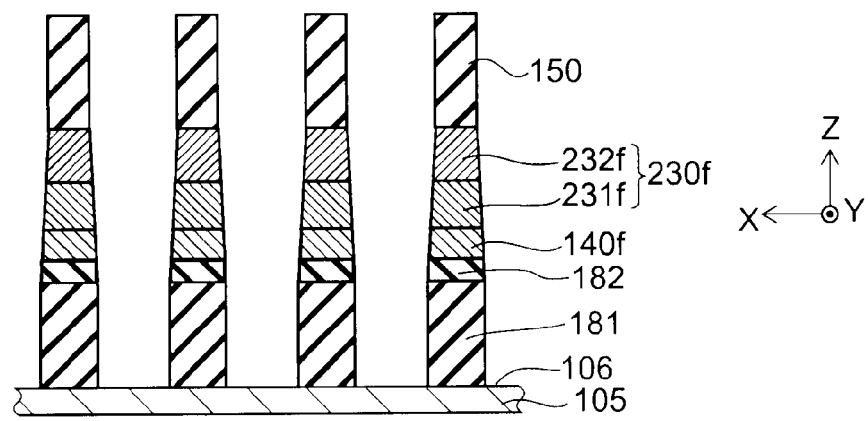

FIGS. 18A to 18D are schematic cross-sectional views in order of the processes, continuing from FIG. 17D.

As illustrated in FIGS. 15A and 15B and FIGS. 16A to 16D, a nonvolatile storage device 20 manufactured by the manufacturing method according to the second embodiment includes a plurality of memory cell arrays stacked in the Z-axis direction. The first memory cell array 101 may be similar to that described in regard to the first embodiment, and a description is therefore omitted.

In the nonvolatile storage device 20, a second memory cell array 201 is stacked on the first memory cell array 101 in the Z-axis direction.

The second memory cell array 201 includes the second electrodes 140, third electrodes 240, and a second storage unit 230 provided between the second electrode 140 and the third electrode 240. The second electrode 140 in the second memory cell array 201 functions also as the second electrode 140 in the first memory cell array 101. The second electrode 140 is a word line, for example, and the third electrode 240 is a bit line, for example.

The second storage unit 230 includes a second storage layer 232. The second storage layer 232 is a layer of which the resistance changes by at least one of an applied electric field and an applied current.

The second storage unit 230 may further include a second rectifying element 231. Although the second rectifying element 231 is provided between the second electrode 140 and the second storage layer 232 in this specific example, the second rectifying element 231 may be provided between the third electrode 240 and the second storage layer 232, and the stacking order is arbitrary.

The configuration and material described in regard to the first storage unit 130, the first storage layer 132, the first rectifying element 131, and the first electrode 110 (or the second electrode 140) may be used for the second storage unit 230, the second storage layer 232, the second rectifying element 231, and the third electrode 240. Therefore, a description is omitted.

As illustrated in FIGS. 16A to 16D, a second interlayer insulating film 280 made of silicon oxide or the like is buried around a second memory cell 235 formed between the second electrode 140 and the third electrode 240.

A method for manufacturing the nonvolatile storage device 20 having such a configuration will now be described with reference to FIG. 14 and FIG. 17A to FIG. 18D.

First, as illustrated in FIGS. 17A to 17D, the first electrode film 110f that forms the first electrodes 110 and the first storage unit film 130f that forms the first storage units 130 are stacked on the major surface 106 of the substrate 105 (step S210 illustrated in FIG. 14). Then, the first electrode film 110f and the first storage unit film 130f are processed into strip shapes aligning in the first direction (step S220). At this time, the first storage unit film 130f may be processed into tapered shapes.

Then, the sacrifice layer 181 is buried between the processed first electrode films 110f and between the processed first storage unit films 130f (step S230). A novolac resin, for example, is used as the sacrifice layer 181.

Then, the second electrode film 140f that forms the second electrodes 140 and a second storage unit film 230f that forms the second storage units 230 are stacked on the first storage unit film 130f and the sacrifice layer 181 (step S240). The second storage unit film 230f includes a second rectifying element film 231f that forms the second rectifying elements 231 and a second storage layer film 232f that forms the second storage layers 232, for example.

Then, the mask layer 150 having a lower etching rate than the sacrifice layer 181 is formed on the second storage unit film 230f (step S250). Silicon oxide, for example, is used as the mask layer 150.

Then, the second electrode film 140f and the second storage unit film 230f are processed into strip shapes aligning in the second direction by using the mask layer 150 as a mask (step S260). Then, the portion of the first storage unit film 130f exposed from the sacrifice layer 181 is processed into columnar shapes including a side wall along the first direction and a side wall along the second direction by using the mask layer 150 as a mask (step S270).

At this time, as illustrated in FIG. 17C, the first storage unit film 130f has a tapered shape in the cross section taken along line C-C' of FIG. 15B, and the first storage unit film 130f is covered with the sacrifice layer 181 in this portion. Therefore, the portion where the first storage unit film 130f is covered with the sacrifice layer 181 is left without being etched.

Then, as illustrated in FIGS. 18A to 18D, the sacrifice layer 181 is removed to expose the first storage unit film 130f that has been covered with the sacrifice layer 181 (step S271).

In the case where a novolac resin is used as the sacrifice layer 181, the sacrifice layer 181 can be removed by using plasma using oxygen gas or mixed gas of oxygen and ammonia, for example.

At this time, since the novolac resin, for example, which has a higher etching rate than the mask layer 150 (e.g. silicon oxide) is provided as the sacrifice layer 181, the sacrifice layer 181 can be removed without damaging the mask layer 150 substantially.

Then, the exposed first storage unit film 130f is removed (step S272).

After that, for example, the mask layer 150 is removed, and the sacrifice layer 181 is removed by isotropic etching by plasma including oxygen, ammonia, hydrogen, water, and the like, for example. After that, silicon oxide that forms the first interlayer insulating film 180 is buried between the first electrode films 110f, between the first storage unit films 130f, and between the second electrode films 140f by a method such as CVD and SOG, for example.

Thereby, the memory cell array 101 of the first layer can be formed.

At this time, the first interlayer insulating film 180 is provided at depths from the substrate 105 to the second electrode 140, for example; a sacrifice layer of the second layer made of, for example, a novolac resin is formed on the upper side thereof; then a third electrode film that forms the third electrodes 240 is formed on the second storage unit film 230f and the sacrifice layer of the second layer; the third electrode film is processed and the second storage unit film 230f is processed into columnar shapes in the same manner as the memory cell array 101 of the first layer; and then the second interlayer insulating film 280 is buried. Thereby, the nonvolatile storage device 20 illustrated in FIGS. 15A and 15B and FIGS. 16A to 16D can be manufactured.

Thus, the manufacturing method according to this embodiment can manufacture the nonvolatile storage device 20 in which two memory cell arrays are stacked and the second electrode 140 is shared between the first layer and the second layer, and can reduce the processing failure of the storage unit between wirings and increase the yield also in this case.

Although the case where two memory cell arrays are stacked is described in the above, the method for manufacturing a nonvolatile storage device according to this embodiment can be used for a nonvolatile storage device in which any numbers of memory cell arrays are stacked.

Figure 19:
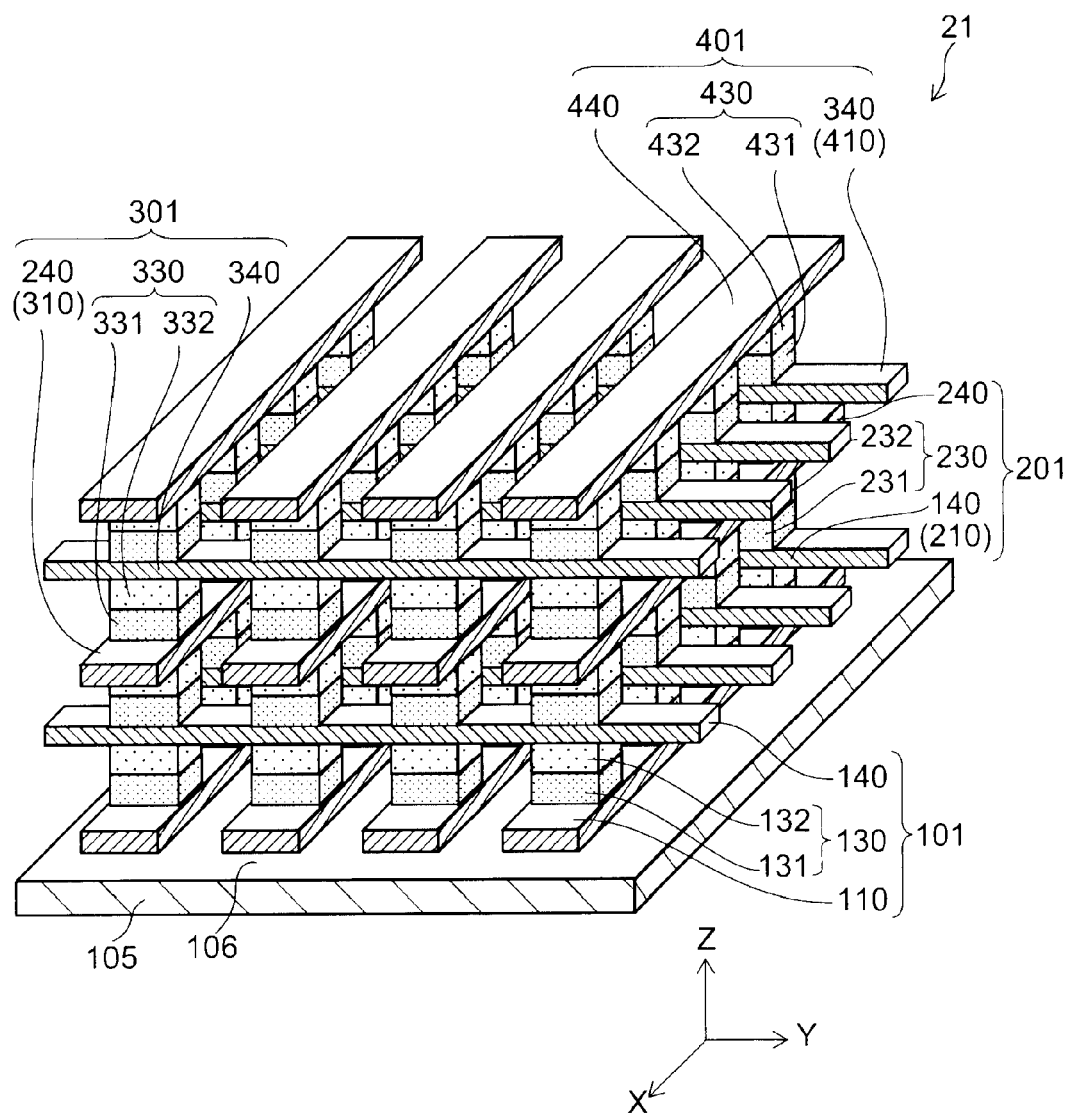
FIG. 19 is a schematic perspective view illustrating the configuration of another nonvolatile storage device manufactured by the method for manufacturing a nonvolatile storage device according to the second embodiment of the invention.

FIG. 19 is a schematic perspective view illustrating the configuration of another nonvolatile storage device manufactured by the method for manufacturing a nonvolatile storage device according to the second embodiment of the invention.

As illustrated in FIG. 19, four memory cell arrays are stacked in another nonvolatile storage device 21 manufactured by the manufacturing method according to this embodiment. That is, the nonvolatile storage device 21 includes a first to a fourth memory cell array 101, 201, 301, and 401. The configuration of each of the memory cell arrays is similar to the nonvolatile storage devices 10 and 20.

That is, the third memory cell array 301 includes the third electrodes 240, fourth electrodes 340, and a third storage unit 330 provided between the third electrode 240 and the fourth electrode 340. The third storage unit 330 includes a third storage layer 332 and a third rectifying element layer 331.

The fourth memory cell array 401 includes the fourth electrodes 340, fifth electrodes 440, and a fourth storage unit 430 provided between the fourth electrode 340 and the fifth electrode 440. The fourth storage unit 430 includes a fourth storage layer 432 and a fourth rectifying element layer 431.

The third electrode 240 is shared between the second memory cell array 201 and the third memory cell array 301. The fourth electrode 340 is shared between the third memory cell array 301 and the fourth memory cell array 401.

Thus, the nonvolatile storage device that includes three or more memory cell arrays and shares the electrode between mutually stacked memory cell arrays also can be manufactured by applying the method for manufacturing a nonvolatile storage device according to the second embodiment.

In the case of a nonvolatile storage device in which memory cell arrays are stacked and the electrode is not shared between mutually stacked memory cell arrays, it can be manufactured by applying the method for manufacturing a nonvolatile storage device according to the first embodiment.

Third Embodiment

Figure 20:
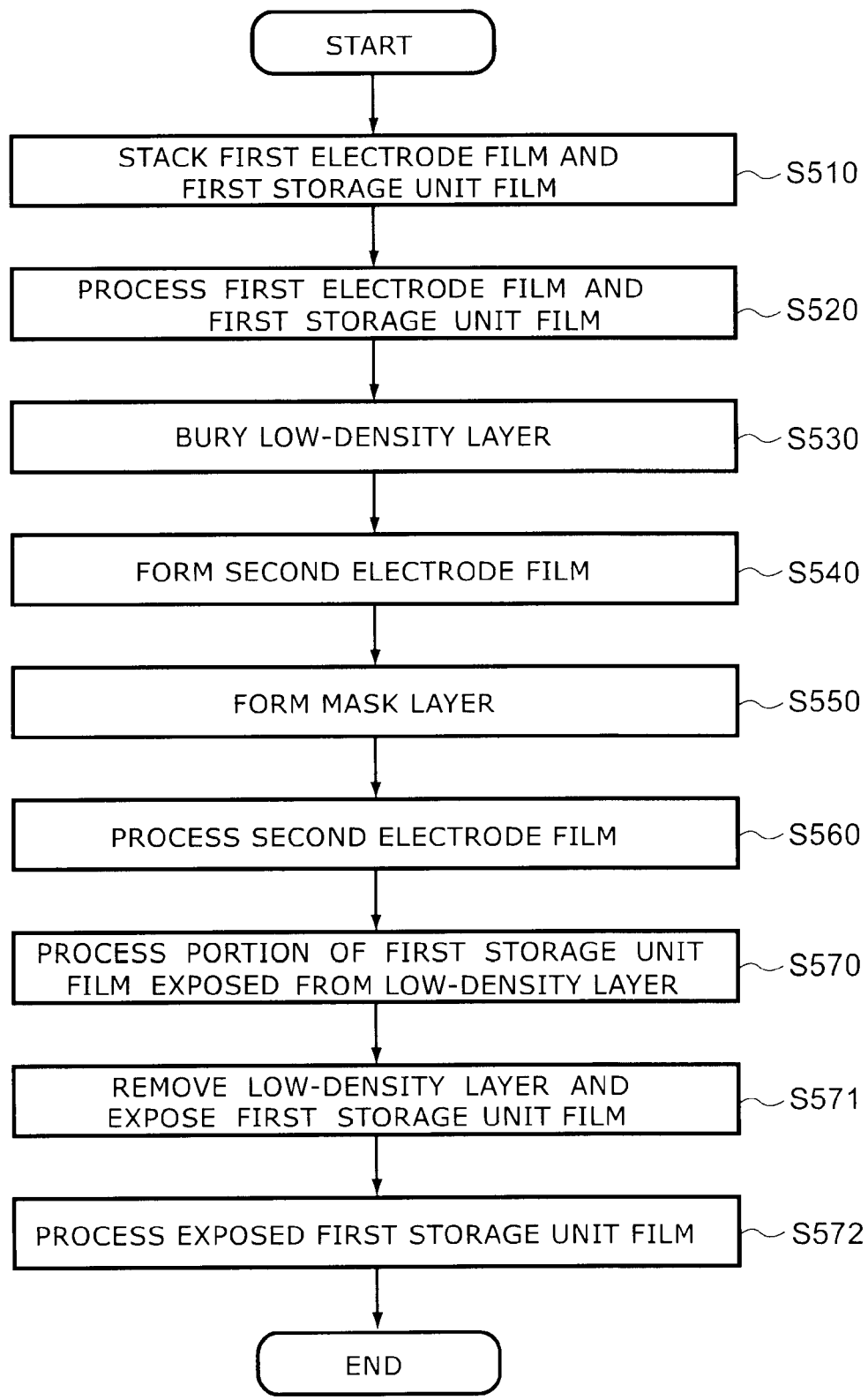
FIG. 20 is a flow chart illustrating a method for manufacturing a nonvolatile storage device according to a third embodiment of the invention.

FIG. 20 is a flow chart illustrating a method for manufacturing a nonvolatile storage device according to a third embodiment of the invention.

Figure 21A:
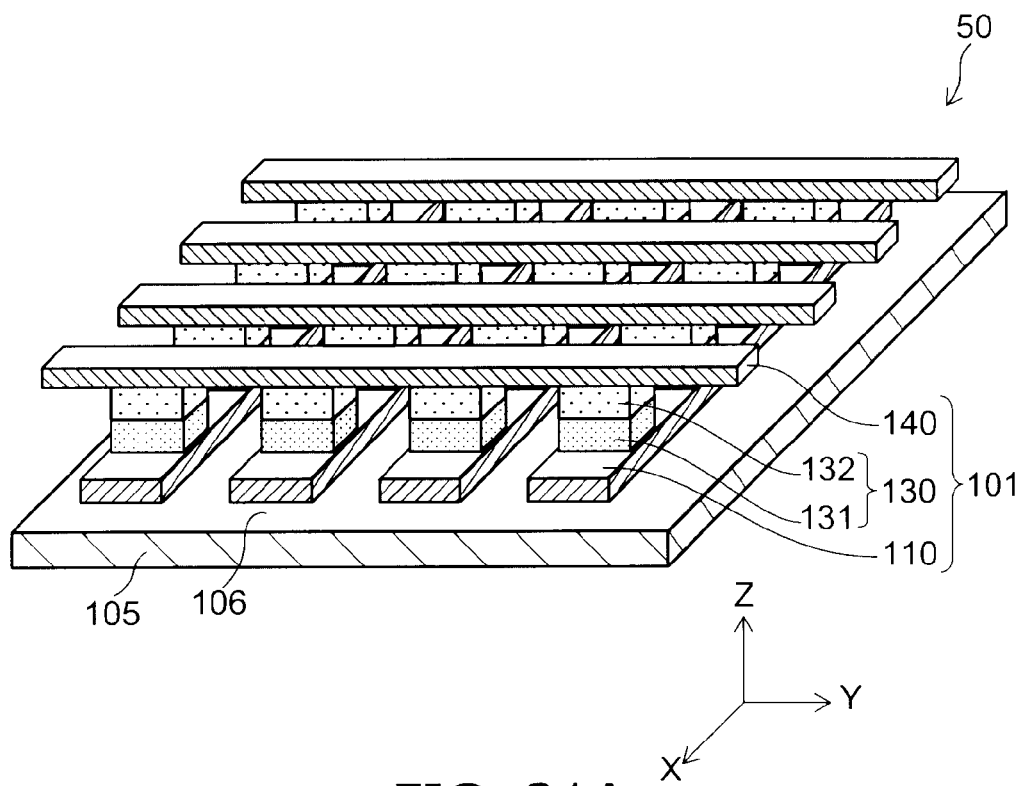
FIGS. 21A and 21B are schematic views illustrating the configuration of a nonvolatile storage device manufactured by the method for manufacturing a nonvolatile storage device according to the third embodiment of the invention.
Figure 21B:
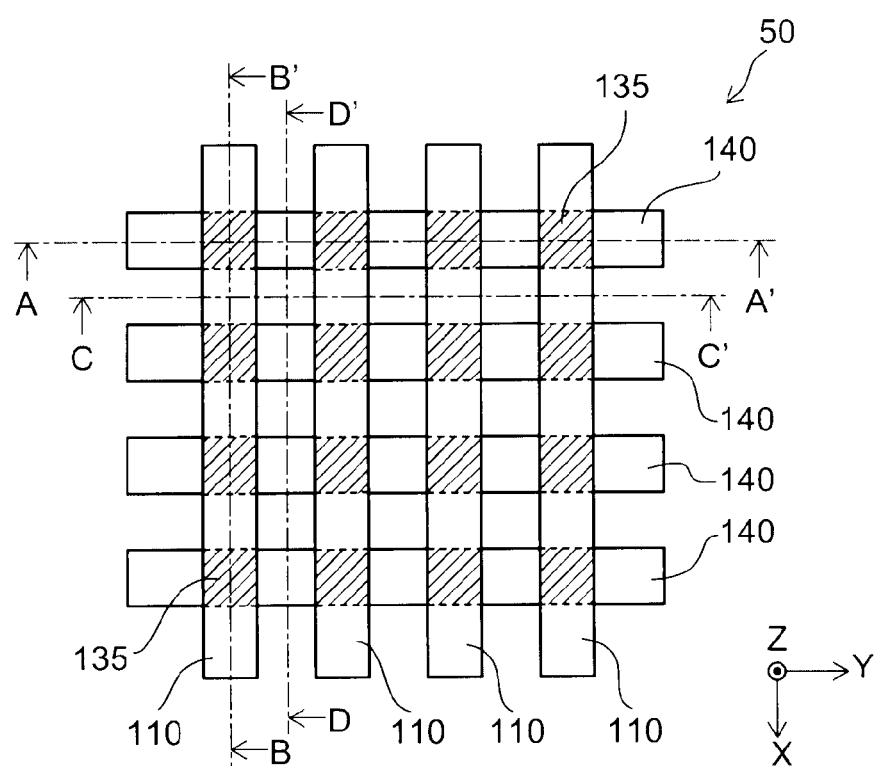

FIGS. 21A and 21B are schematic views illustrating the configuration of a nonvolatile storage device manufactured by the method for manufacturing a nonvolatile storage device according to the third embodiment of the invention.

Specifically, FIG. 21A is a perspective view, and FIG. 21B is a plan view.

FIGS. 22A to 22D are schematic cross-sectional views illustrating the configuration of the nonvolatile storage device manufactured by the method for manufacturing a nonvolatile storage device according to the third embodiment of the invention.

Figure 22A:
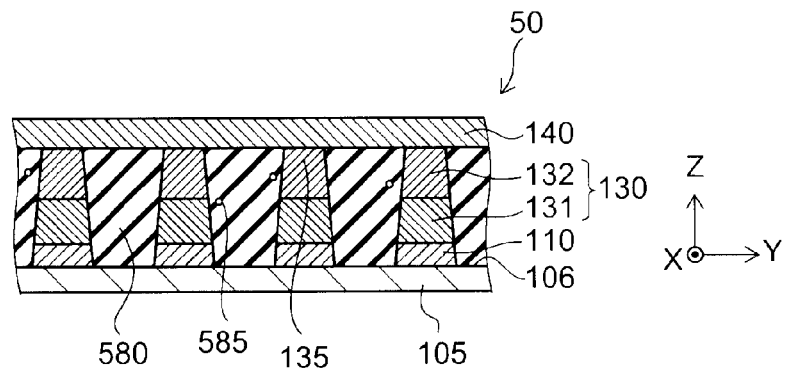
FIGS. 22A to 22D are schematic cross-sectional views illustrating the configuration of the nonvolatile storage device manufactured by the method for manufacturing a nonvolatile storage device according to the third embodiment of the invention.
Figure 22B:
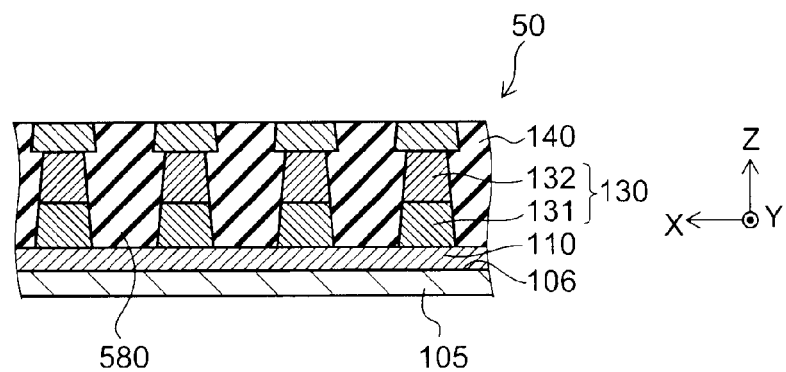
Figure 22C:
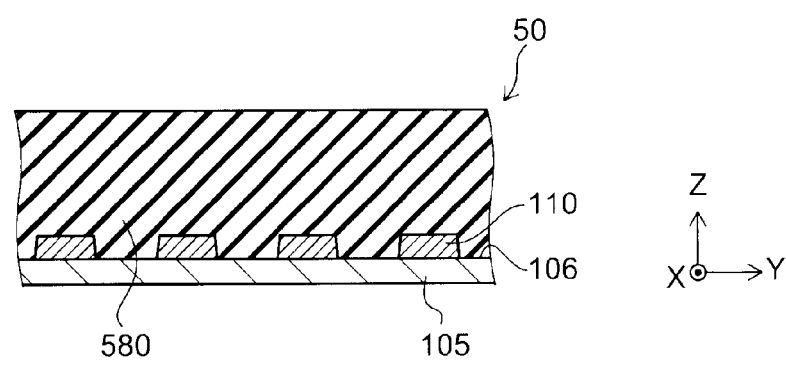
Figure 22D:
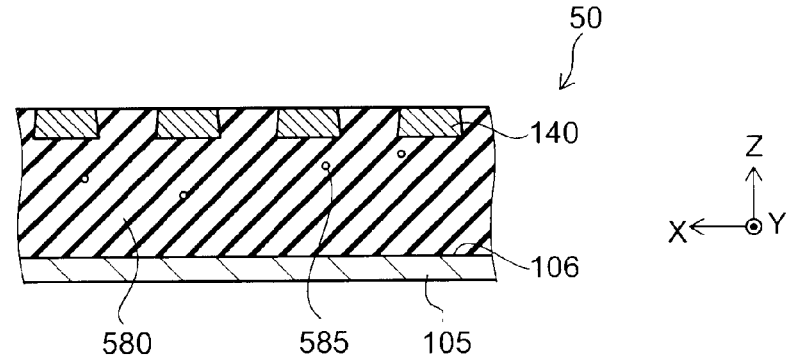

Specifically, FIG. 22A is a cross-sectional view taken along line A-A' of FIG. 21B, FIG. 22B is a cross-sectional view taken along line B-B' of FIG. 21B, FIG. 22C is a cross-sectional view taken along line C-C of FIG. 21B, and FIG. 22D is a cross-sectional view taken along line D-D' of FIG. 21B.

FIGS. 23A to 23D are schematic cross-sectional views in order of the processes, illustrating the method for manufacturing a nonvolatile storage device according to the third embodiment of the invention.

Figure 23A:
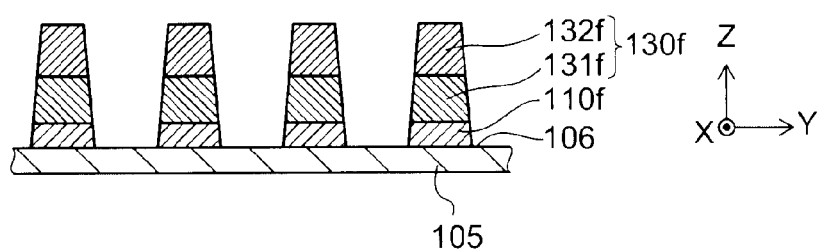
FIGS. 23A to 23D are schematic cross-sectional views in order of the processes, illustrating the method for manufacturing a nonvolatile storage device according to the third embodiment of the invention.
Figure 23B:
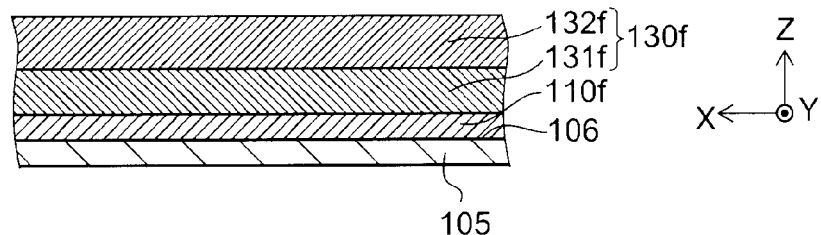
Figure 23C:
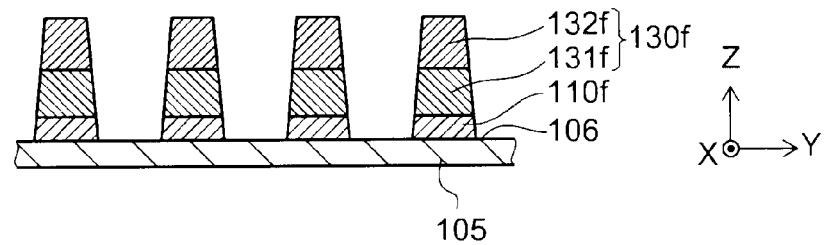
Figure 23D:
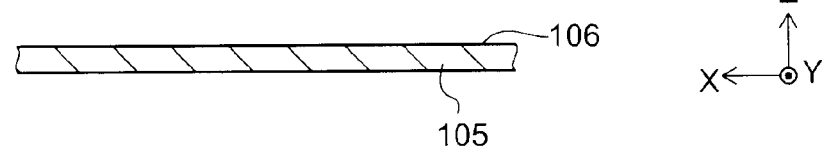

FIGS. 24A to 24D are schematic cross-sectional views in order of the processes, continuing from FIG. 23D.

Figure 24A:
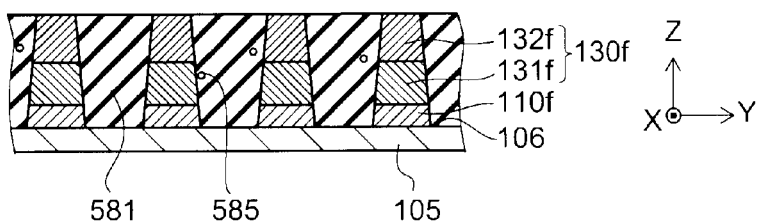
FIGS. 24A to 24D are schematic cross-sectional views in order of the processes, continuing from FIG. 23D.
Figure 24B:
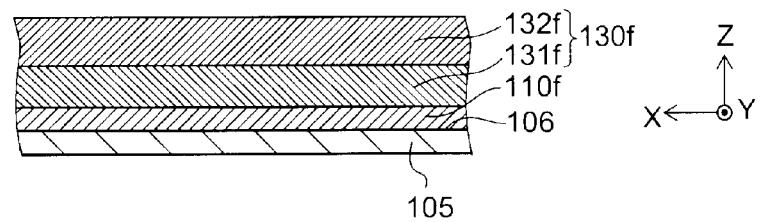
Figure 24C:
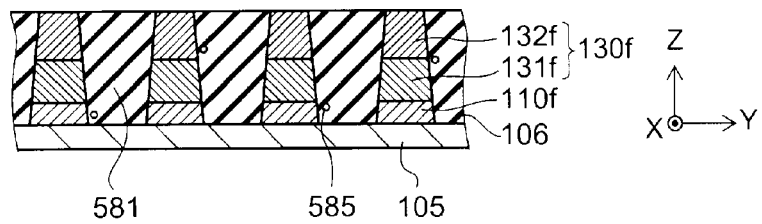
Figure 24D:
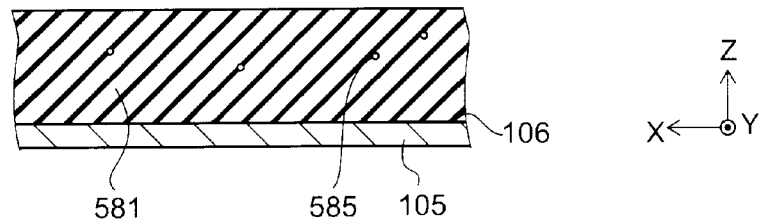

FIGS. 25A to 25D are schematic cross-sectional views in order of the processes, continuing from FIG. 24D.

Figure 25A:
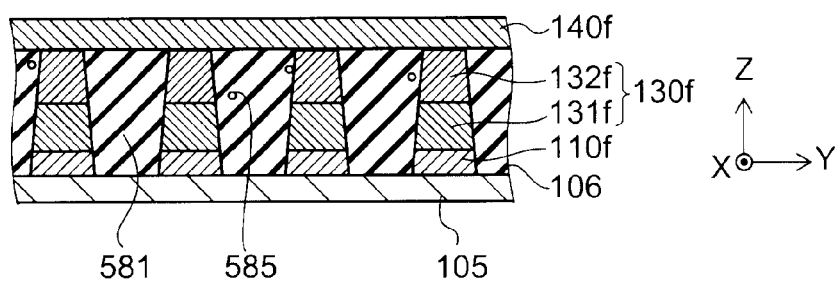
FIGS. 25A to 25D are schematic cross-sectional views in order of the processes, continuing from FIG. 24D.
Figure 25B:
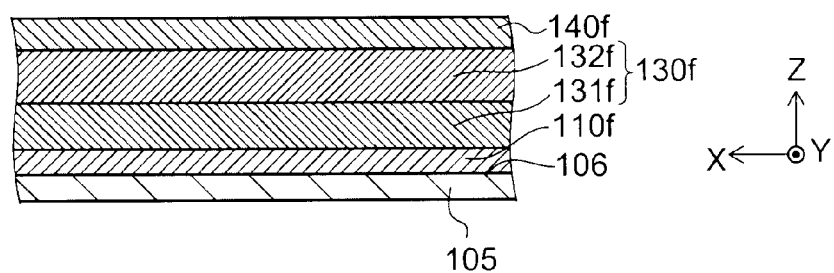
Figure 25C:
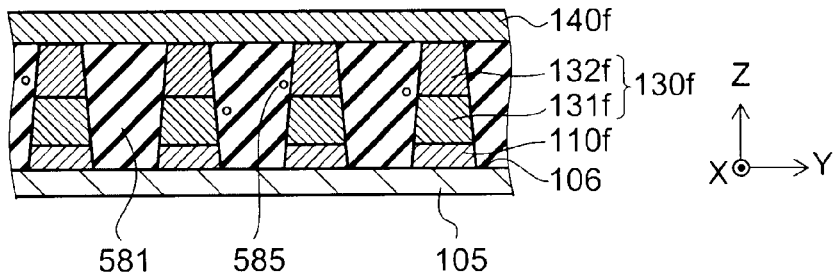
Figure 25D:
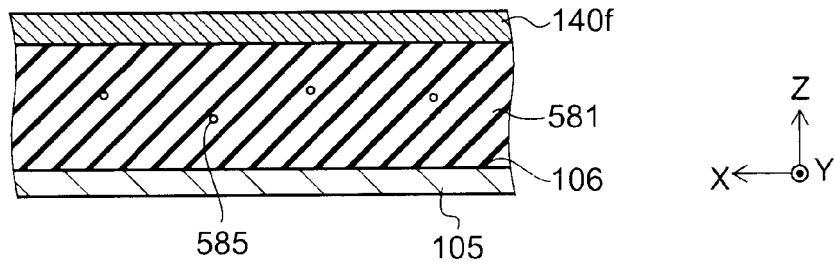

FIGS. 26A to 26D are schematic cross-sectional views in order of the processes, continuing from FIG. 25D.

Figure 26A:
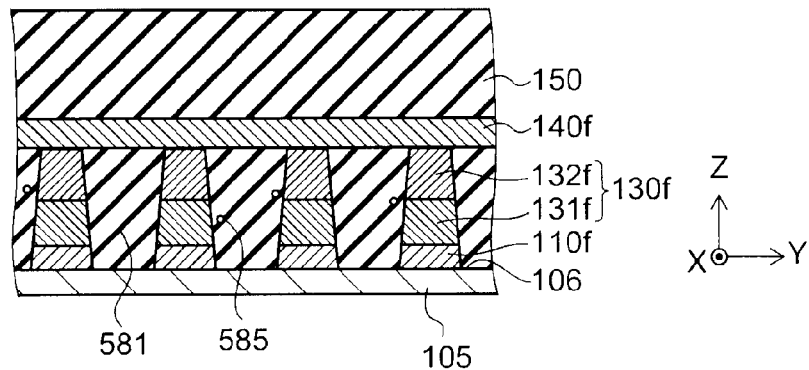
FIGS. 26A to 26D are schematic cross-sectional views in order of the processes, continuing from FIG. 25D.
Figure 26B:
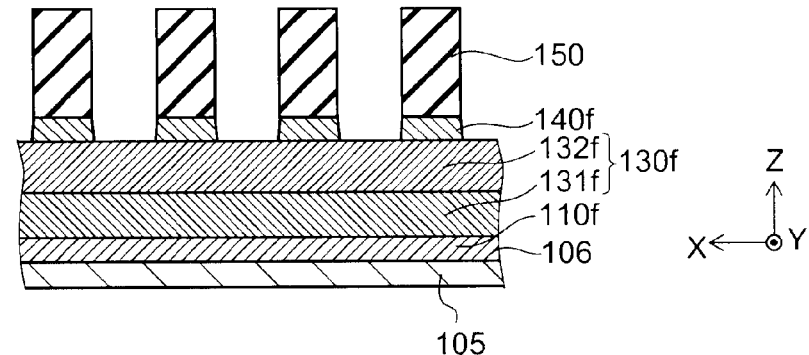
Figure 26C:
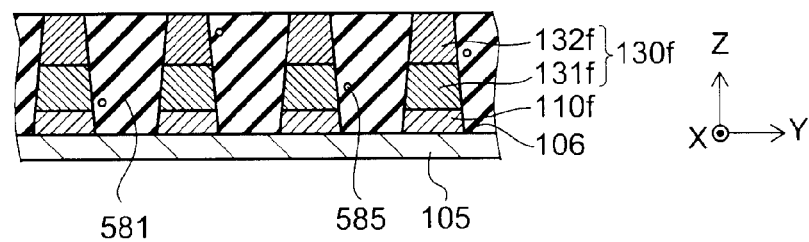
Figure 26D:
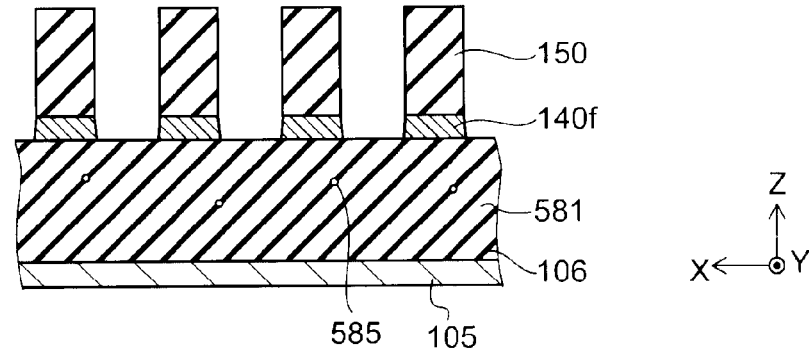

FIGS. 27A to 27D are schematic cross-sectional views in order of the processes, continuing from FIG. 26D.

Figure 27A:
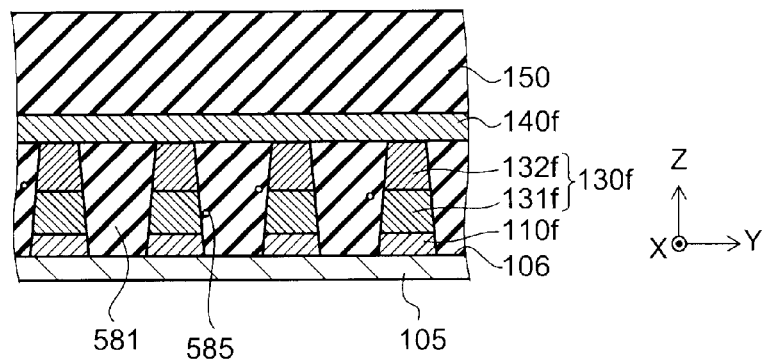
FIGS. 27A to 27D are schematic cross-sectional views in order of the processes, continuing from FIG. 26D.
Figure 27B:
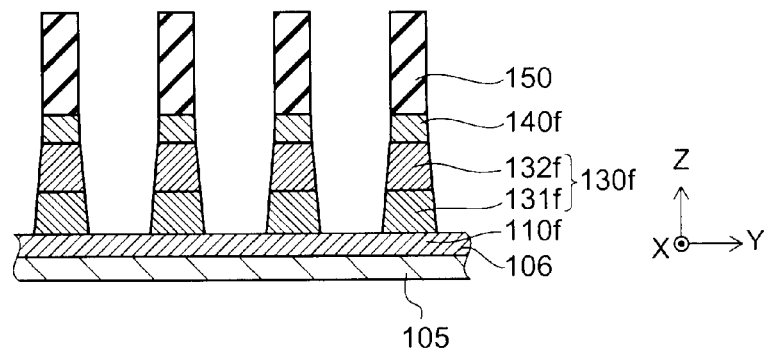
Figure 27C:
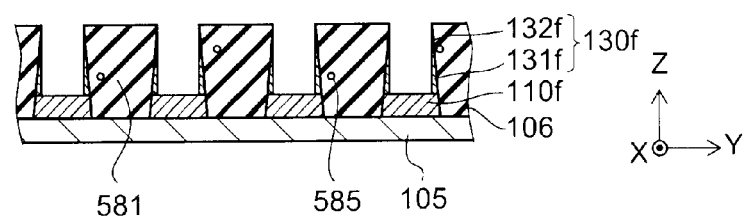
Figure 27D:
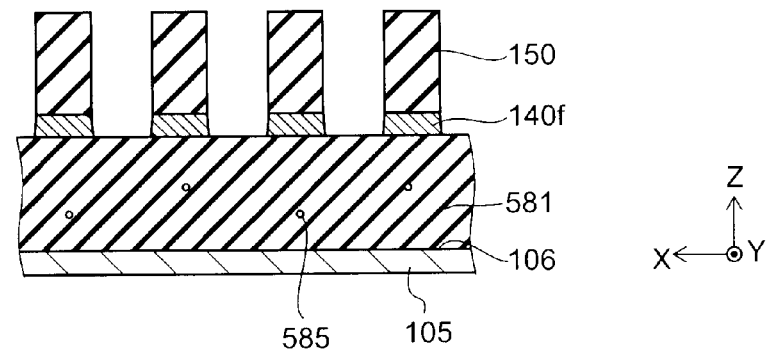

FIGS. 28A to 28D are schematic cross-sectional views in order of the processes, continuing from FIG. 27D.

Figure 28A:
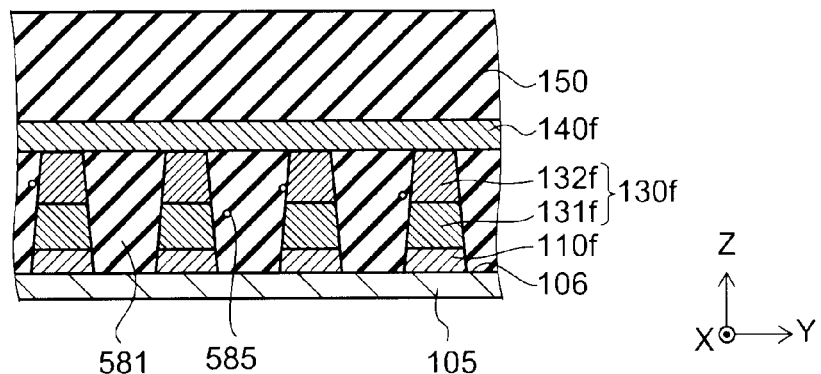
FIGS. 28A to 28D are schematic cross-sectional views in order of the processes, continuing from FIG. 27D.
Figure 28B:
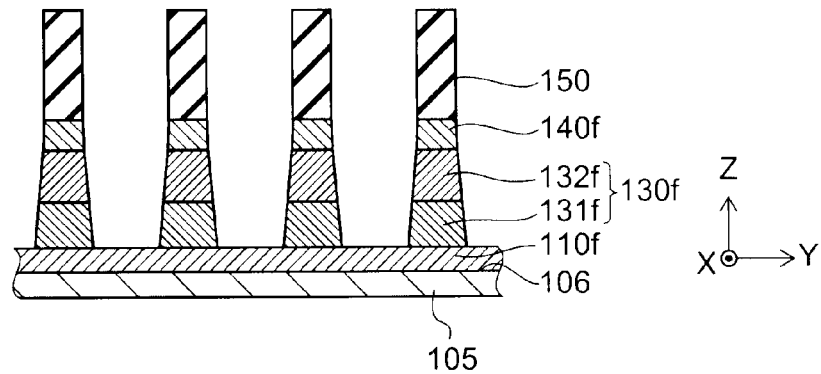
Figure 28C:
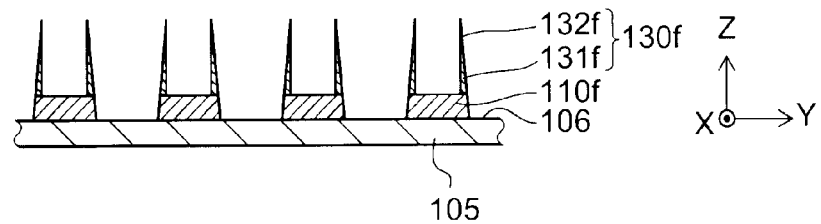
Figure 28D:
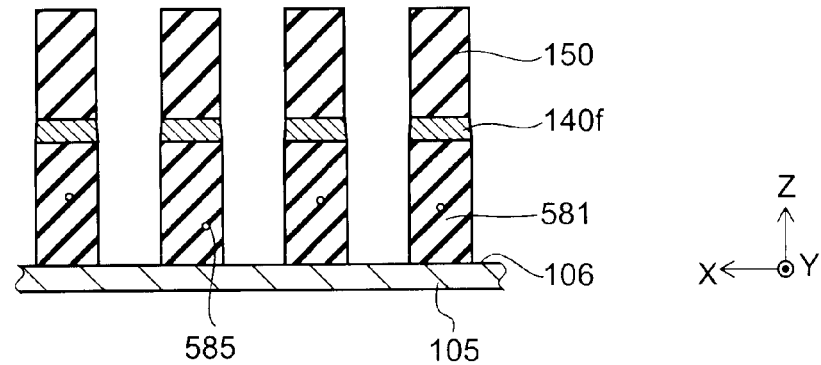
Figure 29A:
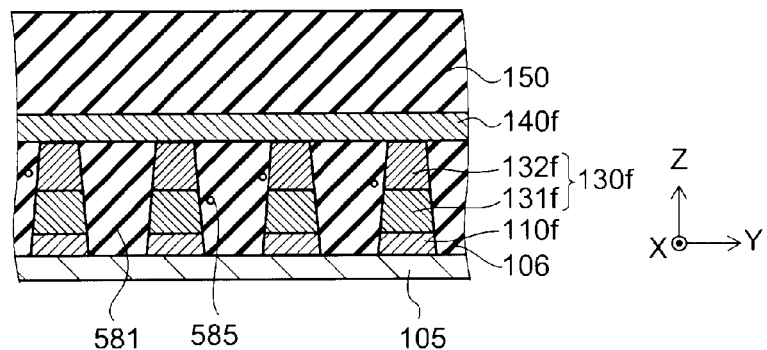
FIGS. 29A to 29D are schematic cross-sectional views in order of the processes, continuing from FIG. 28D.
Figure 29B:
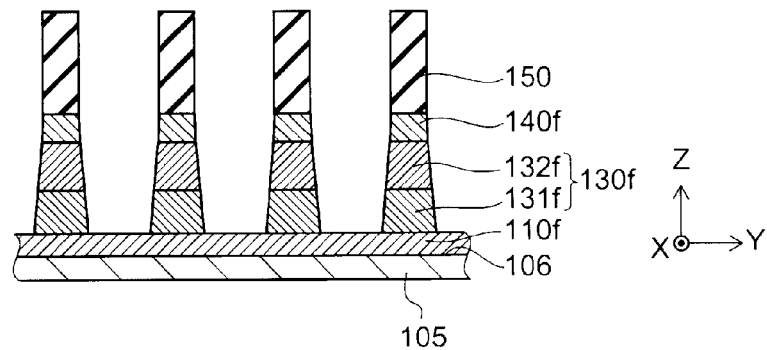
Figure 29C:
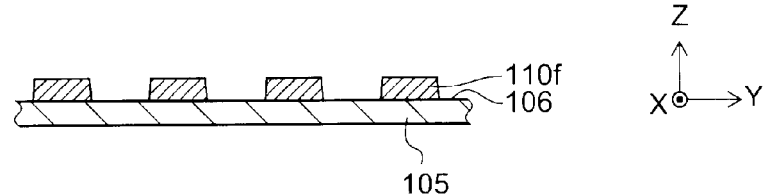
Figure 29D:
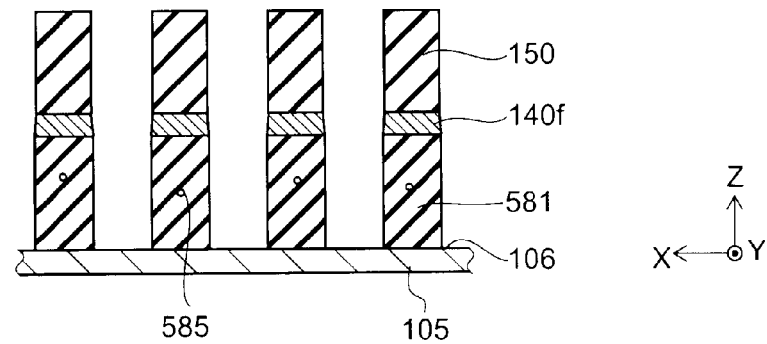

FIGS. 29A to 29D are schematic cross-sectional views in order of the processes, continuing from FIG. 28D.

Figure 30:
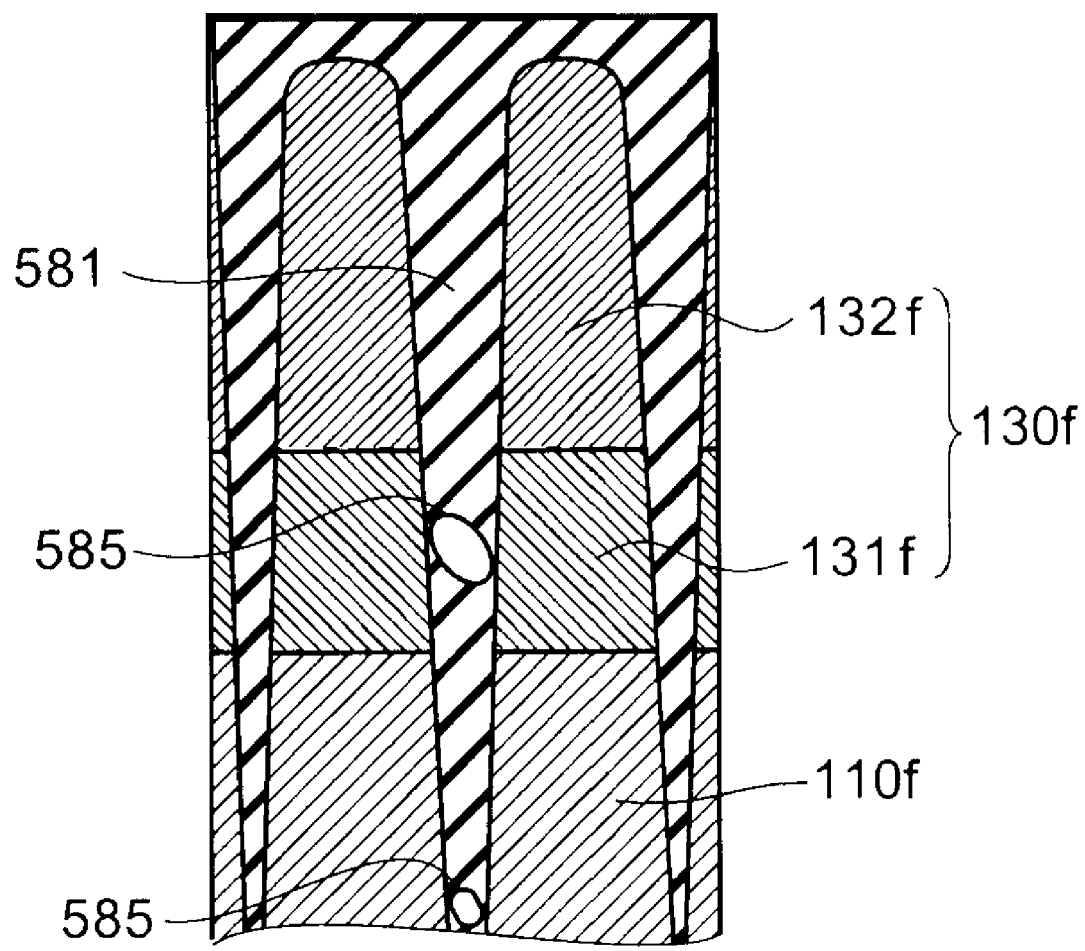
FIG. 30 is a schematic cross-sectional view illustrating a relevant part of the nonvolatile storage device in a process of the method for manufacturing a nonvolatile storage device according to the third embodiment of the invention.

FIG. 30 is a schematic cross-sectional view illustrating a relevant part of the nonvolatile storage device in a process of the method for manufacturing a nonvolatile storage device according to the third embodiment of the invention.

In FIGS. 23A to 29D, each drawing of the number including "A" is a cross-sectional view corresponding to line A-A' of FIG. 21B, each drawing of the number including "B" is a cross-sectional view corresponding to line B-B' of FIG. 21B, each drawing of the number including "C" is a cross-sectional view corresponding to line C-C' of FIG. 21B, and each drawing of the number including "D" is a cross-sectional view corresponding to line D-D' of FIG. 21B.

First, a nonvolatile storage device manufactured by the method for manufacturing a nonvolatile storage device according to the third embodiment of the invention will now be described with reference to FIGS. 21A and 21B and FIGS. 22A to 22D.

As illustrated in FIGS. 21A and 21B and FIGS. 22A to 22D, a nonvolatile storage device 50 manufactured by the method for manufacturing a nonvolatile storage device according to this embodiment includes: the plurality of first electrodes 110 aligning in the first direction; the plurality of second electrodes 140 aligning in the second direction nonparallel to the first direction and provided above the first electrodes 110; and the plurality of first storage units 130 each provided between each of the plurality of first electrodes 110 and each of the plurality of second electrodes 140 and each including a first storage layer 132 of which the resistance changes by at least one of an applied electric field and an applied current. The first electrodes 110 are provided on the major surface 106 of the substrate 105, for example.

The first direction and the second direction are nonparallel to each other, and for example, intersect three-dimensionally. In the following, a description is given by taking up the case where the first direction and the second direction are orthogonal to each other.

Here, the first direction is defined as the X-axis direction, and the second direction is defined as the Y-axis direction orthogonal to the X-axis direction. The direction orthogonal to the X-axis direction and the Y-axis direction is defined as the Z-axis direction. The major surface 106 of the substrate 105 is perpendicular to the Z-axis direction and parallel to the X-Y plane. The first electrode 110 aligns in the X-axis direction in a strip shape in a plane parallel to the X-Y plane. The second electrode 140 aligns in the Y-axis direction in a strip shape in a plane parallel to the X-Y plane.

The first electrode 110 and the second electrode 140 intersect three-dimensionally. The first storage unit 130 is provided between the first electrode 110 and the second electrode 140 to form the first memory cell 135. That is, the nonvolatile storage device 50 is a crosspoint nonvolatile storage device using a resistance change film.

The first electrode 110 serves as a bit line, and the second electrode 140 serves as a word line, for example. However, in the invention, the first electrode 110 and the second electrode 140 may be replaced with each other, and the first electrode 110 may serve as a word line and the second electrode 140 may serve as a bit line.

The first storage unit 130 includes the first storage layer 132. The first storage layer 132 is a layer of which the resistance changes by at least one of an applied electric field and an applied current. A resistance change material, a phase change material of which the resistance changes with phase change, and the like may be used for the first storage layer 132. Furthermore, a material in which various conductive films and/or various barrier films are stacked may be used for the layer of resistance change material or the layer of phase change material of the first storage layer 132.

For example, $NiO_x$, $TiO_x$, $CoO_x$, $TaO_x$, $MnO_x$, $WO_x$, $Al_2O_3$, $FeO_x$, $HfO_x$, $ZnMn_2O_4$, $ZnFe_2O_4$, $ZnCO_2O_4$, $ZnCr_2O_4$, $ZnAl_2O_4$, $CuCoO_2$, $CuAlO_2$, $NiWO_4$, $NiTiO_3$, $CoAl_2O_4$, $MnAl_2O_4$, $ZnNiTiO_4$, $Pr_xCa_{1-x}MnO_3$, and the like may be used for the first storage layer 132.

Furthermore, a material in which a dopant is added to the various kinds of compounds mentioned above may be used for the first storage layer 132.

However, the invention is not limited to the above, but any material may be used for the first storage layer 132.

The first storage unit 130 may further include the first rectifying element 131 such as a diode. Although the first rectifying element 131 is provided between the first electrode 110 and the first storage layer 132 in this specific example, the first rectifying element 131 may be provided between the second electrode 140 and the first storage layer 132. Various kinds of elements having rectifying function such as a PIN diode and a Schottky diode may be used for the first rectifying element 131. Furthermore, a material in which an element having rectifying function, various conductive films, and various barrier films are stacked may be used for the first rectifying element 131.

Thus, the first electrode 110, the first storage unit 130, and the second electrode 140 are stacked in the Z-axis direction in the nonvolatile storage device 50, and the nonvolatile storage device 50 includes a layer of memory cell array (the first memory cell array 101). However, nonvolatile storage devices manufactured by the method for manufacturing a nonvolatile storage device according to the embodiment of the invention may have a configuration in which a plurality of memory cell arrays are stacked in the Z-axis direction. In the following, first, a description is given by taking up the case where the nonvolatile storage device 50 includes one layer of memory cell array, for the sake of simplicity.

As illustrated in FIGS. 22A to 22D, an interlayer insulating film 580 (an insulating film) is buried around the first memory cell 135 formed between the first electrode 110 and the second electrode 140. The interlayer insulating film 580 includes a void 585 as described later. That is, the nonvolatile storage device 50 includes the interlayer insulating film 580 provided in at least one of between one pair of the plurality of first electrodes 110, between one pair of the plurality of second electrodes 140, and between one pair of the plurality of first storage units 130 and including the void 585. In the case where the nonvolatile storage device 50 includes the substrate 105, the interlayer insulating film 580 including the void 585 may be provided between the substrate 105 and one of the plurality of second electrodes 140. Silicon oxide, for example, may be used for the interlayer insulating film 580.

Furthermore, as described later, the first storage unit 130 may become in a tapered shape at the time of the processing of the first storage unit 130 (the first rectifying element 131 and the first storage layer 132). Specifically, the cross section of the first storage unit 130 when it is cut with a plane parallel to the X-Y plane may be large on the lower side (the substrate 105 side) and small on the upper side (the side opposite to the substrate 105).

In the specification and drawings of the application, for the sake of description, the taper of the first storage unit 130 is illustrated and described emphatically.

The method for manufacturing a nonvolatile storage device according to this embodiment does not cause a processing failure even when the first storage unit 130 has a tapered shape.

The method for manufacturing a nonvolatile storage device according to this embodiment will now be described with reference to FIG. 20 and FIG. 23A to FIG. 30.

First, as illustrated in FIGS. 23A to 23D, the first electrode film 110f that forms the first electrodes 110 and the first storage unit film 130f that forms the first storage units 130 are stacked on the major surface 106 of the substrate 105. The first storage unit film 130f is specifically a stacked film of the first rectifying element film 131f that forms the first rectifying elements 131 and the first storage layer film 132f that forms the first storage layers 132.

This process corresponds to step S510 illustrated in FIG. 20.

Then, as illustrated in FIGS. 23A to 23D, the first electrode film 110f and the first storage unit film 130f are processed into strip shapes aligning in the first direction (e.g. the X-axis direction). Here, the X-axis direction is assigned to the first direction.

This process corresponds to step S520 illustrated in FIG. 20.

That is, the first electrode film 110f and the first storage unit film 130f are processed by, for example, RIE (reactive ion etching) using a mask (not illustrated) of a silicon oxide film that is processed into strip shapes in the first direction in which the first electrode 110 aligns by photolithography.

At this time, as illustrated in FIGS. 23A to 23D, the first storage unit film 130f may be processed into tapered shapes.

That is, by processing the first electrode film 110f and the first storage unit film 130f into strip shapes aligning in the first direction, the width of the strip of the first storage unit film 130f on the first electrode film 110f side (that is, the length in a direction perpendicular to the first direction) becomes longer than the width of the strip on the side opposite to the first electrode film 110f (that is, the length in a direction perpendicular to the first direction).

Then, as illustrated in FIGS. 24A to 24D, a layer of a prescribed density 581 is buried between the processed first electrode films 110f and between the processed first storage unit films 130f.

This process corresponds to step S530 illustrated in FIG. 20.

The layer of a prescribed density 581 includes the void 585, for example.

The layer of a prescribed density 581 is formed by the following method, for example. Hydrophilization processing that hydrophilizes at least the side walls of the processed first electrode film 110f and the processed first storage unit film 130f is performed; a hydrophobic layer solution of a prescribed density that forms the layer of a prescribed density 581 is applied between the first electrode films 110f and between the first storage unit films 130f; and heating is performed. Thereby, the layer of a prescribed density 581 is buried between the first electrode films 110f and between the first storage unit films 130f.

In this specific example, a liner film (a thin film) made of, for example, $SiO_x$ is formed by, for example, ALD (atomic layer deposition) on the side walls and upper surfaces of the processed first electrode film 110f and the processed first storage unit film 130f, and then the hydrophilization processing that hydrophilizes the surface of the liner film is performed.

At least one of treatment with a mixed solution of choline and hydrogen peroxide solution and hot water treatment may be used for the hydrophization processing. An aqueous solution containing 1 to 10% choline and 1 to 10% hydrogen peroxide solution, for example, may be used as the mixed solution of choline and hydrogen peroxide solution. Hot water of approximately 70° C. to 85° C., for example, may be used for the hot water treatment.

After that, a layer solution of a prescribed density that forms the layer of a prescribed density 581 is applied between the first electrode films 110f and between the first storage unit films 130f, where at least the side walls of the first electrode film 110f and the first storage unit film 130f have been hydrophilized. A solution of hydrophobic polysilazane, for example, may be used as the layer solution of a prescribed density. Then, the polysilazane is heated to 400° C. or higher, for example, to generate silicon oxide. This silicon oxide forms the layer of a prescribed density 581.

At this time, as illustrated in FIG. 30, the void 585 is formed in the layer of a prescribed density 581. It is conceivable that the void 585 is formed by the following, for example. That is, the hydrophobic layer solution of a prescribed density is applied on the side walls of the first electrode film 110f and the first storage unit film 130f on which the hydrophilization processing has been performed, and the workpiece is heated in this state to be calcined; and consequently the void 585 is formed possibly by the interaction between the hydrophilized surface and the hydrophobic layer solution of a prescribed density at the interface of both. In this embodiment, it is sufficient that the void 585, for example, is generated in the layer of a prescribed density 581. Therefore, the formation of the liner film and the hydrophilization processing mentioned above are performed as necessary, and may be omitted.

After that, as illustrated in FIGS. 25A to 25D, the second electrode film 140f that forms the second electrodes 140 is formed above the first electrode film 110f and on the first storage unit film 130f and the layer of a prescribed density 581.

This process corresponds to step S540 illustrated in FIG. 20.

Then, as illustrated in FIGS. 26A to 26D, the mask layer 150 processed into the shape of the second electrodes 140 by photolithography is formed.

This process corresponds to step S550 illustrated in FIG. 20.

A film having a higher density than the layer of a prescribed density 581 is used for the mask layer 150. That is, in the case where, for example, a silicon oxide film including the void 585 is used as the layer of a prescribed density 581, a silicon oxide film, for example, that is dense and includes no void is used for the mask layer 150.

Then, the second electrode film 140f is processed into strip shapes aligning in the second direction by using the mask layer 150 as a mask. RIE, for example, is used for this processing.

This process corresponds to step S560 illustrated in FIG. 20.

Then, as illustrated in FIGS. 27A to 27D, the portion of the first storage unit film 130f exposed from the layer of a prescribed density 581 is processed into columnar shapes by using the mask layer 150 as a mask. The columnar shape is a shape that includes a side wall along the first direction (the X-axis direction) and a side wall along the second direction (the Y-axis direction).

This process corresponds to step S570 illustrated in FIG. 20.

That is, since the first storage unit film 130f has been processed into a strip shape that includes a side wall along the first direction (the X-axis direction) in step S520 described above, the first storage unit film 130f is processed so as to include a side wall along the second direction (the Y-axis direction) in step S570 into columnar shapes.

In this specific example, the case where the side wall along the second direction of the first storage unit film 130f also includes a taper is illustrated.

At this time, as illustrated in FIG. 27C, the first storage unit film 130f has a tapered shape in the cross section taken along line C-C' of FIG. 21B, and the first storage unit film 130f is covered with the layer of a prescribed density 581 in this portion. Therefore, the portion where the first storage unit film 130f is covered with the layer of a prescribed density 581 is left without being etched.

Then, as illustrated in FIGS. 28A to 28D, the layer of a prescribed density 581 is removed to expose the first storage unit film 130f that has been covered with the layer of a prescribed density 581.

This process corresponds to step S571 illustrated in FIG. 20.

In the case where silicon oxide including the void 585 is used as the layer of a prescribed density 581, the layer of a prescribed density 581 can be removed by treatment with dilute hydrofluoric acid. The layer of a prescribed density 581 can be removed by using hydrofluoric acid of 3%, for example, as the dilute hydrofluoric acid and performing treatment of approximately 120 seconds, for example.

At this time, since silicon oxide having a lower density than the mask layer 150 (for example, dense silicon oxide) and including the void 585 is used as the layer of a prescribed density 581, the layer of a prescribed density 581 can be removed without damaging the mask layer 150 substantially.

Then, as illustrated in FIGS. 29A to 29D, the exposed first storage unit film 130f is removed.

This process corresponds to step S572 illustrated in FIG. 20.

After that, for example, the mask layer 150 is removed, and then silicon oxide that forms at least part of the interlayer insulating film 580 is buried between the first electrode films 110f, between the first storage unit films 130f, and between the second electrode films 140f by a method such as CVD and SOG (spin on glass). Thereby, the nonvolatile storage device 50 illustrated in FIGS. 21A and 21B and FIGS. 22A to 22D can be formed.

At this time, in step S571, it is sufficient that the portion of the layer of a prescribed density 581 covering the first storage unit film 130f having a tapered shape is removed, and it is not necessary to remove the entire layer of a prescribed density 581. Accordingly, the layer of a prescribed density 581 may be left in the portion on the lower side (the substrate 105 side) of the second electrode film 140f, for example. In this case, the interlayer insulating film 580 includes the layer of a prescribed density 581. That is, the interlayer insulating film 580 includes the void 585.

Comparative Example

FIGS. 31A to 31D are schematic cross-sectional views in order of the processes, illustrating a method for manufacturing a nonvolatile storage device of a comparative example.

Figure 31A:
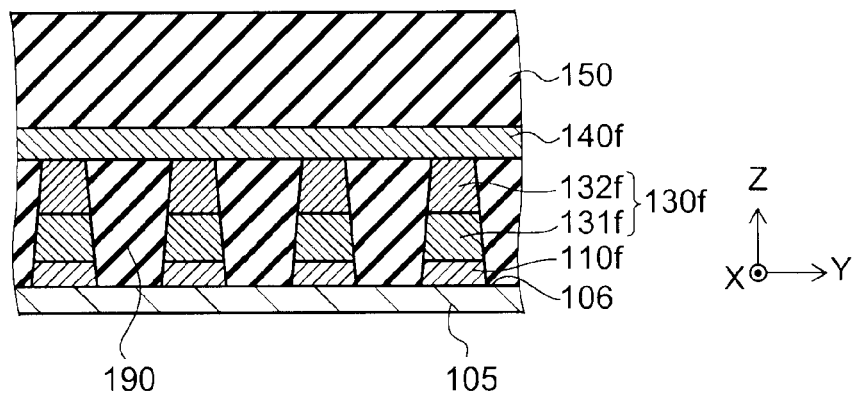
FIGS. 31A to 31D are schematic cross-sectional views in order of the processes, illustrating a method for manufacturing a nonvolatile storage device of a comparative example.
Figure 31B:
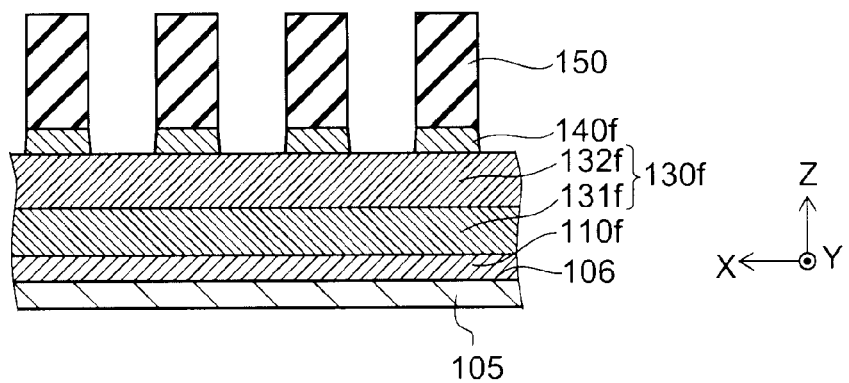
Figure 31C:
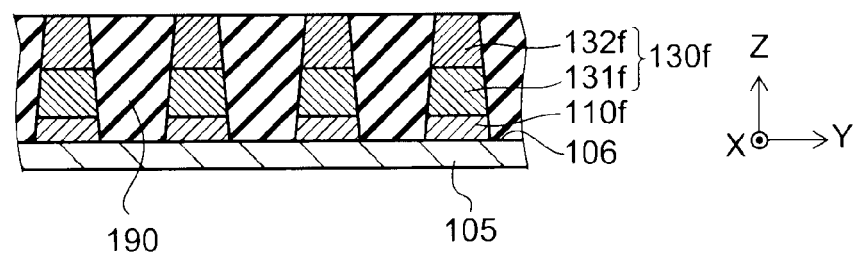
Figure 31D:
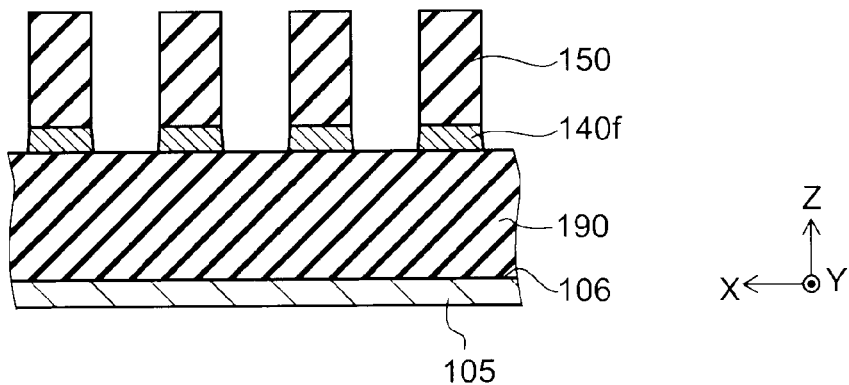

FIGS. 32A to 32D are schematic cross-sectional views in order of the processes, continuing from FIG. 31D.

Figure 32A:
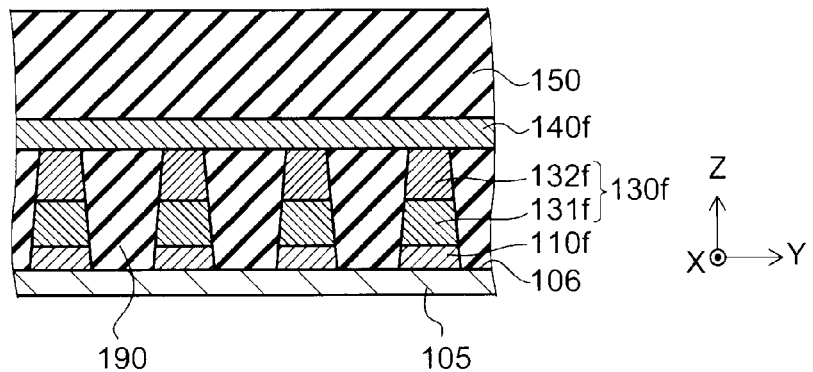
FIGS. 32A to 32D are schematic cross-sectional views in order of the processes, continuing from FIG. 31D.
Figure 32B:
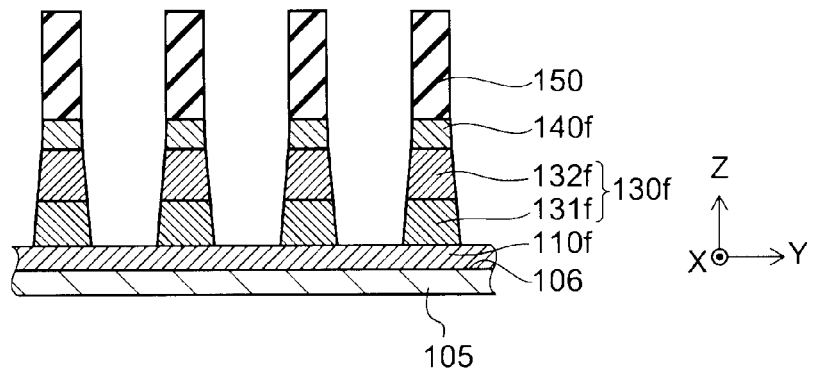
Figure 32C:
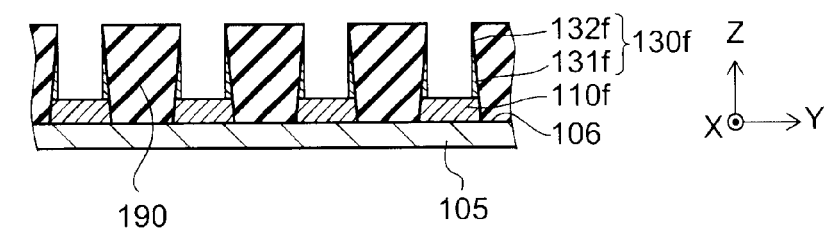
Figure 32D:
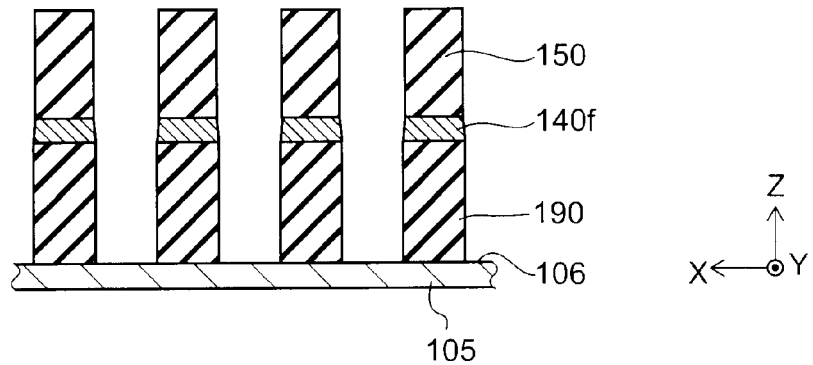

FIGS. 33A to 33D are schematic cross-sectional views in order of the processes, continuing from FIG. 32D.

FIGS. 31A to 31D are drawings compared with FIGS. 26A to 26D according to this embodiment, FIGS. 32A to 32D are drawings compared with FIGS. 27A to 27D according to this embodiment, and FIGS. 33A to 33D are drawings compared with FIGS. 28A to 28D according to this embodiment.

As illustrated in FIGS. 31A to 31D, in the method for manufacturing a nonvolatile storage device of the comparative example, the first electrode film 110f and the first storage unit film 130f are stacked on the substrate 105 (step S510); the first electrode film 110f and the first storage unit film 130f are processed into strip shapes aligning in the first direction (step S520); and then the interlayer insulating film 190 made of silicon oxide is buried between the first electrode films 110f and between the first storage unit films 130f.

Then, the second electrode film 140f that forms the second electrodes 140 is formed (step S540), the mask layer 150 is formed (step S550), and the second electrode film 140f is processed into strip shapes aligning in the second direction by using the mask layer 150 as a mask (step S560). Silicon oxide is used also for the mask layer 150 as in the case of the interlayer insulating film 190.

That is, in step S530 in the manufacturing method according to this embodiment, the layer of a prescribed density 581 (for example, silicon oxide including the void 585) having a lower density than the mask layer 150 (for example, silicon oxide) is buried between the first electrode films 110f and between the first storage unit films 130f; but in the case of the manufacturing method of the comparative example, the interlayer insulating film 190 (for example, silicon oxide) having the same density as the mask layer 150 is used.

Furthermore, in the case of the comparative example, the portion of the first storage unit film 130f exposed from the interlayer insulating film 190 is processed into columnar shapes as illustrated in FIGS. 32A to 32D (step S571); and when it is attempted to remove the interlayer insulating film 190, a selection ratio of etching cannot be ensured between the interlayer insulating film 190 and the mask layer 150, and therefore the film thickness of the mask layer 150 becomes thin by the etching for removing the interlayer insulating film 190, as illustrated in FIGS. 33A to 33D. Furthermore, the line width of the mask layer 150 becomes narrow.

That is, for example, if it is attempted to remove the interlayer insulating film 190 (a silicon oxide film) by dry etching, the film thickness of the mask layer 150 (a silicon oxide film) decreases significantly, leading to an insufficient film thickness for the mask for subsequent dry etching.

On the other hand, in the case where it is attempted to remove the interlayer insulating film 190 by using a chemical solution such as dilute hydrofluoric acid, since it is etched isotropically, the mask dimension becomes small due to the recession of the mask layer 150 in the horizontal direction. Furthermore, since the silicon oxide film under the extraction line portion for contact located in the wiring end portion also is removed, no support member exists under the extraction line portion, and therefore the problem that the device collapses due to surface tension at the time of drying the chemical solution and the like occurs.

Thus, in the case of the comparative example, the mask layer 150 is damaged in the process of removing the interlayer insulating film 190.

Furthermore, in the case of the comparative example, the interlayer insulating film 190 is removed insufficiently if it is attempted to maintain the shape of the mask layer 150 to some extent.

Figure 33A:
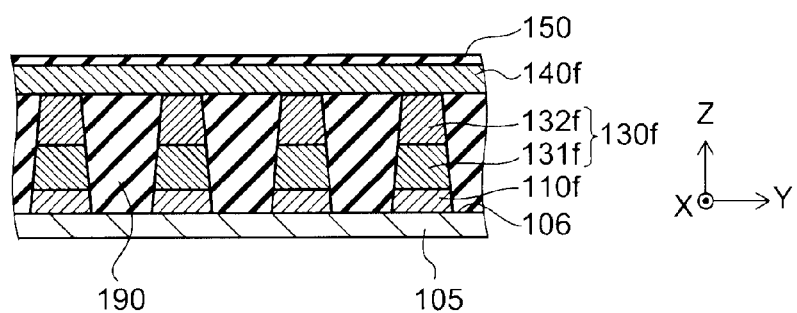
FIGS. 33A to 33D are schematic cross-sectional views in order of the processes, continuing from FIG. 32D.
Figure 33B:
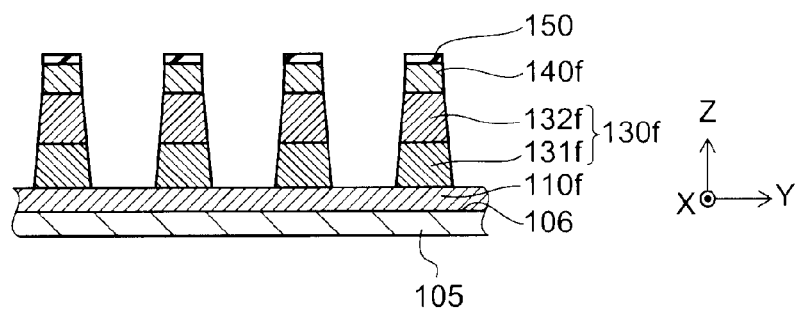
Figure 33C:
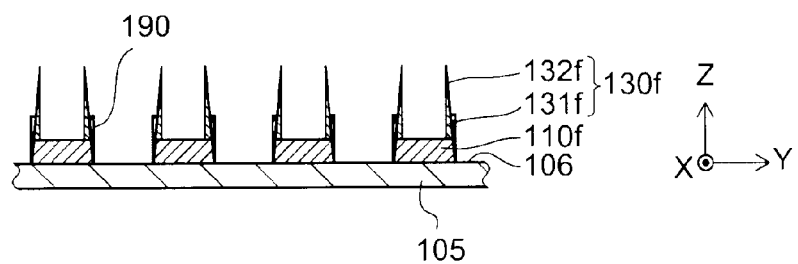
Figure 33D:
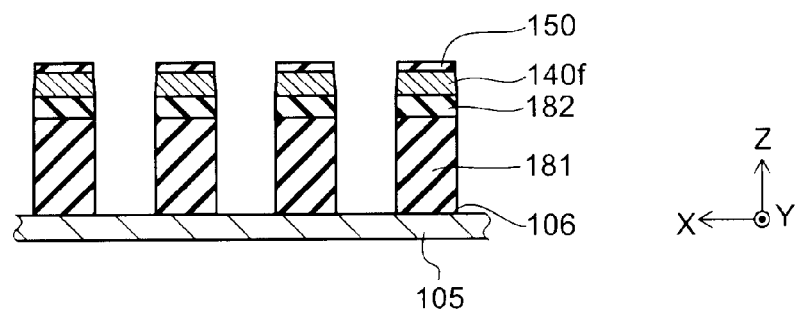

Accordingly, as illustrated in FIG. 33C, the first storage unit film 130f covered with the remaining interlayer insulating film 190 is not removed but left in subsequent processes, and this causes a short between the second electrodes 140, for example.

In contrast, in the method for manufacturing a nonvolatile storage device according to this embodiment, by using the layer of a prescribed density 581 having a lower density than the mask layer 150, damage to the mask layer 150 can be suppressed at the time of removing the layer of a prescribed density 581, and the layer of a prescribed density 581 that covers the first storage unit film 130f in the regions exposed from the mask layer 150 can be removed substantially completely. Thereby, also in the case of a configuration in which the first storage unit film 130f is processed into tapered shapes and the tapered portions of the first storage unit film 130f are covered with the layer of a prescribed density 581, the layer of a prescribed density 581 can be removed completely to expose the first storage unit film 130f, and the first storage unit film 130f remaining under the shade of the layer of a prescribed density 581 can be removed.

Thus, the method for manufacturing a nonvolatile storage device according to this embodiment provides a method for manufacturing a nonvolatile storage device that reduces the processing failure of the storage unit between wirings and achieves a high yield.

In the above, a description is given by taking up the case where the first storage unit film 130f has a tapered shape in order to facilitate the description of effects of this embodiment. However, also in the case where the side wall of the first storage unit film 130f is substantially perpendicular to the X-Y plane, using the manufacturing method according to this embodiment can enlarge the margin of the processing process, and the processing failure of the storage unit between wirings can be reduced and the yield can be increased also in this case.

In the method for manufacturing a nonvolatile storage device according to this embodiment, it is sufficient that the mask layer 150 has a higher density than the layer of a prescribed density 581.

For example, in the case where silicon oxide including the void 585 is used for the layer of a prescribed density 581, at least one selected from a group consisting of dense silicon oxide, silicon nitride, silicon oxynitride, and silicon carbide that include no void may be used for the mask layer 150.

Thus, the nonvolatile storage device 50 manufactured in this embodiment includes the interlayer insulating film 580 provided at least one of between a pair of the plurality of first electrodes 110, between a pair of the plurality of second electrodes 140, and between a pair of the plurality of first storage units 130 and including the void 585; thereby, a nonvolatile storage device that reduces the processing failure of the storage unit between wirings and achieves a high yield can be provided.

Fourth Embodiment

A method for manufacturing a nonvolatile storage device according to a fourth embodiment of the invention is used for a nonvolatile storage device in which a plurality of memory cell arrays are stacked.

Figure 34:
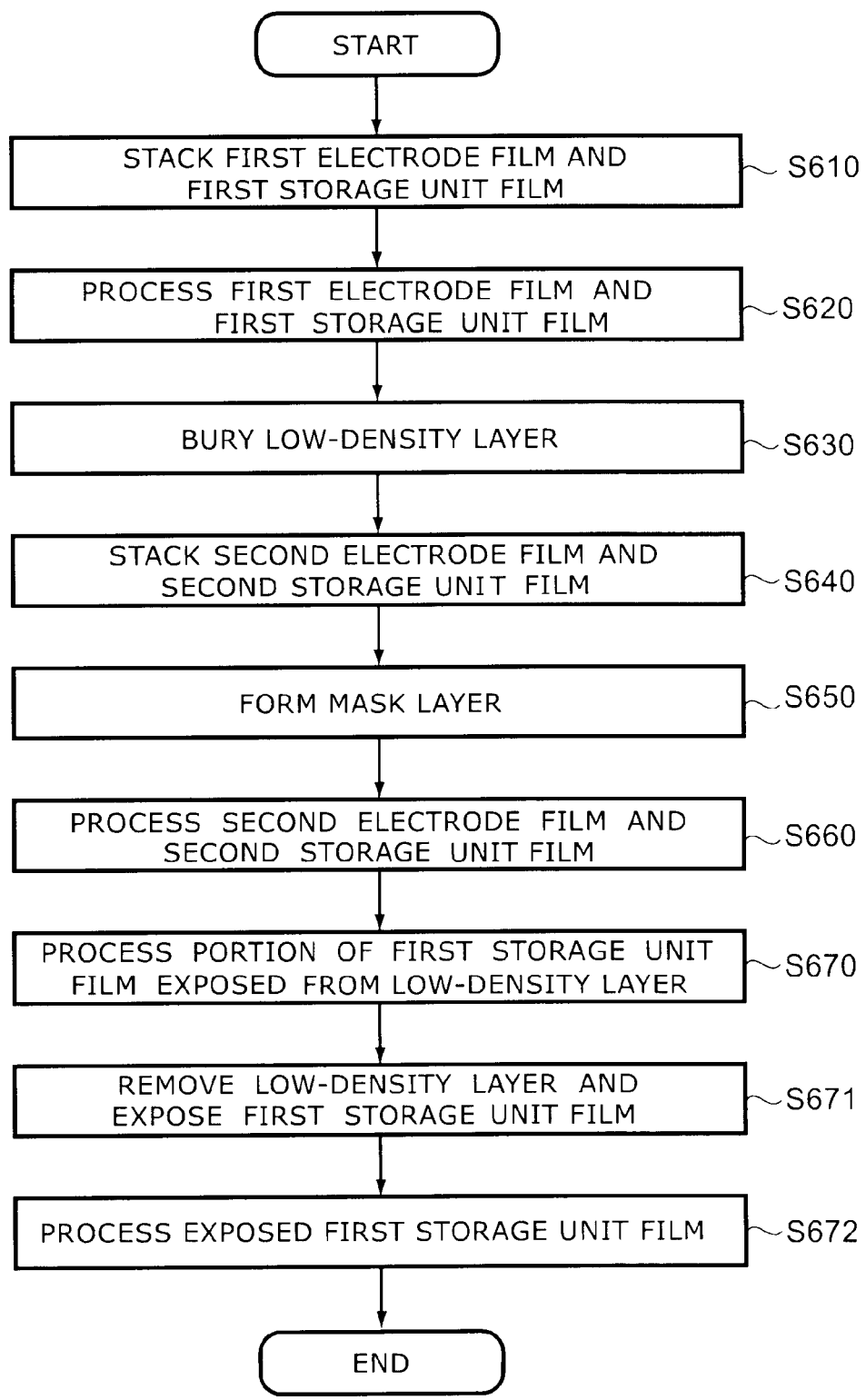
FIG. 34 is a flow chart illustrating a method for manufacturing a nonvolatile storage device according to a fourth embodiment of the invention.

FIG. 34 is a flow chart illustrating a method for manufacturing a nonvolatile storage device according to the fourth embodiment of the invention.

Figure 35A:
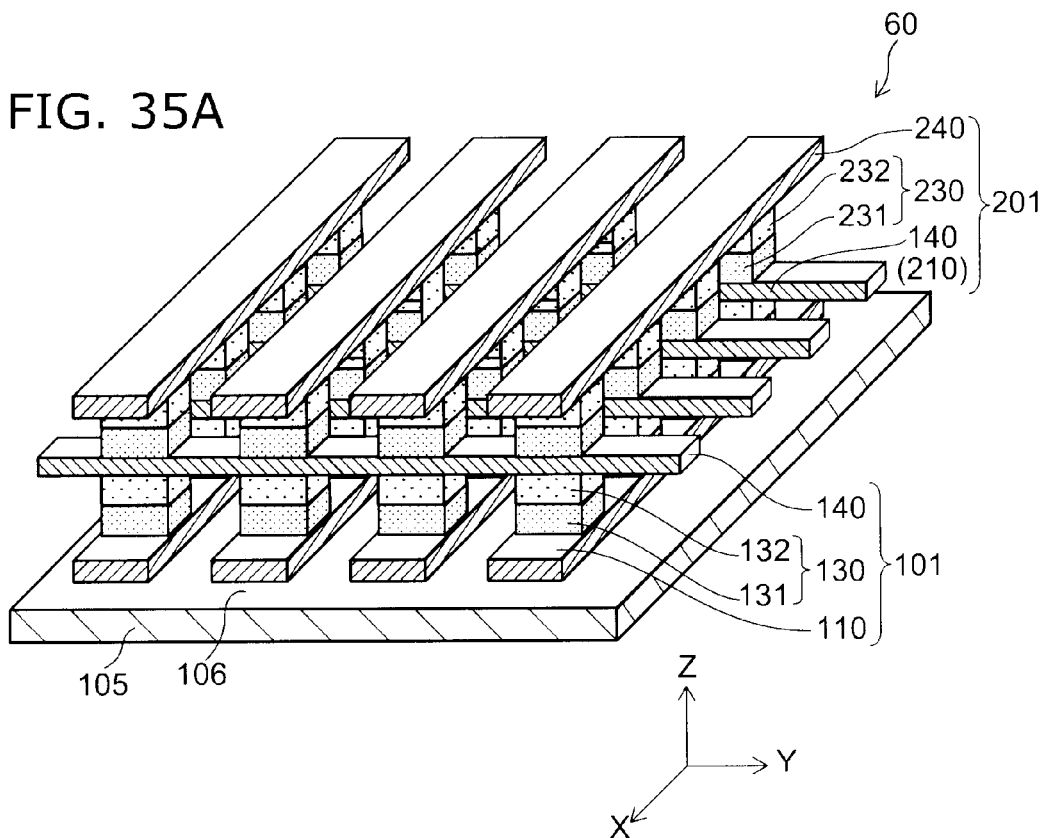
FIGS. 35A and 35B are schematic views illustrating the configuration of a nonvolatile storage device manufactured by the method for manufacturing a nonvolatile storage device according to the fourth embodiment of the invention.
Figure 35B:
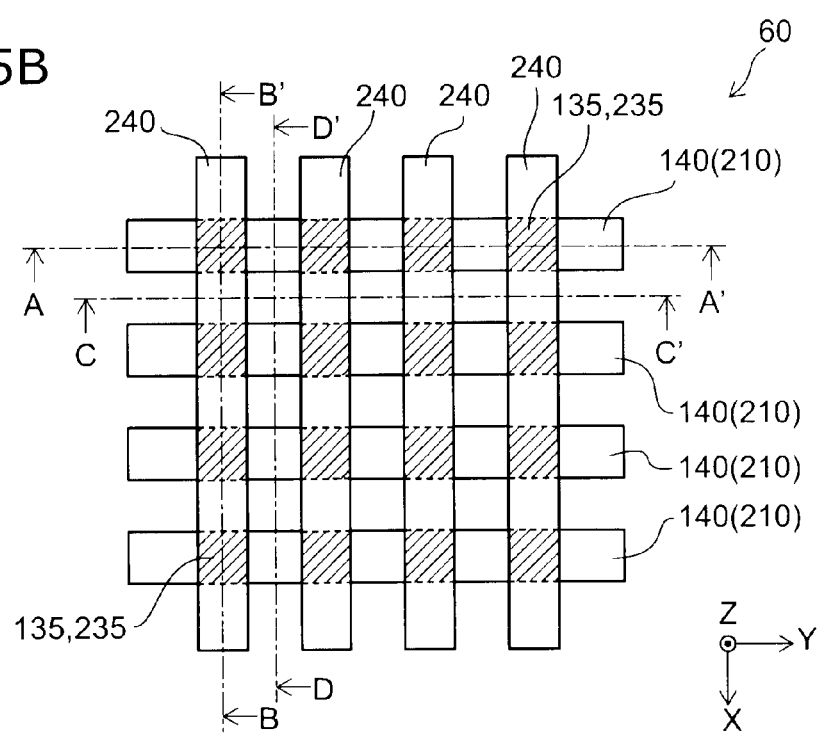

FIGS. 35A and 35B are schematic views illustrating the configuration of a nonvolatile storage device manufactured by the method for manufacturing a nonvolatile storage device according to the fourth embodiment of the invention.

Specifically, FIG. 35A is a perspective view, and FIG. 35B is a plan view.

FIGS. 36A to 36D are schematic cross-sectional views illustrating the configuration of the nonvolatile storage device manufactured by the method for manufacturing a nonvolatile storage device according to the fourth embodiment of the invention.

Figure 36A:
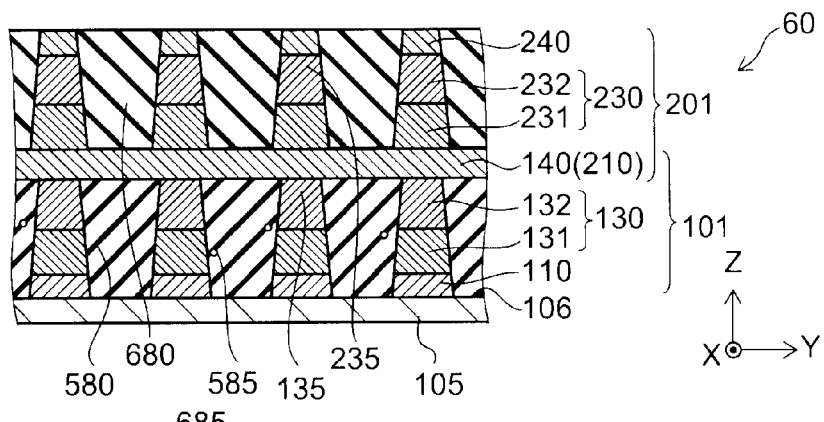
FIGS. 36A to 36D are schematic cross-sectional views illustrating the configuration of the nonvolatile storage device manufactured by the method for manufacturing a nonvolatile storage device according to the fourth embodiment of the invention.
Figure 36B:
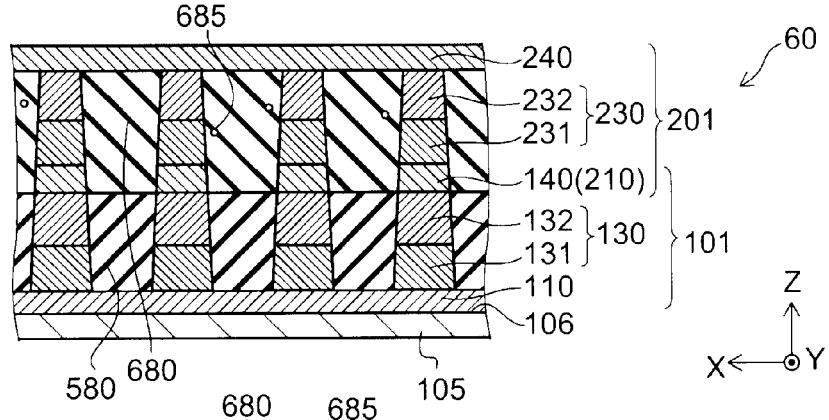
Figure 36C:
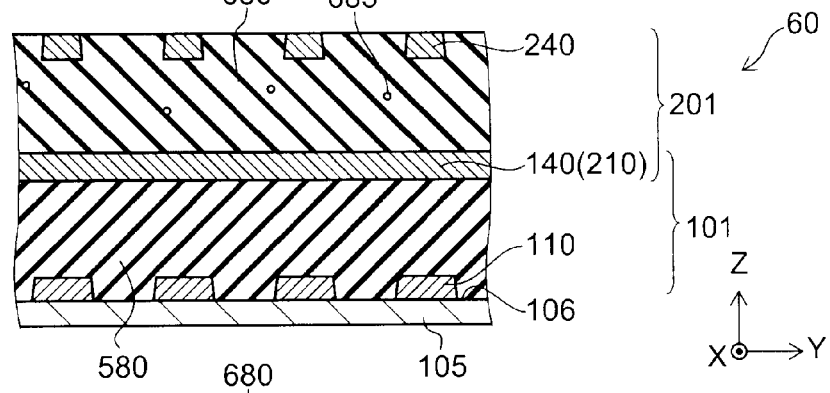
Figure 36D:
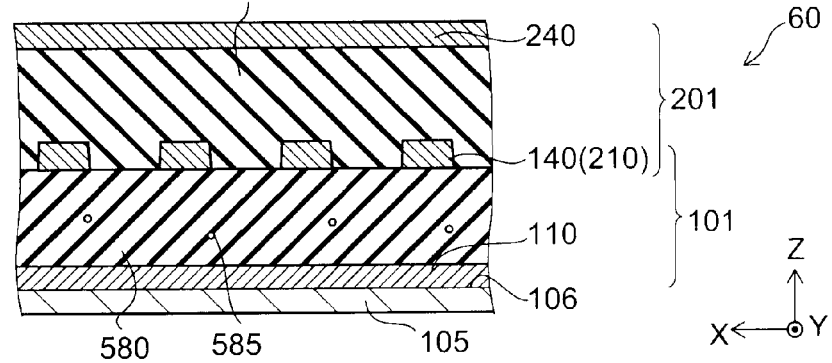

Specifically, FIG. 36A is a cross-sectional view taken along line A-A' of FIG. 35B, FIG. 36B is a cross-sectional view taken along line B-B' of FIG. 35B, FIG. 36C is a cross-sectional view taken along line C-C' of FIG. 35B, and FIG. 36D is a cross-sectional view taken along line D-D' of FIG. 35B.

FIGS. 37A to 37D are schematic cross-sectional views in order of the processes, illustrating the method for manufacturing a nonvolatile storage device according to the fourth embodiment of the invention.

Figure 37A:
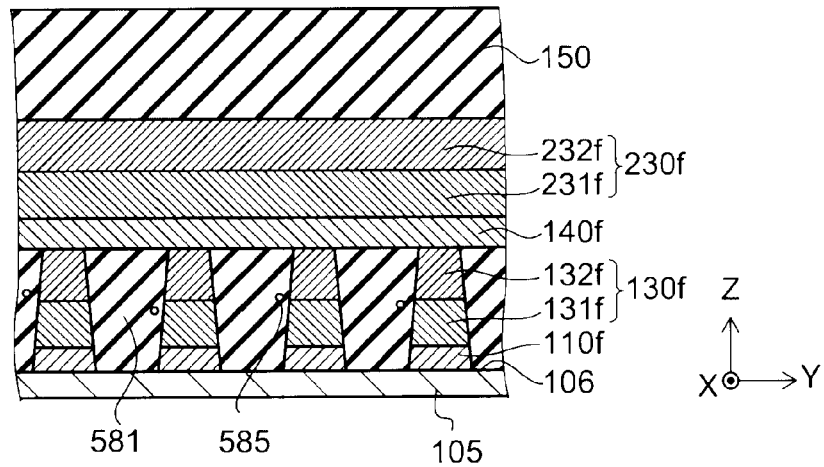
FIGS. 37A to 37D are schematic cross-sectional views in order of the processes, illustrating the method for manufacturing a nonvolatile storage device according to the fourth embodiment of the invention.
Figure 37B:
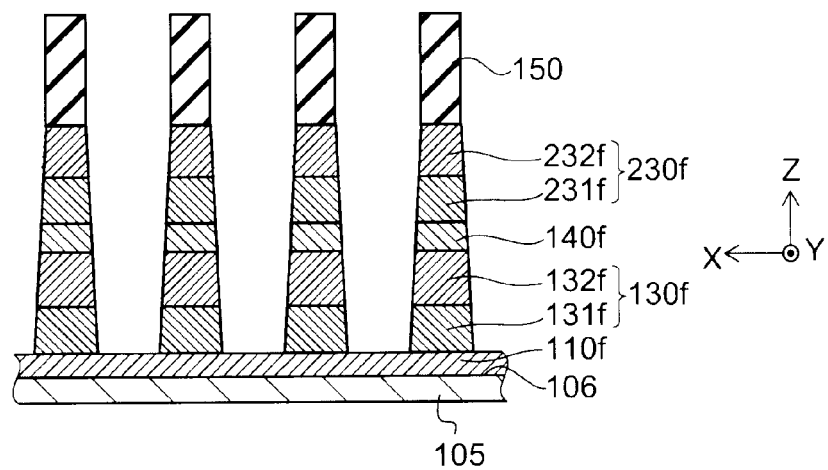
Figure 37C:
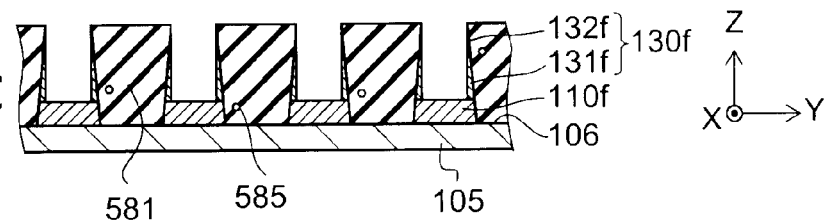
Figure 37D:
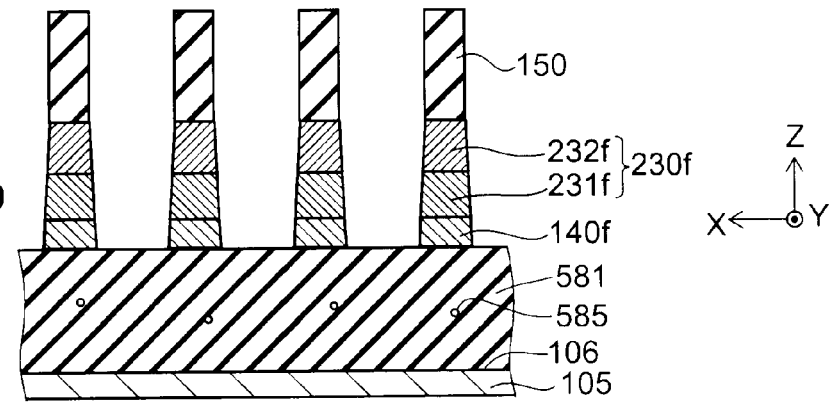
Figure 38A:
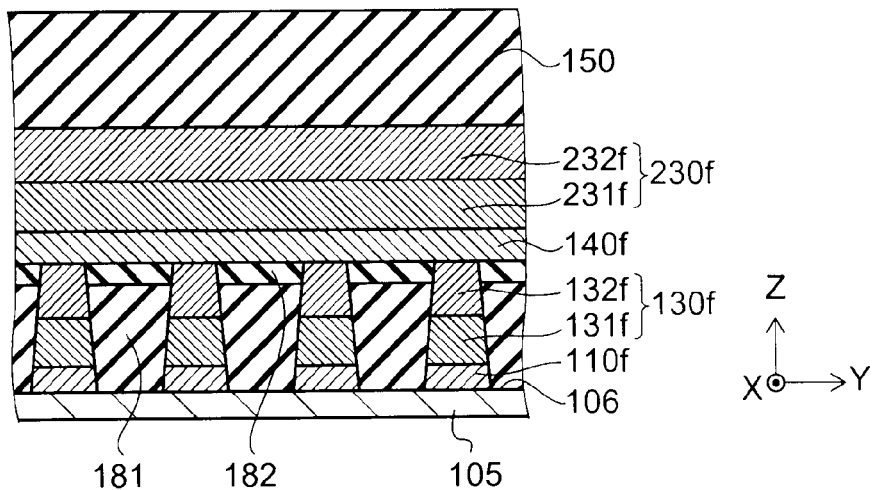
FIGS. 38A to 38D are schematic cross-sectional views in order of the processes, continuing from FIG. 37D.
Figure 38B:
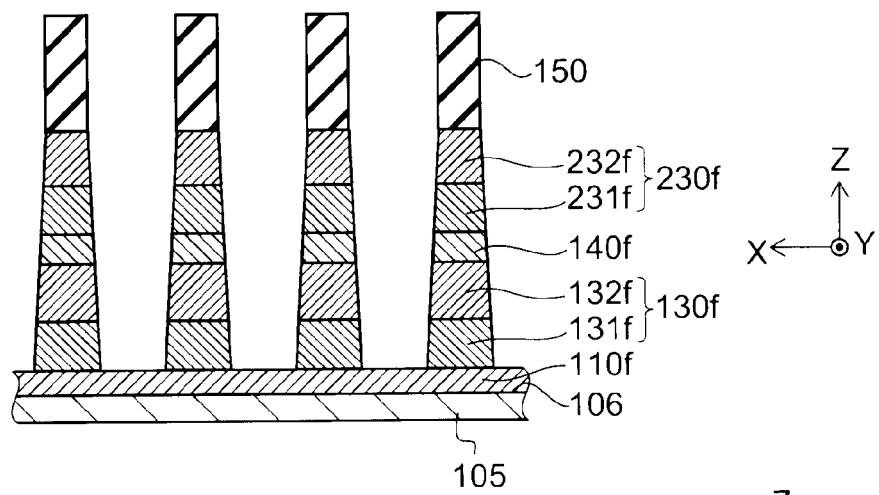
Figure 38C:
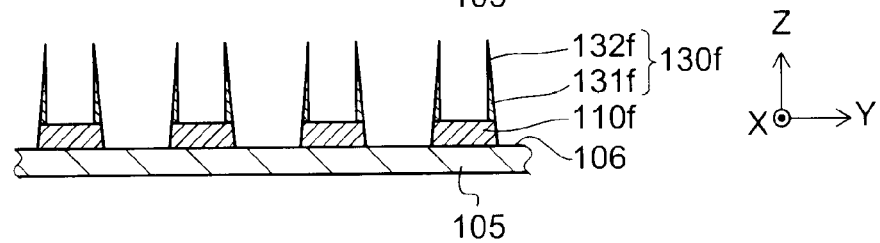
Figure 38D:
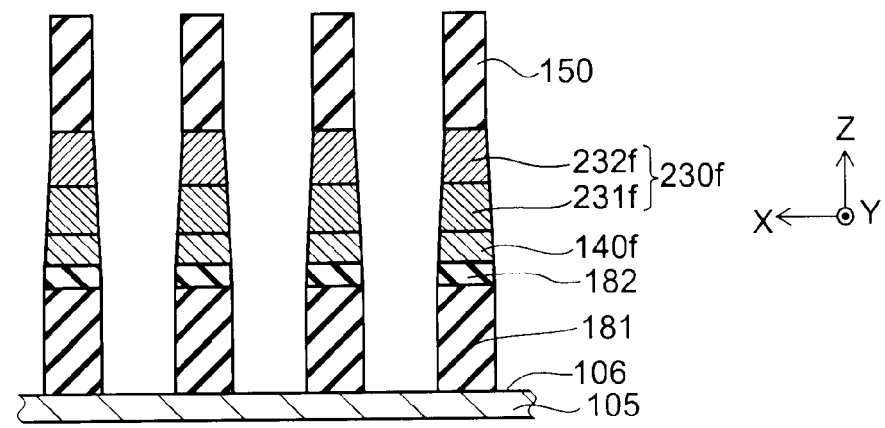

FIGS. 38A to 38D are schematic cross-sectional views in order of the processes, continuing from FIG. 37D.

As illustrated in FIGS. 35A and 35B and FIGS. 36A to 36D, a plurality of memory cell arrays are provided to be stacked in the Z-axis direction in a nonvolatile storage device 60 manufactured by the manufacturing method according to the fourth embodiment. The first memory cell array 101 may be similar to that described in regard to the first embodiment, and a description is therefore omitted.

In the nonvolatile storage device 60, the second memory cell array 201 is stacked on the first memory cell array 101 in the Z-axis direction.

The second memory cell array 201 includes the second electrode 140, the third electrode 240, and the second storage unit 230 provided between the second electrode 140 and the third electrode 240. The second electrode 140 in the second memory cell array 201 functions also as the second electrode 140 in the first memory cell array 101. The second electrode 140 is a word line, for example, and the third electrode 240 is a bit line, for example.

The second storage unit 230 includes the second storage layer 232. The second storage layer 232 is a layer of which the resistance changes by at least one of an applied electric field and an applied current.

The second storage unit 230 may further include the second rectifying element 231. Although the second rectifying element 231 is provided between the second electrode 140 and the second storage layer 232 in this specific example, the second rectifying element 231 may be provided between the third electrode 240 and the second storage layer 232, and the stacking order is arbitrary.

The configuration and material described in regard to the first storage unit 130, the first storage layer 132, the first rectifying element 131, and the first electrode 110 (or the second electrode 140) may be used for the second storage unit 230, the second storage layer 232, the second rectifying element 231, and the third electrode 240, and a description is therefore omitted.

As illustrated in FIGS. 36A to 36D, an interlayer insulating film of the second layer 680 (an insulating film) made of silicon oxide or the like is buried around the second memory cell 235 formed between the second electrode 140 and the third electrode 240.

The interlayer insulating film of the second layer 680 also may include a void 685. That is, the nonvolatile storage device 60 may be provided at least one of between a pair of the plurality of second electrodes 140, between a pair of the plurality of third electrodes 240, and between a pair of the plurality of second storage units 230, and may include the interlayer insulating film of the second layer 680 including the void 685. Silicon oxide, for example, may be used for the interlayer insulating film of the second layer 680. However, in the nonvolatile storage device 60, at least one of the interlayer insulating film of the first layer 580 and the interlayer insulating film of the second layer 680 may include the void.

A method for manufacturing the nonvolatile storage device 60 having such a configuration will now be described with reference to FIG. 34 and FIG. 37A to FIG. 38D.

First, as illustrated in FIGS. 37A to 37D, the first electrode film 110f that forms the first electrodes 110 and the first storage unit film 130f that forms the first storage units 130 are stacked on the major surface 106 of the substrate 105 (step S610 illustrated in FIG. 34). Then, the first electrode film 110f and the first storage unit film 130f are processed into strip shapes aligning in the first direction (step S620). At this time, the first storage unit film 130f may be processed into tapered shapes.

Then, the layer of a prescribed density 581 is buried between the processed first electrode films 110f and between the processed first storage unit films 130f (step S630). Silicon oxide formed from polysilazane and including the void 585, for example, is used as the layer of a prescribed density 581.

Then, the second electrode film 140f that forms the second electrodes 140 and the second storage unit film 230f that forms the second storage units 230 are stacked on the first storage unit film 130f and the layer of a prescribed density 581 (step S640). The second storage unit film 230f includes the second rectifying element film 231f that forms the second rectifying elements 231 and the second storage layer film 232f that forms the second storage layers 232, for example.

Then, the mask layer 150 having a higher density than the layer of a prescribed density 581 is formed on the second storage unit film 230f (step S650). Dense silicon oxide including no void, for example, is used as the mask layer 150.

Then, the second electrode film 140f and the second storage unit film 230f are processed into strip shapes aligning in the second direction by using the mask layer 150 as a mask (step S660). Then, the portion of the first storage unit film 130f exposed from the layer of a prescribed density 581 is processed into columnar shapes including a side wall along the first direction and a side wall along the second direction by using the mask layer 150 as a mask (step S670).

At this time, as illustrated in FIG. 37C, the first storage unit film 130f has a tapered shape in the cross section taken along line C-C' of FIG. 35B, and the first storage unit film 130f is covered with the layer of a prescribed density 581 in this portion. Therefore, the portion where the first storage unit film 130f is covered with the layer of a prescribed density 581 is left without being etched.

Then, as illustrated in FIGS. 38A to 38D, the layer of a prescribed density 581 is removed to expose the first storage unit film 130f that has been covered with the layer of a prescribed density 581 (step S671).

In the case where silicon oxide including the void 585 is used as the layer of a prescribed density 581, the layer of a prescribed density 581 can be removed by treatment with dilute hydrofluoric acid, for example.

At this time, since silicon oxide including the void 585, for example, which has a lower density than the mask layer 150 (e.g. silicon oxide) is used as the layer of a prescribed density 581, the layer of a prescribed density 581 can be removed without damaging the mask layer 150 substantially.

Then, the exposed first storage unit film 130f is removed (step S672).

After that, for example, the mask layer 150 is removed, and silicon oxide that forms the interlayer insulating film of the first layer 580 is buried between the first electrode films 110f, between the first storage unit films 130f, and between the second electrode films 140f by a method such as CVD and SOG.

Thereby, the memory cell array 101 of the first layer can be formed.

At this time, the interlayer insulating film of the first layer 580 is provided at depths from the substrate 105 to the second electrode 140, for example; a layer of a prescribed density of the second layer including the void 685, for example, is formed on the upper side thereof; then, the third electrode film that forms the third electrodes 240 is formed on the second storage unit film 230f and the layer of a prescribed density of the second layer; the third electrode film is processed and the second storage unit film 230f is processed into columnar shapes in the same manner as the memory cell array 101 of the first layer; and then the second interlayer insulating film 280 is buried. Thereby, the nonvolatile storage device 60 illustrated in FIGS. 35A and 35B and FIGS. 36A to 36D can be manufactured.

Thus, the manufacturing method according to this embodiment can manufacture the nonvolatile storage device 60 in which two memory cell arrays are stacked and the second electrode 140 is shared between the first layer and the second layer, and can reduce the processing failure of the storage unit between wirings and improve the yield also in this case.

Although the case where two memory cell arrays are stacked is described in the above, the method for manufacturing a nonvolatile storage device according to this embodiment can be used for a nonvolatile storage device in which any numbers of memory cell arrays are stacked.

Figure 39:
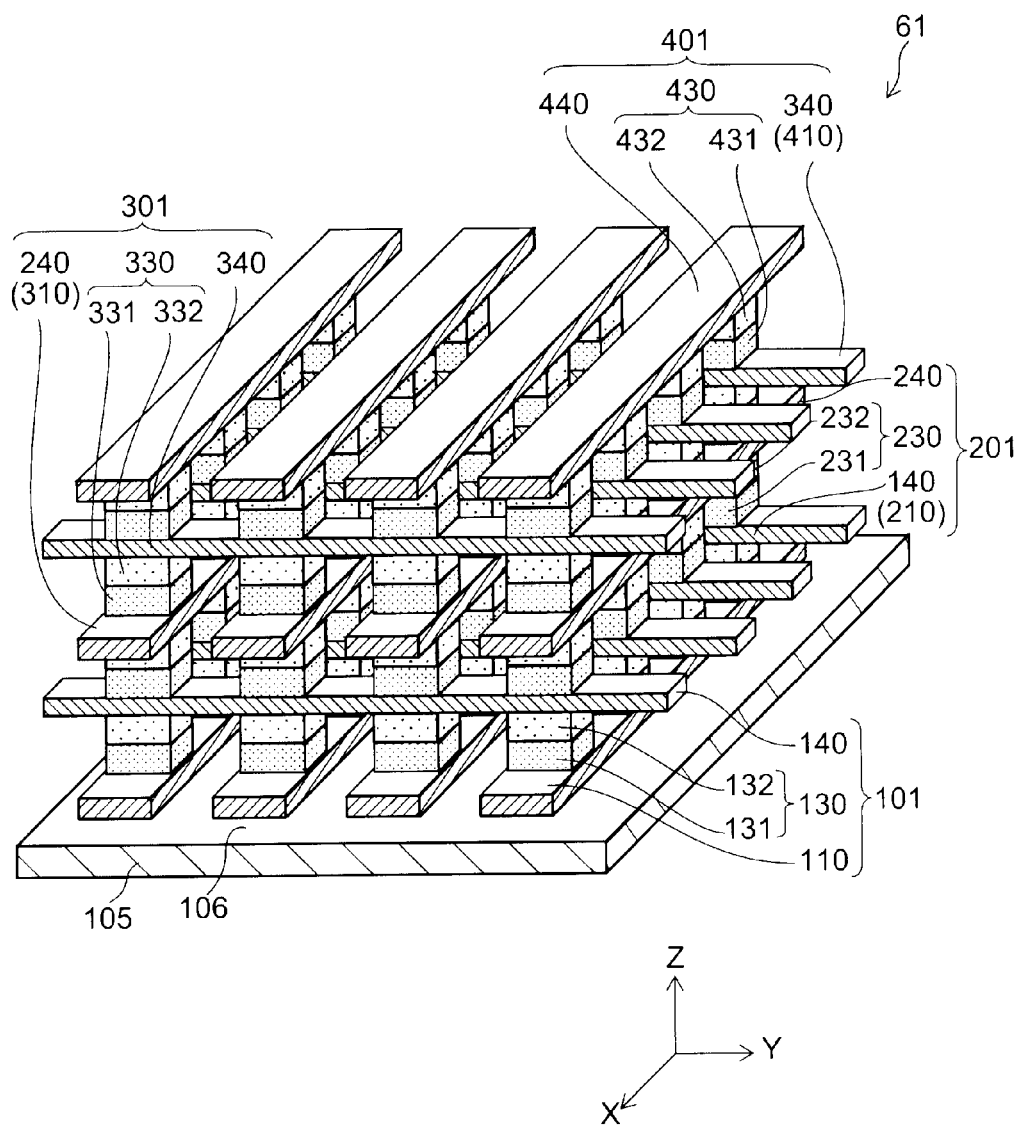
FIG. 39 is a schematic perspective view illustrating the configuration of another nonvolatile storage device manufactured by the method for manufacturing a nonvolatile storage device according to the fourth embodiment of the invention.

FIG. 39 is a schematic perspective view illustrating the configuration of another nonvolatile storage device manufactured by the method for manufacturing a nonvolatile storage device according to the fourth embodiment of the invention.

As illustrated in FIG. 39, four memory cell arrays are stacked in another nonvolatile storage device 61 manufactured by the manufacturing method according to this embodiment. That is, the nonvolatile storage device 61 includes the first to fourth memory cell arrays 101, 201, 301, and 401. The configuration of each of the memory cells array is similar to the nonvolatile storage devices 50 and 60.

That is, the third memory cell array 301 includes the third electrodes 240, the fourth electrodes 340, and the third storage unit 330 provided between the third electrode 240 and the fourth electrode 340. The third storage unit 330 includes the third storage layer 332 and the third rectifying element layer 331.

The fourth memory cell array 401 includes the fourth electrodes 340, the fifth electrodes 440, and the fourth storage unit 430 provided between the fourth electrode 340 and the fifth electrode 440. The fourth storage unit 430 includes the fourth storage layer 432 and the fourth rectifying element layer 431.

The third electrode 240 is shared between the second memory cell array 201 and the third memory cell array 301, and the fourth electrode 340 is shared between the third memory cell array 301 and the fourth memory cell array 401.

Thus, a nonvolatile storage device that includes three or more memory cell arrays and shares the electrode between mutually stacked memory cell arrays also can be manufactured by applying the method for manufacturing a nonvolatile storage device according to the fourth embodiment.

In the case of a nonvolatile storage device in which memory cell arrays are stacked and the electrode is not shared between mutually stacked memory cell arrays, it can be manufactured by applying the method for manufacturing a nonvolatile storage device according to the third embodiment.

Fifth Embodiment

Figure 40A:
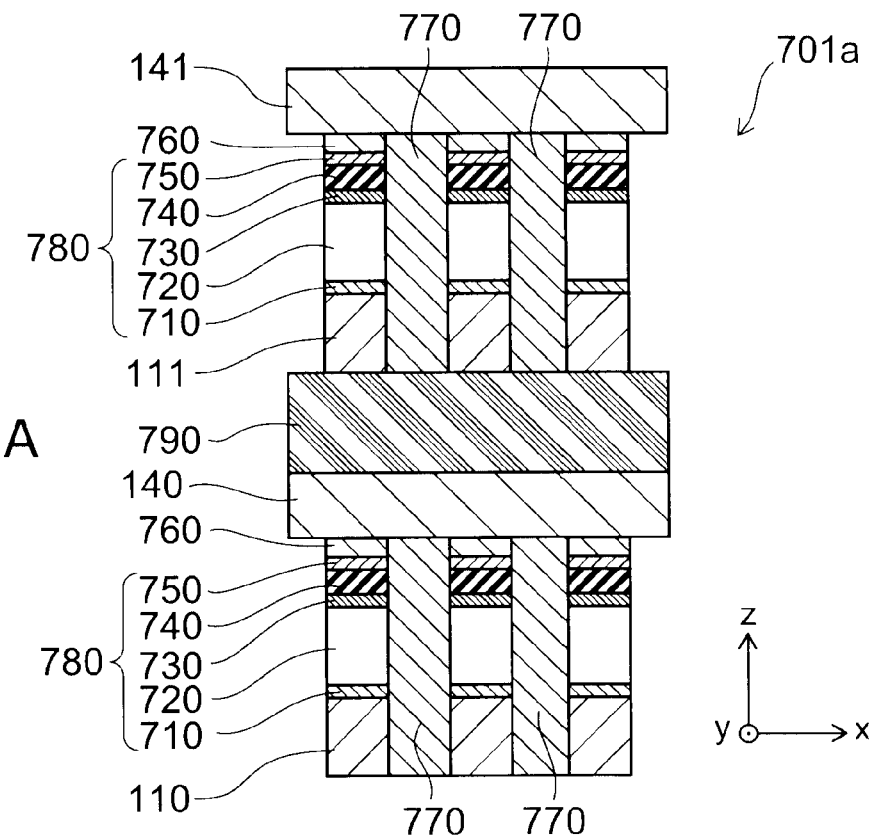
FIGS. 40A and 40B are schematic cross-sectional views of relevant parts of a storage unit of a nonvolatile storage device according to a fifth embodiment of the invention.
Figure 40B:
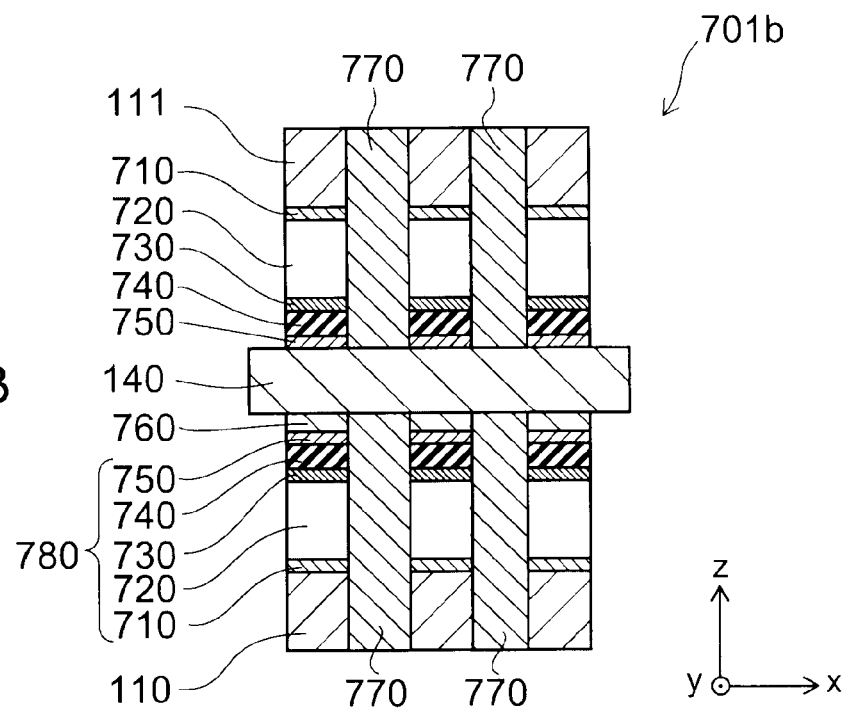

FIGS. 40A and 40B are schematic cross-sectional views of relevant parts of a storage unit of a nonvolatile storage device. FIG. 40A and FIG. 40B illustrate a fifth memory cell array 701a and a sixth memory cell array 701b of ReRAM (resistance random access memory) memory of crosspoint structure, as an example of the nonvolatile storage device. FIG. 40A and FIG. 40B illustrate a configuration in which a plurality of memory cells are stacked. In the fifth embodiment, a practical example is described while referring to the storage unit described above as a "storage cell."

As illustrated in FIG. 40A, in each storage cell (a unit memory cell) 780 of the fifth memory cell array 701a, the electrode 110 (a lower wiring) that is a first bit line is used as an under layer, and a first metal film 710, a diode layer 720 that is a rectifying element, a second metal film 730 for ohmic contact, a resistance change film 740 that is a first storage element, and a third metal film 750 are disposed in the order from the lower layer to the upper layer. A stopper wiring film 760 for CMP (chemical mechanical polishing) is disposed on the metal film 750, and the stopper wiring films 760 in the storage cells 780 are connected to each other by the electrode 140 (an upper wiring) that is a first word line.

Here, the electrode 140 aligns in the first direction (the X-axis direction in the drawing), and the electrode 110 aligns in the second direction (the Y-axis direction in the drawing) nonparallel to the first direction. That is, the resistance change film 740 is disposed between the electrode 110 and the electrode 140 that cross each other. Each of the storage cells 780 has a configuration in which the diode layer 720 and the resistance change film 740 are connected in series and a current flows in one direction of the storage cell 780.

Further, in the fifth memory cell array 701a, an interlayer insulating film 790 is disposed on the electrode 140, and an electrode 111 that is a second bit line is disposed on the interlayer insulating film 790. The storage cell 780 described above is disposed on the electrode 111.

That is, the fourth metal film 710, the diode layer 720 that is an rectifying element, the fifth metal film 730 for ohmic contact, the resistance change film 740 that is a second storage element, and the sixth metal film 750 are disposed on the electrode 111. The stopper wiring film 760 is disposed on the metal film 750, and the stopper wiring films 760 in the storage cells 780 are connected to each other by an electrode 141 that is a second word line.

Thus, the fifth memory cell array 701a has a configuration in which the plurality of storage cells 780 are stacked via the electrode wirings. An interlayer insulating film 770 that is an element isolation layer is disposed periodically between adjacent cells in order to ensure insulation between the cells.

When a current is supplied to each resistance change film 740 via the word line and the bit line, the resistance change film 740 can transit between a first state and a second state reversibly.

Such a memory cell array may be the sixth memory cell array 701b illustrated in FIG. 40B as well as the fifth memory cell array 701a illustrated in FIG. 40A.

In the configuration of the sixth memory cell array 701b, the electrode 140 that is a word line is not disposed independently for each stair, but the electrode 140 is shared to stack the plurality of storage cells 780.

That is, the storage cell 780 below the electrode 140 and the electrode 110 are disposed in the same manner as FIG. 40A, but on the electrode 140, the metal film 750, the resistance change film 740 that is a storage element, the metal film 730, the diode layer 720, and the metal film 710 are disposed in the order from the lower layer. The electrode 111 that is a bit line is disposed on the metal film 710.

Such a configuration arouses expectations of not only an increased storage density but also suppression of a delayed applied voltage to the electrode 140, speeding-up of writing operation and erasing operation, reduction of device area, and the like by sharing the electrode 140.

Tungsten (W), which is excellent in high-temperature heat resistance and has a low resistivity, for example, is used for the material of the electrodes 140, 141 and 110, and the stopper wiring film 760. Furthermore, tungsten nitride (WN) and tungsten carbide (WC) may be used.

Titanium (Ti), titanium nitride (TiN), and the like, for example, are used for the material of the metal films 710, 730, and 750.

Although the case where a resistance change element is used as an example of the storage element is illustrated in this embodiment, a phase change film may be used in place of the resistance change film 740 to form a phase change storage element.

Next, the configuration of the storage cell 780 described above will now be described in more detail.

Figure 41:
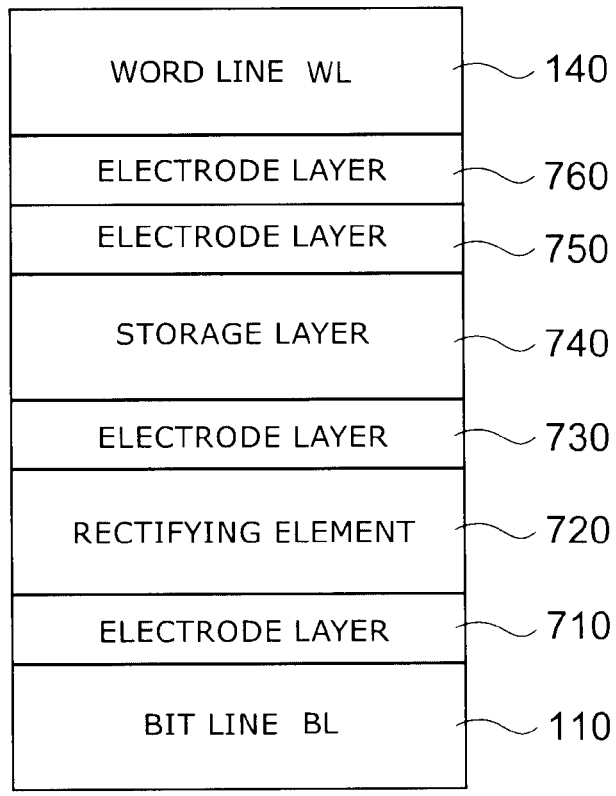
FIG. 41 is a schematic cross-sectional view of a relevant part of the storage unit of the nonvolatile storage device according to the fifth embodiment of the invention.

FIG. 41 is a schematic cross-sectional view of a relevant part of the storage unit of the nonvolatile storage device. FIG. 41 illustrates an enlarged view of the storage cell 780 including the electrodes 110 and 140.

As illustrated in FIG. 41, the storage cell 780 includes the metal films 730 and 750 that are electrodes on and below the resistance change film 740. Disposing the metal films 730 and 750 can provide an electrical connection with the resistance change film 740 via the metal films 730 and 750.

Furthermore, in order to ensure a stable ohmic contact between the metal film 730 and the diode layer 720, a layer of different components from the metal film 730 may be formed at the interface between the metal film 730 and the diode layer 720. A metal silicide film, for example, is given as the layer. Such a metal silicide film is formed by performing anneal processing (e.g. 550° C.) on the metal film 730 and the diode layer 720.

Furthermore, the metal films 730 and 750 may be caused to function as barrier layers for preventing diffusion of impurities into the resistance change film 740.

The voltage applied between the major surfaces of the resistance change film 740 changes by the combination of the electric potentials applied to the electrode 140 and the electrode 110, and thus the resistance change film 740 can memorize and erase information by characteristics (e.g. resistance value) of the resistance change film 740. Accordingly, any material of which characteristics change by an applied voltage may be used for the resistance change film 740.

For example, a variable resistance layer of which the resistance value can transit reversibly by an applied voltage, a phase change layer that can transit reversibly between a crystal state and an amorphous state, and the like are used for the material of the resistance change film 740.

A specific material of the resistance change film 740 may be a material including at least one selected from $ZnMn_xO_y$, $ZnFe_xO_y$, $NbO_x$, Cr-doped $SrTiO_{3-x}$, $Pr_xCa_yMnO_z$, $ZrO_x$, $NiO_x$, Ti-doped $NiO_x$ film, $ZnO_x$, $TiO_x$, $TiO_xN_y$, $CuO_x$, $GdO_x$, $CuTe_x$, $HfO_x$, $HfAlO_x$, C (carbon), CN (carbon nitride), chalcogenide-based GST ($Ge_xSb_yTe_z$) of which the resistance state changes by the Joule heat generated by a voltage applied thereacross, N-doped GST and O-doped GST made by performing doping on GST, $Ge_xSb_y$, $In_xGe_yTe_z$, and the like.

Furthermore, in regard to the configuration of the resistance change film 740, the film itself may be structured into a MIM (metal-insulator-metal) structure.

For example, a configuration may be possible that disposes the oxide film or the chalcogenide-based material described above in the middle, and thereon and therebelow disposes a material including at least one selected from tungsten nitride (WN), titanium nitride (TiN), titanium aluminum nitride (AlTiN), tantalum nitride (TaN), titanium nitride silicide (TiNSi), tantalum carbide (TaC), titanium silicide (TiSi), tungsten silicide (WSi), cobalt silicide (CoSi), nickel silicide (NiSi), nickel platinum silicide (NiPtSi), platinum (Pt), ruthenium (Ru), platinum rhodium (PtRh), indium (In), and the like.

The storage cell 780 includes the diode layer 720 as a rectifying element. Thereby, the direction of a current flowing in the storage cell 780 can be regulated even if an arbitrary storage cell 780 is selected by the combination of the electrode 140 and the electrode 110.

The material of the diode layer 720 is mainly made of polysilicon (poly-Si), for example. A PIN diode, PN junction diode, Schottky diode, Zener diode, and the like, for example, are used for the diode layer 720.

Furthermore, semiconductor materials such as germanium (Ge) as well as silicon (Si) and semiconductor materials of metal oxide such as NiO, TiO, CuO, and InZnO may be used in combination as the diode layer 720.

A heat sink layer (not illustrated) may be interposed near the resistance change film 740 in order to perform heating of the resistance change film 740 efficiently during reset (erasing) operation.

Next, a manufacturing process for forming a memory cell array will now be described.

FIG. 42 to FIG. 50D are views of relevant parts of the manufacturing process for forming a memory cell.

Figure 42:
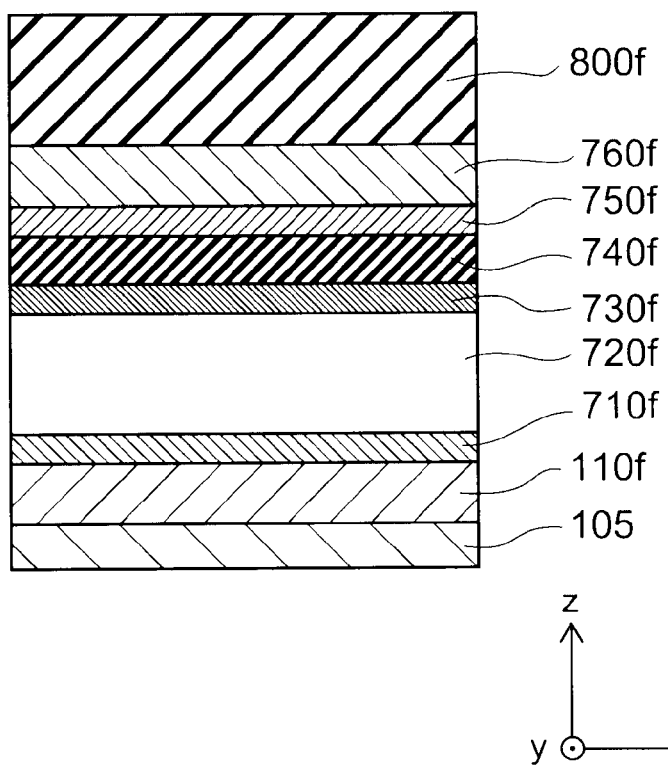
FIGS. 42 to 50D are views of relevant parts of the manufacturing process for forming a memory cell according to the fifth embodiment of the invention.

First, as illustrated in FIG. 42, a stacked body of a coating film that is to be processed into the form of the storage cell 780 is formed. FIG. 42 illustrates a cross section of the stacked body mentioned above cut substantially perpendicularly to the Y-axis direction (the second direction) in the drawing.

That is, the planar electrode film 110f, a metal film 710f, a diode layer 720f, a metal film 730f, a resistance change film 740f, a metal film 750f, a stopper wiring film 760f, and a mask layer 800f as a mask member are film-formed on the substrate 105 by the sputtering method or the CVD (chemical vapor deposition) method.

Here, the substrate 105 is an interlayer insulating film formed on a semiconductor substrate, for example, and a CMOS (complementary metal oxide semiconductor) circuit and the like are disposed below the interlayer insulating film.

Silicon oxide ($SiO_2$), for example, is used for the material of the mask layer 800f.

Figure 43A:
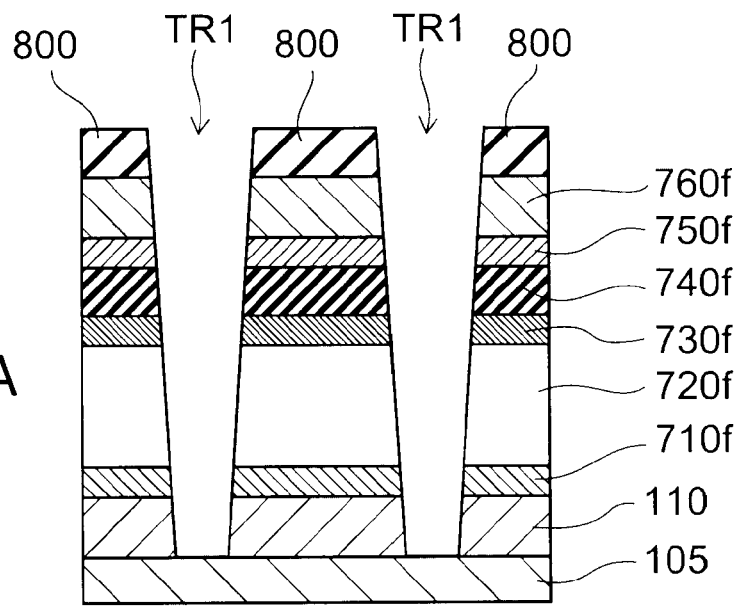
Figure 43B:
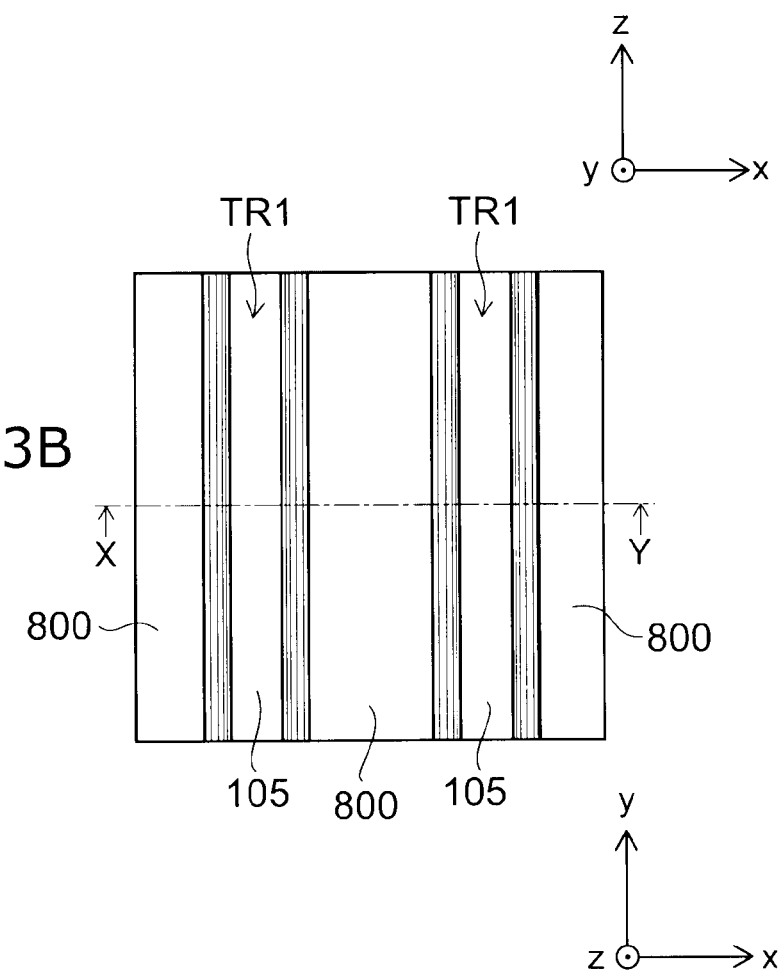

Next, as illustrated in FIGS. 43A and 43B, processing by RIE (reactive ion etching) is performed on the stacked body mentioned above to form trenches TR1 running in the Y-axis direction in the stacked body mentioned above.

Here, FIG. 43A illustrates a cross section of the stacked body cut substantially perpendicularly to the Y-axis direction in the drawing, and FIG. 43B illustrates a top view of the stacked body as seen from the mask layer 800 to the substrate 105 in FIG. 43A. FIG. 43A corresponds to the X-Y cross section of FIG. 43B.

That is, the planar mask layer 800f is patterned as a mask, and then the planar stopper wiring film 760f, the metal film 750f, the resistance change film 740f, the metal film 730f, the diode layer 720f, the metal film 710f, and the electrode film 110f are etched by using the patterned mask layer 800. Thereby, the stacked body mentioned above is separated in the X-axis direction (the first direction) across the trenches TR1.

The etching processing in this stage is performed while changing etching conditions for each coating film of the stacked body. For example, it is performed while changing gas for etching, discharge conditions, and the like for each coating film.

By forming the trenches TR1, part of the surface of the substrate 105 is exposed and the stripe-shaped electrodes 110 aligning in the Y-axis direction are formed on the substrate 105.

The trench TR1 is processed with a high aspect ratio (for example, (etching depth)/(etching width) 10). Accordingly, as illustrated in FIG. 43A, a reverse taper is formed in the cross section cutting substantially perpendicularly to the Y-axis direction.

Figure 44A:
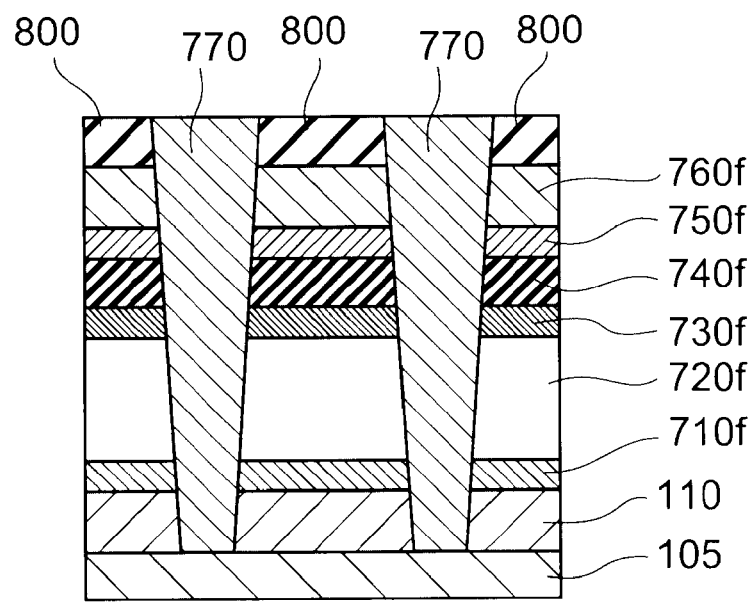
Figure 44B:
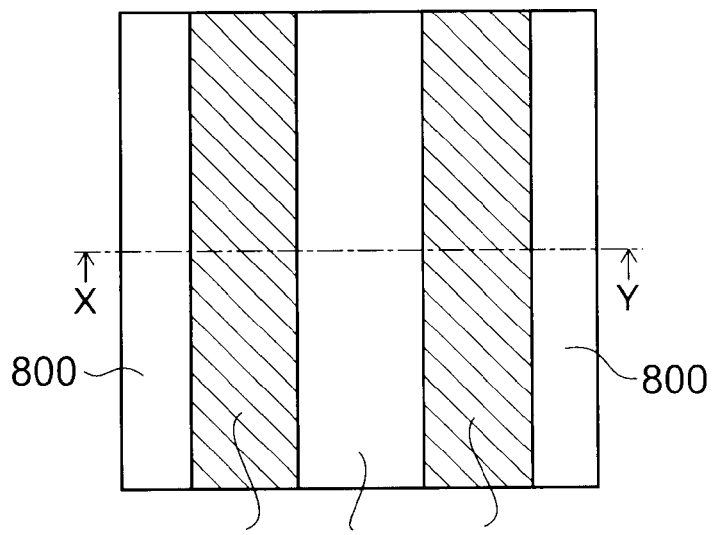

Next, as illustrated in FIGS. 44A and 44B, the interlayer insulating film 770 that is an element isolation layer is buried in the trench TR1. Here, FIG. 44A illustrates a cross section of the stacked body cut substantially perpendicularly to the Y-axis direction in the drawing, and FIG. 44B illustrates a top view of the stacked body as seen from the stopper wiring film 760f to the substrate 105 in FIG. 44A. FIG. 44A corresponds to the X-Y cross section of FIG. 44B.

In this stage, the interlayer insulating film 770 is formed by using the application method in order to bury an insulating layer in the trench TR1 with a high aspect ratio.

For example, the application is performed by using a solution containing the raw material of the interlayer insulating film 770. Specifically, the interlayer insulating film 770 mainly made of silicon oxide ($SiO_2$) is buried in the trench TR1 by an application method such as spin coating using a perhydropolysilazane (PHPS) solution that is a polysilazane-based material.

Subsequently, as illustrated in FIGS. 45A to 45D, the upper surfaces of the mask layer 800 and the interlayer insulating film 770 are polished by CMP until the stopper wiring film 760f is exposed, and the surfaces of the stopper wiring film 760f and the interlayer insulating film 770 are planarized.

Figure 45A:
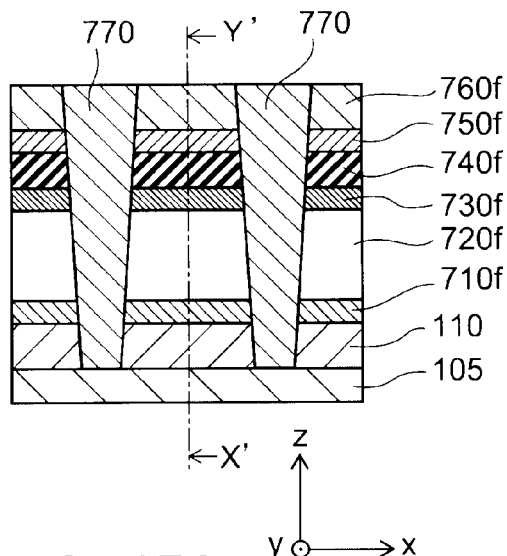
Figure 45C:
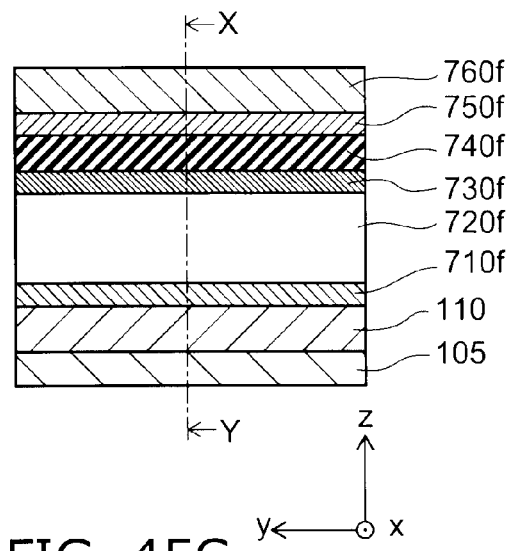
Figure 45B:
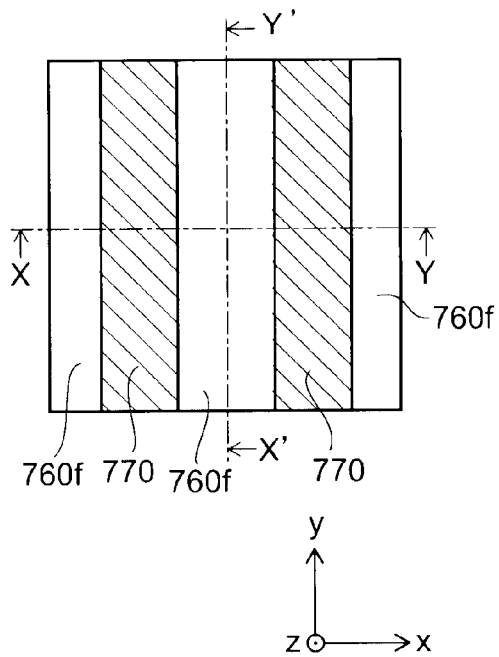

Here, FIG. 45A illustrates a cross section of the stacked body cut substantially perpendicularly to the Y-axis direction in the drawing, and FIG. 45B illustrates a top view of the stacked body as seen from the stopper wiring film 760f to the substrate 105 in FIG. 45A. FIG. 45A illustrates the X-Y cross section of FIG. 45B.

Figure 45D:
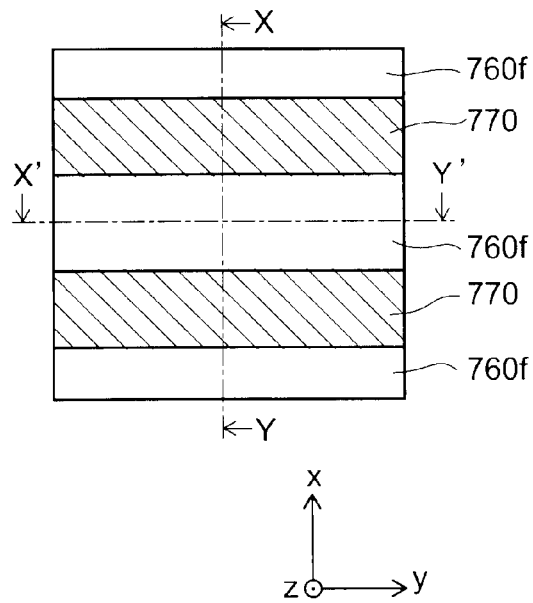

FIG. 45C illustrates a cross section of the stacked body cut substantially perpendicularly to the X-axis direction in the drawing, FIG. 45D illustrates a top view of the stacked body as seen from the stopper wiring film 760f to the substrate 105 in FIG. 45C. FIG. 45C illustrates the X'-Y' cross section of FIG. 45D.

FIG. 45A illustrates the X-Y cross section of FIG. 45C, and FIG. 45C illustrates the X'-Y' cross section of FIG. 45A.

In regard to the interlayer insulating film 770 buried in the trench TR1, low-temperature anneal of 400° C. or lower is performed to improve the film quality of the interlayer insulating film 770. Here, the interlayer insulating film 770 is prepared into a material having a higher etching rate (for example, twofold to threefold rate) than a silicon oxide ($SiO_2$) film formed by the sputtering method or the plasma CVD method. For example, the interlayer insulating film 770 may be made a porous body.

The interlayer insulating film 770 like this has a reverse-tapered shape in the cross section cutting substantially perpendicularly to the Y-axis direction because the trench TR1 has a reverse-tapered shape.

Figure 46A:
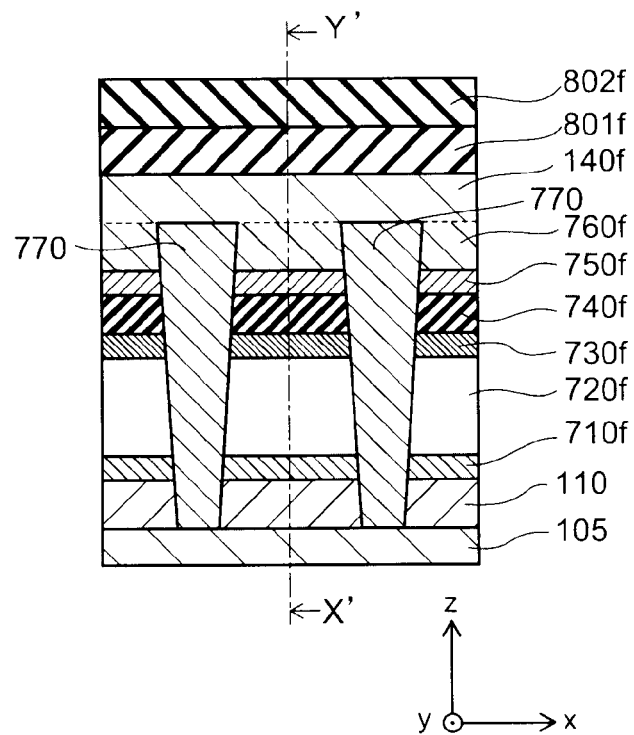
Figure 46B:
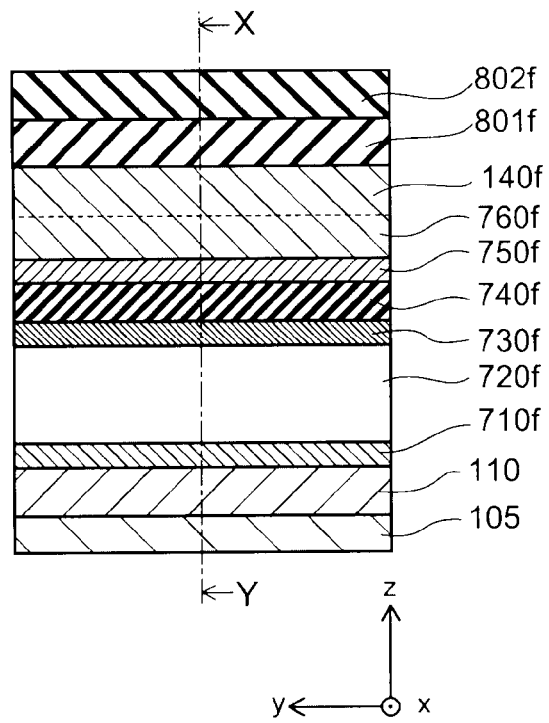

Next, as illustrated in FIGS. 46A and 46B, the planar electrode film 140f is formed on the stopper wiring film 760f and the interlayer insulating film 770 by the sputtering method or the CVD method. Furthermore, a planar mask layer 801f and a mask layer 802f are formed on the electrode film 140f by the sputtering method or the CVD method.

Here, FIG. 46A illustrates a cross section of the stacked body cut substantially perpendicularly to the Y-axis direction, and FIG. 46B illustrates a cross section of the stacked body cut substantially perpendicularly to the X-axis direction. FIG. 46A illustrates the X-Y cross section of FIG. 46B, and FIG. 46B illustrates the X'-Y' cross section of FIG. 46A.

In this stage, the thickness from the surface of the substrate 105 to the surface of the electrode film 140f becomes 300 nm or more.

Silicon oxide ($SiO_2$), which is the same component as the interlayer insulating film 770, for example, is used for the material of the mask layer 801f, and silicon nitride ($Si_3N_4$), which is a different component from the interlayer insulating film 770, for example, is used for the material of the mask layer 802f.

Next, as illustrated in FIGS. 47A to 47D, the mask layer 801f and the mask layer 802f are processed by etching to be patterned.

Figure 47A:
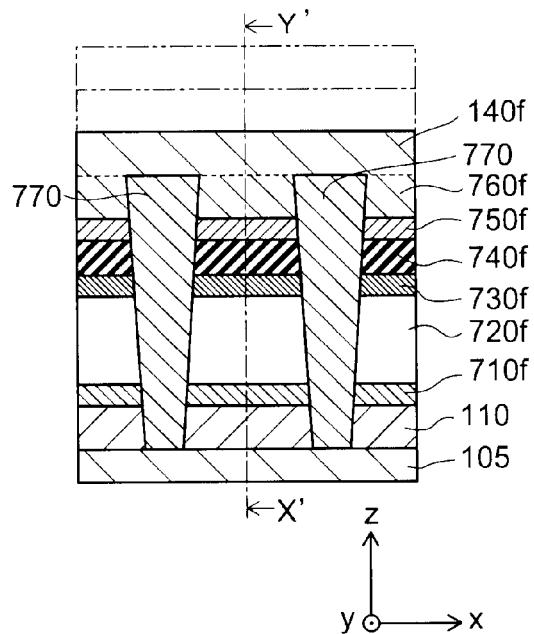
Figure 47C:
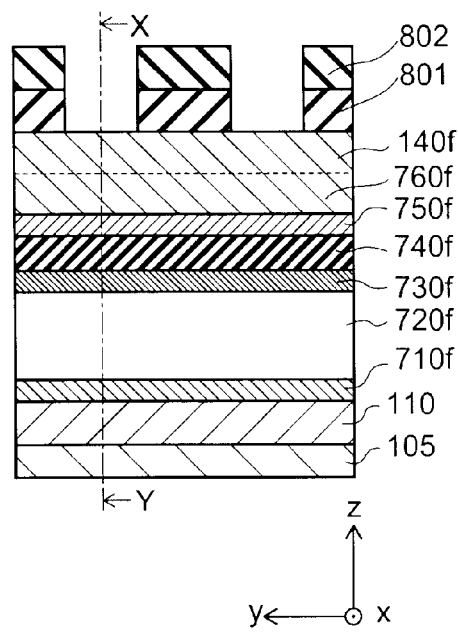
Figure 47B:
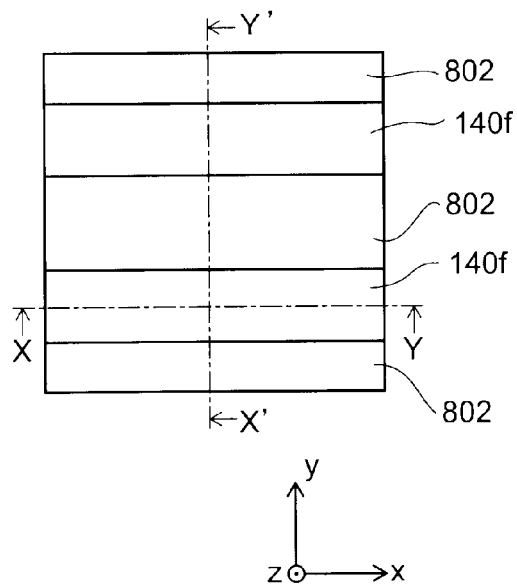
Figure 47D:
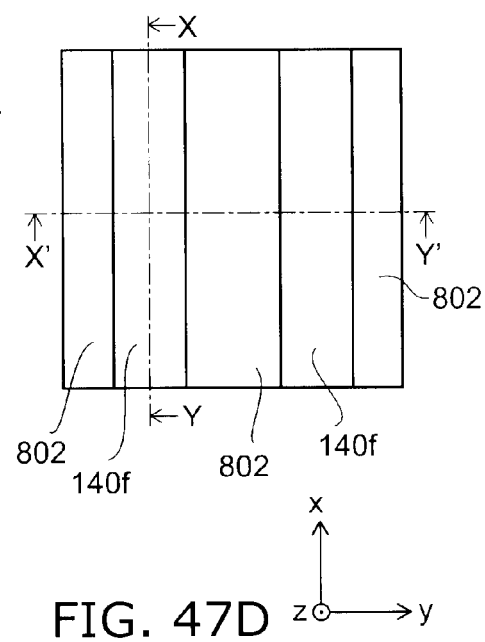

Here, FIG. 47A illustrates a cross section of the stacked body cut substantially perpendicularly to the Y-axis direction, and FIG. 47B illustrates a top view of the stacked body as seen from the electrode film 140f to the substrate 105 in FIG. 47A. FIG. 47A illustrates the X-Y cross section of FIG. 47B. FIG. 47C illustrates a cross section of the stacked body cut substantially perpendicularly to the X-axis direction, and FIG. 47D illustrates a top view of the stacked body as seen from the mask layer 802 to the substrate 105 in FIG. 47C. FIG. 47C illustrates the X'-Y' cross section of FIG. 47D.

FIG. 47A illustrates the X-Y cross section of FIG. 47C, and FIG. 47C illustrates the X'-Y' cross section of FIG. 47A.

The mask layer 801 and the mask layer 802 with stripe shapes are formed on the electrode film 140f so as to align in the X-axis direction, for example. In this stage, part of the surface of the electrode film 140f is exposed.

Next, the electrode film 140f is processed into stripe shapes to form the electrodes 140 as illustrated in FIGS. 48A to 48D.

Figure 48A:
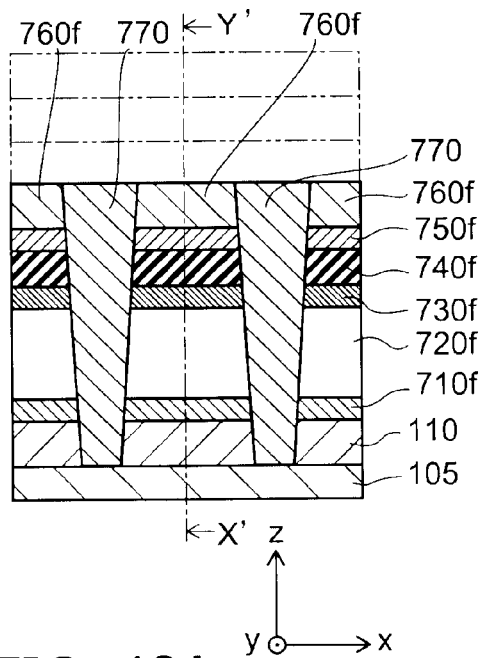
Figure 48C:
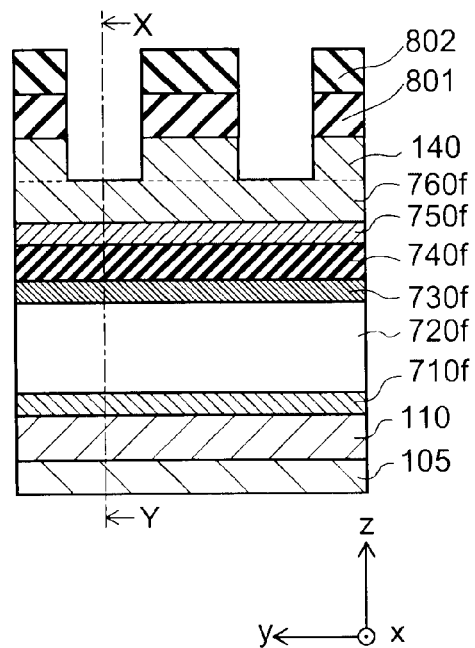
Figure 48B:
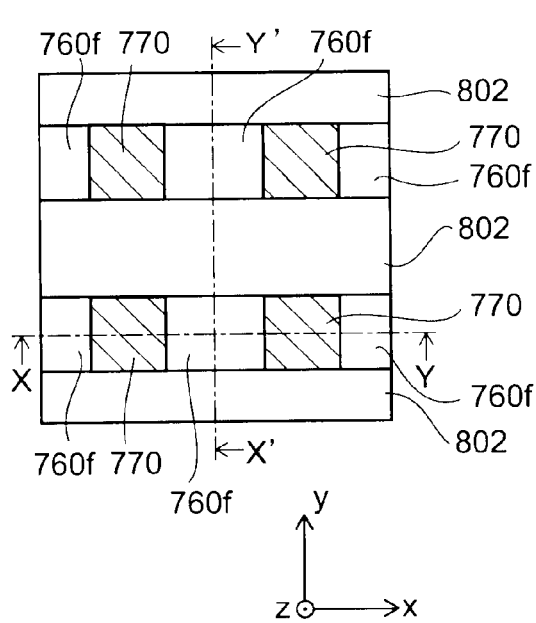

Here, FIG. 48A illustrates a cross section of the stacked body cut substantially perpendicularly to the Y-axis direction, and FIG. 48B illustrates a top view of the stacked body as seen from the stopper wiring film 760f to the substrate 105 in FIG. 48A. FIG. 48A illustrates the X-Y cross section of FIG. 48B.

Figure 48D:
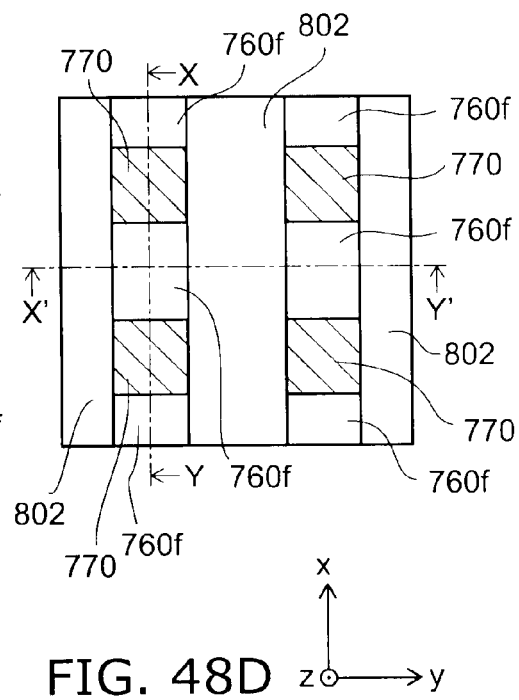

FIG. 48C illustrates a cross section of the stacked body cut substantially perpendicularly to the X-axis direction, and FIG. 48D illustrates a top view of the stacked body as seen from the mask layer 802 to the substrate 105 in FIG. 48C. FIG. 48C illustrates the X'-Y' cross section of FIG. 48D.

FIG. 48A illustrates the X-Y cross section of FIG. 48C, and FIG. 48C illustrates the X'-Y' cross section of FIG. 48A.

The electrode film 140f is processed by etching using the patterned mask layer 802 as a mask, for example. The electrode 140 has a stripe shape aligning in the X-axis direction. That is, in this stage, a configuration in which the electrode 110 and the electrode 140 cross (intersect) each other is formed. Further, in this stage, the upper surface of the interlayer insulating film 770 buried in the trench TR1 is exposed.

Next, as illustrated in FIGS. 49A to 49D, the interlayer insulating film 770 of which the upper surface has been exposed in the previous process is selectively etched (etched back).

Figure 49A:
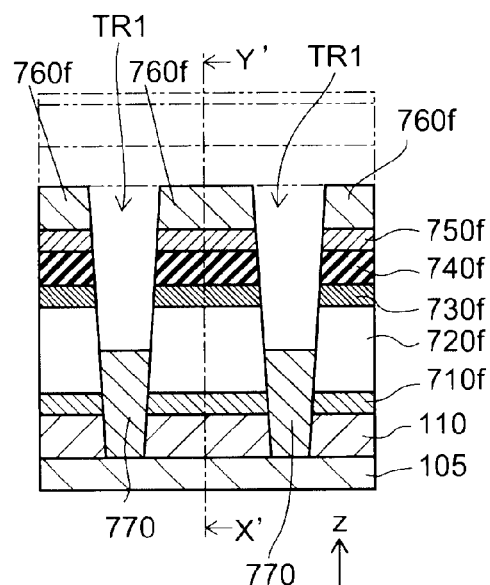
Figure 49C:
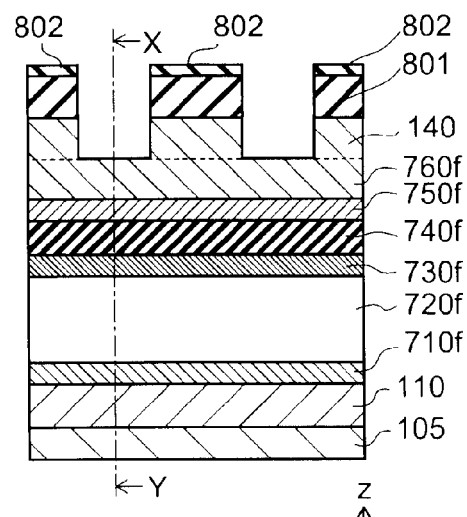
Figure 49B:
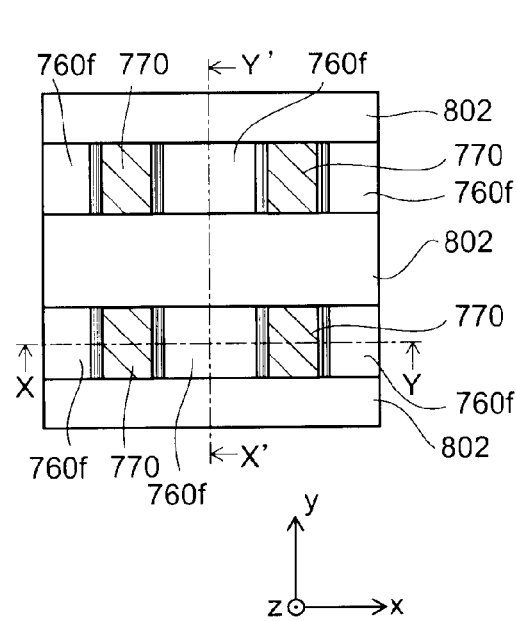

Here, FIG. 49A illustrates a cross section of the stacked body cut substantially perpendicularly to the Y-axis direction, and FIG. 49B illustrates a top view of the stacked body as seen from the stopper wiring film 760f to the substrate 105 in FIG. 49A. FIG. 49A illustrates the X-Y cross section of FIG. 49B.

Figure 49D:
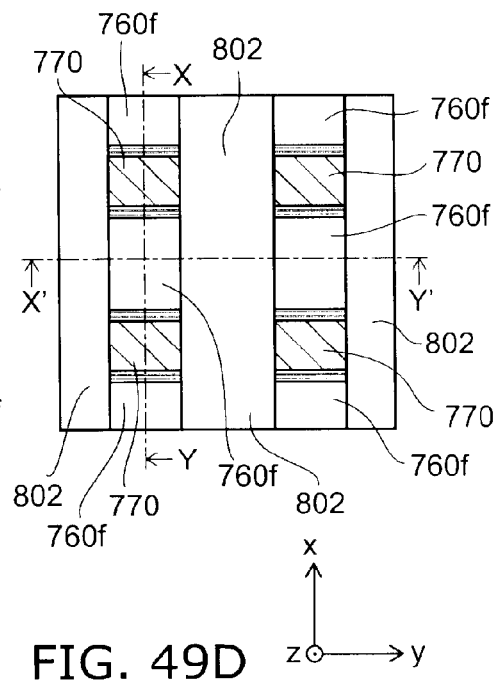

FIG. 49C illustrates a cross section of the stacked body cut substantially perpendicularly to the X-axis direction, and FIG. 49D illustrates a top view of the stacked body as seen from the mask layer 802 to the substrate 105 in FIG. 49C.

FIG. 49A illustrates the X-Y cross section of FIG. 49C, and FIG. 49C illustrates the X'-Y' cross section of FIG. 49A.

The interlayer insulating film 770 is selectively etched by chemical etching (wet etching) using a hydrofluoric acid solution and using the patterned mask layer 802 as a mask, for example. Thereby, the upper surface of the interlayer insulating film 770 goes down to a prescribed position.

Here, the material of the mask layer 802 is different from that of the interlayer insulating film 770. Furthermore, the interlayer insulating film 770 itself is formed by the application method. Therefore, the interlayer insulating film 770 is easily etched.

The reduction of the film thickness of the mask layer 802 proceeds by the etching processing in this stage, and the film thickness thereof becomes thin.

The etching in this process is not limited to chemical etching but may be dry etching.

After the interlayer insulating film 770 is etched back, the mask layer 802 may be removed.

Although FIGS. 49A to 49D illustrate a form in which the interlayer insulating film 770 is etched back to part of the depth of the trench TR1, the interlayer insulating film 770 may be etched until the substrate 105 is exposed.

However, if narrowing the pitch of the memory cell array proceeds, it is necessary to thin the storage cell 780 itself more, and there is the case where the strength of the separated stacked body cannot be maintained in the manufacturing process. In this case, the interlayer insulating film 770 may be left at a prescribed height. According to such a method, processes can be carried on while the stacked body separated by the interlayer insulating films 770 is supported (sandwiched) by the interlayer insulating films 770. Specifically, as illustrated in FIGS. 49A to 49D, processes may be carried on while the interlayer insulating film 770 is left so that the height of the interlayer insulating film 770 may be located part way in the thickness direction of the diode layer 720f.

However, since a residue generated from the resistance change film 740f is difficult to remove, the side surface of the resistance change film 740f is preferably exposed by etchback.

Next, as illustrated in FIGS. 50A to 50D, processing by RIE is performed on the stacked body to form trenches TR2 in the stacked body.

Figure 50A:
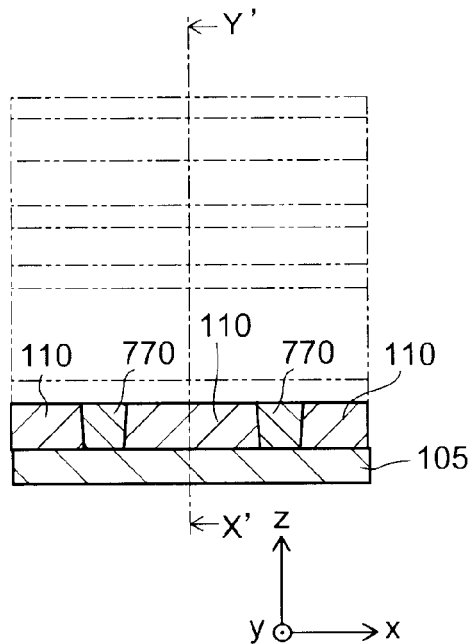
Figure 50C:
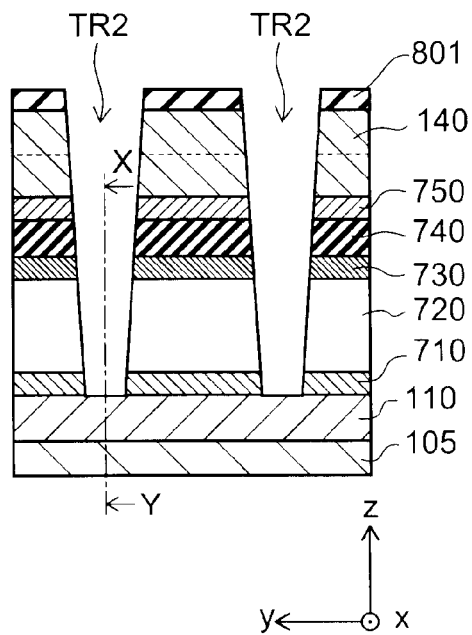
Figure 50B:
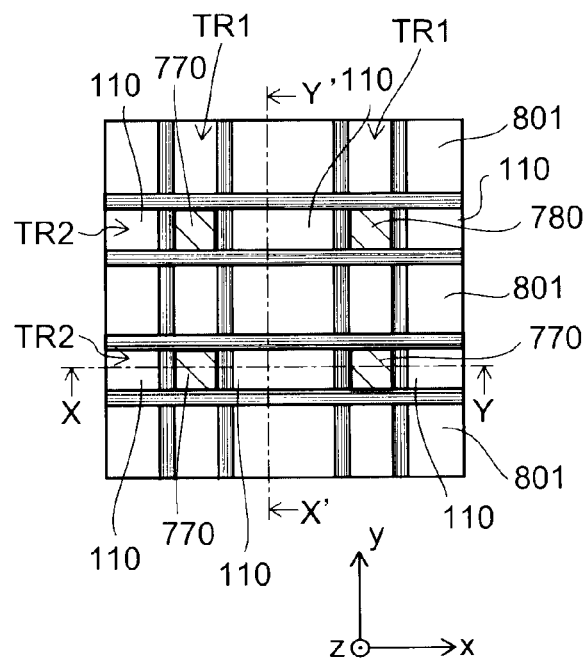

Here, FIG. 50A illustrates a cross section of the stacked body cut substantially perpendicularly to the Y-axis direction, and FIG. 50B illustrates a top view of the stacked body as seen from the mask layer 801 to the substrate 105 in FIG. 50A. FIG. 50A illustrates the X-Y cross section of FIG. 50B.

Figure 50D:
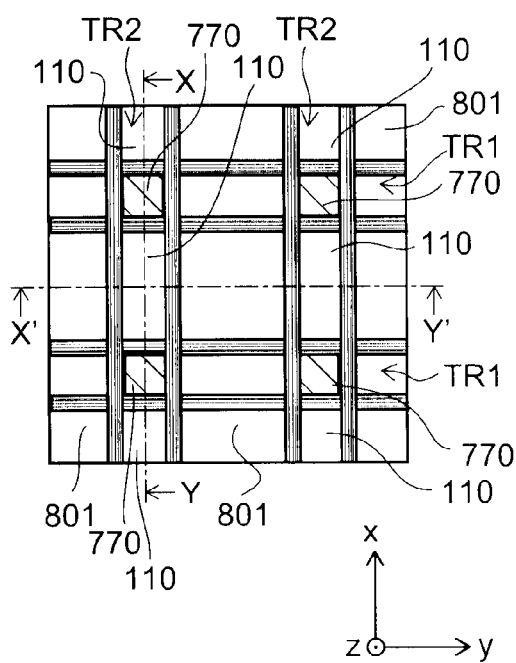

FIG. 50C illustrates a cross section of the stacked body cut substantially perpendicularly to the X-axis direction, and FIG. 50D illustrates a top view of the stacked body as seen from the mask layer 801 to the substrate 105 in FIG. 50C. FIG. 50C illustrates the X'-Y' cross section of FIG. 50D.

FIG. 50A illustrates the X-Y cross section of FIG. 50C, and FIG. 50C illustrates the X'-Y' cross section of FIG. 50A.

The stopper wiring film 760f, the metal film 750f, the resistance change film 740f, the metal film 730f, the diode layer 720f, and the metal film 710f are etched by using the patterned mask layer 801 as a mask to separate the stacked body of them across the trenches TR2, for example. Here, the etching conditions for forming the trench TR2 may be the same as the case of forming the trench TR1.

The trench TR2 runs in the X-axis direction and is formed substantially perpendicularly to the direction in which the trench TR1 runs.

The trench TR2 is processed with a high aspect ratio (for example, (etching depth)/(etching width)≧10). Accordingly, the trench TR2 has a reverse-tapered shape in the cross section cut substantially perpendicularly to the X-axis direction.

In this embodiment, the interlayer insulating film 770 that has been buried in the trench TR1 in advance is etched back before the trench TR2 is formed. Therefore, when the trench TR2 is formed, the effect of the shade by the side wall of the interlayer insulating film 770 buried in the trench TR1 is small. Consequently, a residue is hardly generated in the trench TR2 (the reason is described later).

After that, an interlayer insulating film (not illustrated) is buried in the trench TR1 that has been formed again by etchback and trench TR2 by the application method or the CVD method described above. The mask layer 801 is removed by CMP.

Since the mask layer 801 is made of the same components as the interlayer insulating film buried in the trench TR1 and the trench TR2, the polishing rates are approximately equal, and this facilitates the planarization by CMP.

Such a manufacturing method forms a memory cell array like those illustrated in FIGS. 40A and 40B.

Here, for comparison, a manufacturing process that does not take the etchback process described above will now be described.

Figure 51A:
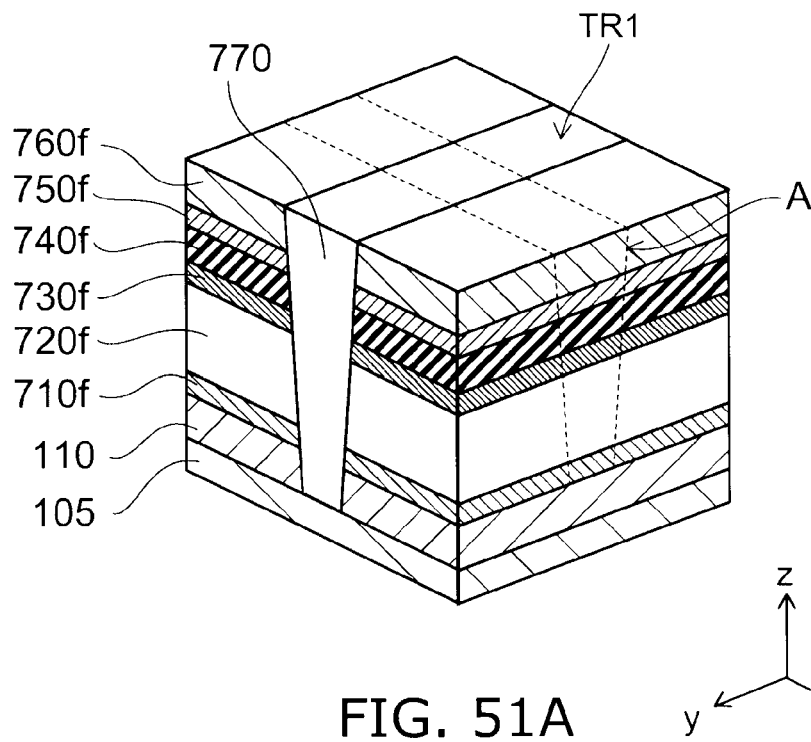
FIGS. 51A and 51B are schematic stereographs of a relevant part for describing a comparative example.
Figure 51B:
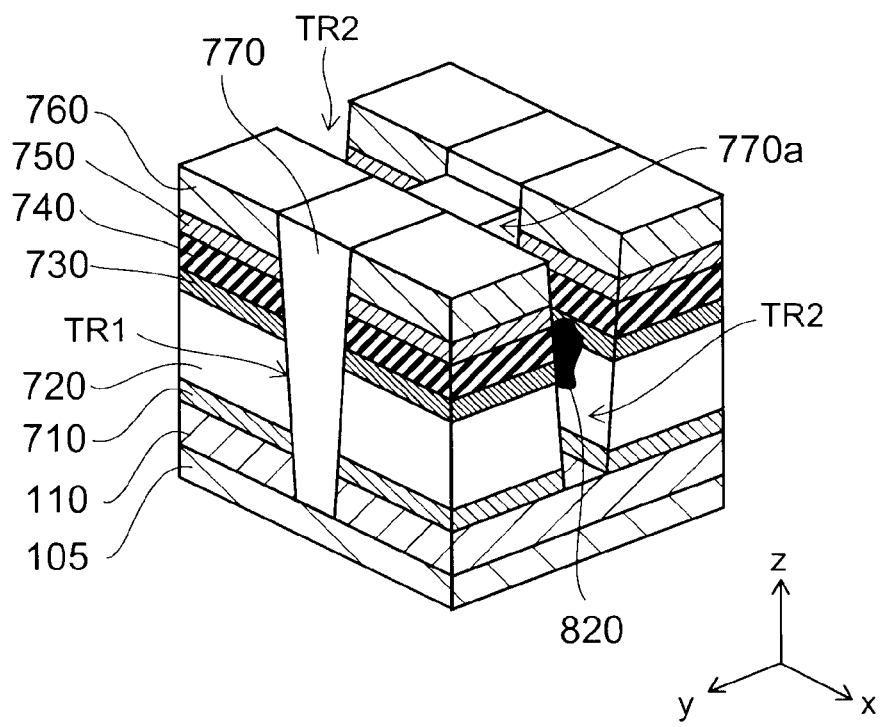

FIGS. 51A and 51B are schematic stereographs of a relevant part for describing a comparative example.

Here, FIG. 51A illustrates the state in which the interlayer insulating film 770 aligns in the Y-axis direction. That is, this state is the same as FIG. 48A described above. FIG. 51B illustrates the state after etching processing.

FIG. 51A and FIG. 51B do not illustrate the mask layer 801.

First, as illustrated in FIG. 51A, the reverse-tapered interlayer insulating film 770 is buried in the trench TR1 formed in the electrode 110, the metal film 710f, the diode layer 720f, the metal film 730f, the resistance change film 740f, the metal film 750f, and the stopper wiring film 760f. The interlayer insulating film 770 in this stage aligns in the Y-axis direction.

The portion enclosed by the broken line "A" in FIG. 51A is the portion to be etched for forming the trench TR2. When the portion enclosed by the broken line "A" is actually removed by etching, the configuration of FIG. 51B is obtained.

That is, if the trench TR2 running in the X-axis direction orthogonal to the Y-axis direction is formed, since the interlayer insulating film 770 has a lower etching rate than the stacked body, the interlayer insulating film 770 is not removed sufficiently, and the interlayer insulating film 770 is left in the trench TR2 as illustrated in FIG. 51B.

If etching processing is continued in this state, since the interlayer insulating film 770 has a reverse-tapered shape, a side wall 770a of the interlayer insulating film 770 forms a shade to impede the formation of the trench TR2.

That is, the etching processing illustrated in FIGS. 51A and 51B cannot sufficiently remove the portion enclosed by "A"

due to the impediment by the side wall 770*a* of the interlayer insulating film 770. Consequently, a residue 820 illustrated in the drawing is easily generated in the trench TR2.

Here, the residue 820 is a contaminant including at least one component element of one of the metal film 710*f*, the diode layer 720*f*, the metal film 730*f*, the resistance change film 740*f*, the metal film 750*f*, and the stopper wiring film 760*f*, for example. That is, the residue 820 is made of a semiconductor material or a metal. If the memory cell array is formed in such a state in which the residue 820 remains in the trench TR2, a short (electrical short circuit) between the storage cells 780 or a characteristic variation of the nonvolatile storage device is caused as described above.

Hence, in this embodiment, before the portion enclosed by "A" is etched, the interlayer insulating film 770 is etched back to lower the height thereof to a prescribed position (see FIGS. 49A to 49D).

Therefore, in the process illustrated in FIGS. 50A to 50D, there is no effect of the shade by the side wall 770*a* of the interlayer insulating film 770, and the trench TR2 in which the residue 820 does not remain is formed.

Since the component of the residue 820 is difficult to identify, it is difficult to select appropriate etching conditions for removing the residue 820. Therefore, once the residue 820 is generated, the removal of the residue 820 is difficult in the process. Therefore, it is preferable to eliminate the effect of the shade and to prevent the generation of the residue 820 in advance, like this embodiment.

Thus, the method for manufacturing a nonvolatile storage device according to this embodiment suppresses a short (electrical short circuit) between the storage cells 780, and furthermore causes no variation in characteristics thereof. Thereby, a nonvolatile storage device that achieves a good yield and a stable operation performance is formed.

Hereinabove, embodiments of the invention are described with reference to specific examples. However, the invention is not limited to these specific examples. For example, one skilled in the art may appropriately select specific configurations of components of the nonvolatile storage device such as the substrate, the electrode, the storage unit, the storage layer, the rectifying element, and the interlayer insulating film from known art and similarly practice the invention. Such practice is included in the scope of the invention to the extent that similar effects thereto are obtained.

Further, any two or more components of the specific examples may be compounded and/or combined appropriately within the extent of technical feasibility; and are included in the scope of the invention to the extent that the purport of the invention is included.

Moreover, all methods for manufacturing a nonvolatile storage device that can be obtained by an appropriate design modification by one skilled in the art based on the methods for manufacturing a nonvolatile storage device described above as embodiments of the invention also are within the scope of the invention to the extent that the purport of the invention is included.

Furthermore, various alterations and modifications within the spirit of the invention will be readily apparent to those skilled in the art. All such alterations and modifications should therefore be seen as within the scope of the invention.

The invention claimed is:

1. A method for manufacturing a nonvolatile storage device including: a plurality of first electrodes aligning in a first direction; a plurality of second electrodes aligning in a second direction nonparallel to the first direction and provided above the first electrodes; and a first storage unit provided between the first electrode and the second electrode and including a first storage layer, a resistance of the first storage layer changing by at least one of an applied electric field and an applied current, the method comprising:

stacking a first electrode film forming a first electrode and a first storage unit film forming a first storage unit on a major surface of a substrate;

processing the first electrode film and the first storage unit film into a strip shape aligning in the first direction;

burying a sacrifice layer between the processed first electrode films and between the processed first storage unit films, forming a second electrode film forming a second electrode on the first storage unit film and the sacrifice layer;

forming a mask layer having a lower etching rate than the sacrifice layer on the second electrode film;

processing the second electrode film into a strip shape aligning in the second direction nonparallel to the first direction by using the mask layer as a mask;

removing a portion of the first storage unit film exposed from the sacrifice layer by using the mask layer as a mask to process the first storage unit film into a columnar shape including a side wall along the first direction and a side wall along the second direction;

removing the sacrifice layer to expose the first storage unit film having been covered with the sacrifice layer; and removing the exposed first storage unit film.

2. The method according to claim 1, wherein a length in a direction perpendicular to the first direction of the first storage unit film on the first electrode film side is made longer than a length in a direction perpendicular to the first direction on a side opposite to the first electrode film by processing the first electrode film and the first storage unit film into a strip shape aligning in the first direction.

3. The method according to claim 1, wherein a cap layer having a lower etching rate than the sacrifice layer is buried between the processed first electrode films and between the processed first storage unit films after the burying the sacrifice layer between the processed first electrode films and between the processed first storage unit films.

4. A method for manufacturing a nonvolatile storage device including: a plurality of first electrodes aligning in a first direction; a plurality of second electrodes aligning in a second direction nonparallel to the first direction and provided above the first electrodes; and a first storage unit provided between the first electrode and the second electrode and including a first storage layer, a resistance of the first storage layer changing by at least one of an applied electric field and an applied current, the method comprising:

stacking a first electrode film forming a first electrode and a first storage unit film forming a first storage unit on a major surface of a substrate;

processing the first electrode film and the first storage unit film into a strip shape aligning in the first direction;

burying a layer of a prescribed density between the processed first electrode films and between the processed first storage unit films;

forming a second electrode film forming a second electrode on the first storage unit film and the layer of a prescribed density;

forming a mask layer having a higher density than the layer of a prescribed density on the second electrode film;

processing the second electrode film into a strip shape aligning in the second direction nonparallel to the first direction by using the mask layer as a mask;

removing a portion of the first storage unit film exposed from the layer of a prescribed density by using the mask layer as a mask to process the first storage unit film into a columnar shape including a side wall along the first direction and a side wall along the second direction;

removing the layer of a prescribed density to expose the first storage unit film having been covered with the layer of a prescribed density; and removing the exposed first storage unit film.

5. The method according to claim 4, wherein a length in a direction perpendicular to the first direction of the first storage unit film on the first electrode film side is made longer than a length in a direction perpendicular to the first direction on a side opposite to the first electrode film by processing the first electrode film and the first storage unit film into a strip shape aligning in the first direction.

6. The method according to claim 4, wherein the layer of a prescribed density includes a void.

7. The method according to claim 4, wherein hydrophilization processing is performed to hydrophilize at least side walls of the first electrode film and the first storage unit film after the first electrode film and the first storage unit film are processed into a strip shape aligning in the first direction, and a hydrophobic layer solution of a prescribed density forming the layer of a prescribed density is applied between the processed first electrode films and between the processed first storage unit films and heating is performed to bury the layer of a prescribed density between the first electrode films and between the first storage unit films.

8. The method according to claim 4, wherein a thin film is formed at least on side walls of the first electrode film and the first storage unit film and hydrophilization processing is performed to hydrophilize a surface of the thin film after the first electrode film and the first storage unit film are processed into a strip shape aligning in the first direction, and a hydrophobic layer solution of a prescribed density forming the layer of a prescribed density is buried between the processed first electrode films and between the processed first storage unit films and heating is performed to bury the layer of a prescribed density between the first electrode films and between the first storage unit films.

9. A method for manufacturing a nonvolatile storage device including:

at least one first electrode aligning in a first direction;

at least one second electrode aligning in a second direction nonparallel to the first direction; and a storage cell including a storage element and disposed between the first electrode and the second electrode where the first electrode and the second electrode intersect, the method comprising:

forming a storage cell layer on a first electrode film disposed on a substrate;

separating the storage cell layer in the second direction nonparallel to the first direction and forming a first trench running in the first direction in order to form a first electrode aligning in the first direction on the substrate;

burying a interlayer insulating film in the first trench;

forming a second electrode film on the storage cell layer and the interlayer insulating film;

processing the second electrode film to form the second electrode aligning in the second direction;

etching the interlayer insulating film and lowering an upper surface of the interlayer insulating film to a prescribed position; and forming a second trench running in the second direction in order to separate the storage cell layer in the first direction.

10. The method according to claim 9, wherein two or more mask layers are disposed on the storage cell layer separated by the interlayer insulating film to perform etching of the interlayer insulating film in the lowering the upper surface of the interlayer insulating film to the prescribed position.

11. The method according to claim 9, wherein a solution containing a raw material of the interlayer insulating film is used to be buried in the first trench by an application method in the forming the interlayer insulating film.

12. The method according to claim 9, wherein the interlayer insulating film is etched until a storage element unit of the storage cell layer is exposed in the etching the interlayer insulating film and the lowering the upper surface of the interlayer insulating film to the prescribed position.

* * * * *